(12) United States Patent
Lee et al.

(10) Patent No.: US 11,950,440 B2
(45) Date of Patent: Apr. 2, 2024

(54) ORGANIC LIGHT EMITTING DEVICE

(71) Applicant: LG CHEM, LTD., Seoul (KR)

(72) Inventors: Jaegoo Lee, Daejeon (KR); Dongkeun Song, Daejeon (KR); Jiyoung Noh, Daejeon (KR); Yongbum Cha, Daejeon (KR); Woochul Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 428 days.

(21) Appl. No.: 17/294,277

(22) PCT Filed: Jan. 17, 2020

(86) PCT No.: PCT/KR2020/000878
§ 371 (c)(1),
(2) Date: May 14, 2021

(87) PCT Pub. No.: WO2020/159128
PCT Pub. Date: Aug. 6, 2020

(65) Prior Publication Data
US 2022/0006063 A1 Jan. 6, 2022

(30) Foreign Application Priority Data

Jan. 28, 2019 (KR) .................. 10-2019-0010603
Jan. 8, 2020 (KR) .................. 10-2020-0002772

(51) Int. Cl.
*H10K 50/15* (2023.01)
*H10K 50/11* (2023.01)
*H10K 101/40* (2023.01)

(52) U.S. Cl.
CPC ............. *H10K 50/15* (2023.02); *H10K 50/11* (2023.02); *H10K 2101/40* (2023.02)

(58) Field of Classification Search
CPC .................................................. H10K 50/155
See application file for complete search history.

(56) References Cited

U.S. PATENT DOCUMENTS

| | | | |
|---|---|---|---|
| 2002/0127427 A1 | 9/2002 | Young et al. | |
| 2004/0251816 A1 | 12/2004 | Leo et al. | |
| 2005/0088083 A1* | 4/2005 | Seo ........................ | H10K 50/11 313/504 |
| 2017/0279055 A1 | 9/2017 | Jang et al. | |
| 2017/0352828 A1 | 12/2017 | Kim et al. | |
| 2018/0114920 A1 | 4/2018 | Frey et al. | |

FOREIGN PATENT DOCUMENTS

| | | |
|---|---|---|
| CN | 106716665 | 5/2017 |
| JP | 2009-010364 A | 1/2009 |
| JP | 2014-013933 A | 1/2014 |
| JP | 2015-037168 A | 2/2015 |

(Continued)

*Primary Examiner* — Y-Hsi D Sun
(74) *Attorney, Agent, or Firm* — BRYAN CAVE LEIGHTON PAISNER LLP

(57) ABSTRACT

An organic light emitting device comprising an anode, a hole transport layer, a light emitting layer including a host and a dopant, and a cathode, where a difference between a dipole moment value of a compound included in the hole transport layer and a dipole moment value of the host is 1.0 to 2.0, and the organic light emitting device having low driving voltage, high emission efficiency and long lifetime characteristics.

9 Claims, 1 Drawing Sheet

(56) References Cited

FOREIGN PATENT DOCUMENTS

| | | |
|---|---|---|
| JP | 2016-058549 A | 4/2016 |
| KR | 10-2000-0051826 A | 8/2000 |
| KR | 10-2013-0098228 A | 9/2013 |
| KR | 10-2015-0006722 A | 1/2015 |
| KR | 20150037318 | 4/2015 |
| KR | 20160019764 | 2/2016 |
| KR | 20170114778 | 10/2017 |
| KR | 10-2017-0136842 A | 12/2017 |
| KR | 10-2018-0027676 A | 3/2018 |
| KR | 10-2018-0044821 A | 5/2018 |
| KR | 10-2018-0080686 A | 7/2018 |
| KR | 10-2018-0102937 A | 9/2018 |
| KR | 20180098122 | 9/2018 |
| KR | 10-1907750 B1 | 10/2018 |
| KR | 20190008073 | 1/2019 |
| WO | 2003-012890 A2 | 2/2003 |

* cited by examiner

[FIG. 1]

| |
|---|
| 5 |
| 4 |
| 3 |
| 2 |
| 1 |

[FIG. 2]

| |
|---|
| 5 |
| 9 |
| 4 |
| 8 |
| 7 |
| 6 |
| 2 |
| 1 |

ORGANIC LIGHT EMITTING DEVICE

CROSS-REFERENCE TO RELATED APPLICATION(S)

This application is a National Stage Application of International Application No. PCT/KR2020/000878 filed on Jan. 17, 2020, which claims priority to Korean Patent Application No. 10-2019-0010603 filed on Jan. 28, 2019 and Korean Patent Application No. 10-2020-0002772 filed on Jan. 8, 2020, the disclosures of which are incorporated herein by reference in their entirety.

FIELD OF DISCLOSURE

The present disclosure relates to an organic light emitting device having low driving voltage, high emission efficiency and long lifetime characteristics

BACKGROUND

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuing need for the development of new materials for the organic materials used in the organic light emitting devices as described above.

RELATED ARTS (Patent Literature 1) Korean Patent Application Publication No. 10-2000-0051826

SUMMARY

It is an object of the present disclosure to provide an organic light emitting device having low driving voltage, high emission efficiency and long lifetime characteristics.

In order to achieve the above object, there is provided the following organic light emitting device.

An organic light emitting device comprising:
an anode; a hole transport layer; a light emitting layer; and a cathode,
wherein the light emitting layer includes a host and a dopant, and wherein a difference between a dipole moment value of a compound included in the hole transport layer and a dipole moment value of the host is 1.0 to 2.0

ADVANTAGEOUS EFFECTS

The organic light emitting device according to the present disclosure can have low driving voltage, high emission efficiency and long lifetime characteristics by using a host and a material of a hole transport layer satisfying specific dipole moment values.

BRIEF DESCRIPTION OF THE DRAWINGS

FIG. 1 illustrates an example of an organic light emitting device comprising a substrate 1, an anode 2, a hole transport layer 3, a light emitting layer 4, and a cathode 5.

FIG. 2 illustrates an example of an organic light emitting device comprising a substrate 1, an anode 2, a hole injection layer 6, a second hole transport layer 7, a first hole transport layer 8, a light emitting layer 4, an electron injection and transport layer 9, and a cathode 5.

DETAILED DESCRIPTION

Hereinafter, embodiments of the present disclosure will be described in more detail to facilitate understanding of the invention.

Definition of Terms

As used herein, the notation ⊱ means a bond linked to another substituent group.

As used herein, the term "substituted or unsubstituted" means being unsubstituted or substituted with one or more substituents selected from the group consisting of deuterium; a halogen group; a nitrile group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; and a heterocyclic group containing at least one of N, O and S atoms, or being unsubstituted or substituted with a substituent to which two or more substituents of the above-exemplified substituents are connected. For example, "a substituent in which two or more substituents are connected" may be a biphenyl group. Namely, a biphenyl group may be an aryl group, or it may be interpreted as a substituent in which two phenyl groups are connected.

In the present disclosure, the carbon number of a carbonyl group is not particularly limited, but is preferably 1 to 40. Specifically, the carbonyl group may be a compound having the following structural formulas, but is not limited thereto.

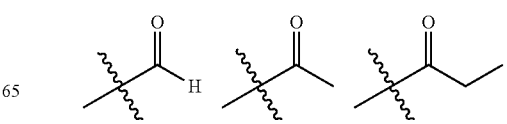

-continued

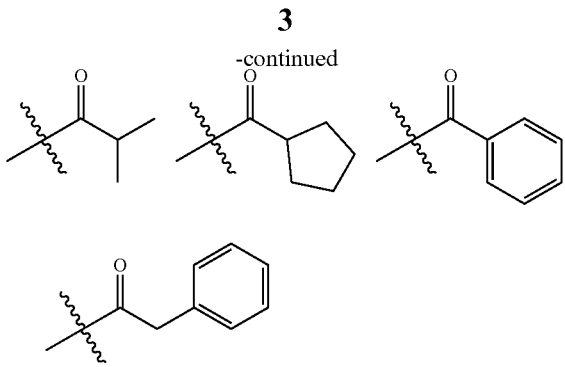
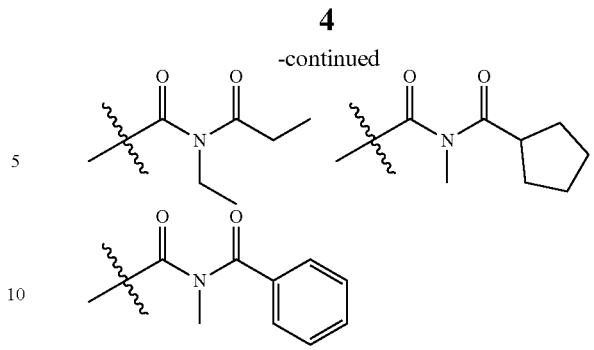

In the present disclosure, an ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be a compound having the following structural formulas, but is not limited thereto.

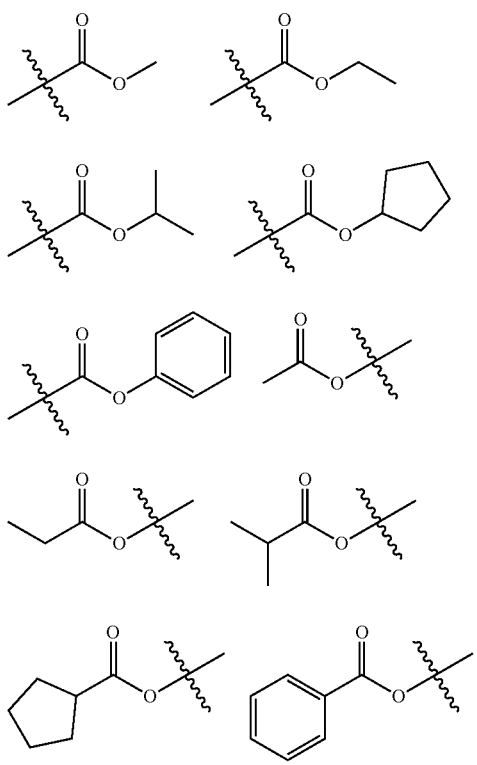

In the present disclosure, the carbon number of an imide group is not particularly limited, but is preferably 1 to 25. Specifically, the imide group may be a compound having the following structural formulas, but is not limited thereto.

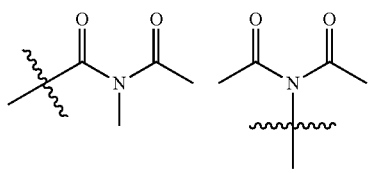

In the present disclosure, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present disclosure, a boron group specifically includes a trimethylboron group, a triethylboron group, a t-butyldimethylboron group, a triphenylboron group, and a phenylboron group, but is not limited thereto.

In the present disclosure, examples of a halogen group include fluorine, chlorine, bromine, or iodine.

In the present disclosure, the alkyl group may be straight-chain or branched-chain, and the carbon number thereof is not particularly limited, but is preferably 1 to 40. According to one embodiment, the carbon number of the alkyl group is 1 to 20, According to another embodiment, the carbon number of the alkyl group is 1 to 10. According to another embodiment; the carbon number of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethylpropyl, isohexyl, 2-methylpentyl, 4-methylhexyl, 5-methylhexyl, and the like, but are not limited thereto.

In the present disclosure, the alkenyl group may be straight-chain or branched-chain, and the carbon number thereof is not particularly limited, but is preferably 2 to 40. According to one embodiment, the carbon number of the alkenyl group is 2 to 20. According to another embodiment, the carbon number of the alkenyl group is 2 to 10. According to still another embodiment, the carbon number of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present disclosure, a cycloalkyl group is not particularly limited, but the carbon number thereof is preferably 3 to 60. According to one embodiment, the carbon number of the cycloalkyl group is 3 to 30. According to another embodiment, the carbon number of the cycloalkyl group is 3 to 20. According to still another embodiment, the carbon number of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trim ethylcyclohexyl, 4-tert-butylcyclohexyl, cycloheptyl, cyclooctyl, and the like, but are not limited thereto.

In the present disclosure, an aryl group is not particularly limited, but the carbon number thereof is preferably 6 to 60, and it may be a monocyclic aryl group or a polycyclic aryl group. According to one embodiment, the carbon number of the aryl group is 6 to 30. According to one embodiment, the carbon number of the aryl group is 6 to 20. The aryl group may be a phenyl group, a biphenyl group, a terphenyl group or the like as the monocyclic aryl group, but is not limited thereto. The polycyclic aryl group includes a naphthyl group, an anthracenyl group, a phenanthryl group, a pyrenyl group, a perylenyl group, a chrysenyl group, a fluorenyl group or the like, but is not limited thereto.

In the present disclosure, a fluorenyl group may be substituted, and two substituent groups may be bonded to each other to form a spiro structure. In the case where the fluorenyl group is substituted,

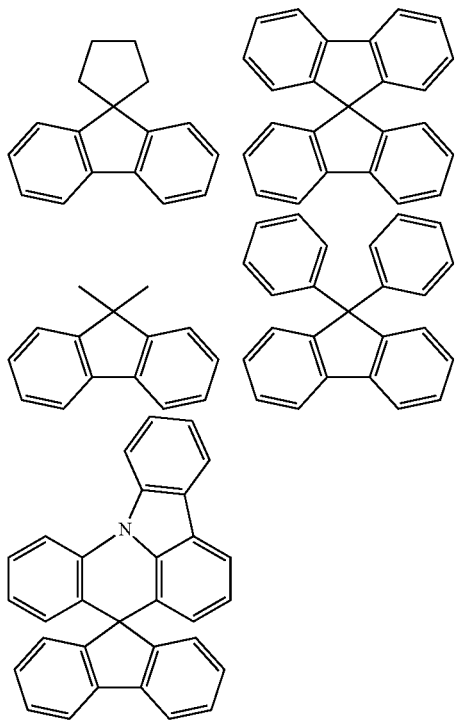

and the like can be formed. However, the structure is not limited thereto.

In the present disclosure, a heterocyclic group is a heterocyclic group containing one or more of O, N, Si and S as a heteroatom, and the carbon number thereof is not particularly limited, but is preferably 2 to 60. Examples of the heterocyclic group include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzoimidazole group, a benzothiazole group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present disclosure, the aryl group in the aralkyl group, the aralkenyl group, the alkylaryl group and the arylamine group is the same as the aforementioned examples of the aryl group. In the present disclosure, the alkyl group in the aralkyl group, the alkylaryl group and the alkylamine group is the same as the aforementioned examples of the alkyl group. n the present disclosure, the heteroaryl in the heteroarylamine can be applied to the aforementioned description of the heterocyclic group. In the present disclosure, the alkenyl group in the aralkenyl group is the same as the aforementioned examples of the alkenyl group. In the present disclosure, the aforementioned description of the aryl group may be applied except that the arylene is a divalent group. In the present disclosure, the aforementioned description of the heterocyclic group can be applied except that the heteroarylene is a divalent group. In the present disclosure, the aforementioned description of the aryl group or cycloalkyl group can be applied except that the hydrocarbon ring is not a monovalent group but formed by combining two substituent groups. In the present disclosure, the aforementioned description of the heterocyclic group can be applied, except that the heterocyclic group is not a monovalent group but formed by combining two substituent groups.

Hole Transport Layer and Light Emitting Layer

The organic light emitting device of the present disclosure is characterized by comprising: an anode; a hole transport layer; a light emitting layer; and a cathode, wherein the light emitting layer includes a host and a dopant, and wherein a difference between a dipole moment value of a compound included in the hole transport layer and a dipole moment value of the host is within a specific range.

Meanwhile, the hole transport layer and the light emitting layer are adjacent to each other.

The term "dipole moment" as used herein refers to a physical quantity indicating the degree of polarity, and can be calculated by the following Equation 1.

$$p(r) = \int_V \rho(r_0)(r_0 - r) d^3 r_0 \quad \text{[Equation 1]}$$

$\rho(r_0)$: molecular density
V: volume
r: the point of observation
$d^3 r_0$: an elementary volume In the Equation 1, the molecular density can be calculated to obtain the values of the dipole moment. For example, the charge and dipole for each atom are calculated using Hirshfeld Charge Analysis method, and the molecular density can be determined by calculating according to the following Equation. The calculated results can be substituted into the Equation 1 to determine the dipole moment.

Weight Function $$W_\alpha(r) = \rho(r - R_\alpha)\left[\sum_\beta \rho_\beta(r - R_\beta)\right]^{-1}$$

$\rho_\alpha(r - R_\alpha)$: spherically averaged ground-state amomic density
$\Sigma_\beta \rho_\beta(r - R_\beta)$: promolecule density Deformation Density $$\rho_d(r) = \rho(r) - \sum_\alpha \rho_\alpha(r - R_\alpha)$$

$\rho(r)$: molecular density
$\rho_\alpha(r-R_\alpha)$: density of the free atom a located at coordinates $R_\alpha$ Atomic Charge $q(\alpha)=-\int \rho_d(r) W_\alpha(r) d^3 r$ $W_\alpha(r)$: weight function In order to optimize the light emission characteristics of the organic light emitting device, it is necessary to consider a difference between the dipole moment value of the host compound of the light emitting layer and the dipole moment value of the compound included in the hole transport layer. In the present disclosure, it was confirmed that when the difference between the dipole moment value of the host and the dipole moment value of the compound included in the hole transport layer is within a specific range, it may have high emission efficiency characteristics.

Preferably, the difference between the dipole moment value of the host and the dipole moment value of the compound included in the hole transport layer may be 1.0 to 2.0.

When the difference between the dipole moment values is less than 1.0, there is a disadvantage in that the organic light emitting device has low efficiency, and when it exceeds 2.0, there is a problem that the efficiency is lowered.

Specifically, the dipole moment value of the compound included in the hole transport layer may be 1.0 to 3.0, and preferably 1.2 to 3.0, or 1.2 to 2.8.

The dipole moment value of the host ay be 0.1 to 1.2, and preferably, 0.15 to 1.2, or 0.15 to 1.0.

The hole transport layer is a layer that receives holes from the hole injection layer, which will be described later, and transports the holes to the light emitting layer. The hole transport material is suitably a material having large mobility to the holes, which may receive holes from the anode or the hole injection layer and transfer the holes to the light emitting layer.

Preferably, the hole transport layer may include a compound represented by the following Chemical Formula 1:

[Chemical Formula 1]

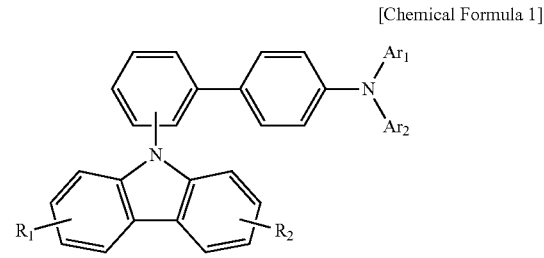

in Chemical Formula 1, $R_1$ and $R_2$ are each independently hydrogen; or a substituted or unsubstituted $C_{6-60}$ aryl, $Ar_1$ is phenyl; biphenyl-2-yl; biphenyl-4-yl; naphthyl; phenanthrenyl; or naphthyl phenyl, $Ar_2$ is phenyl; biphenyl-4-yl; naphthyl; phenanthrenyl; naphthyl phenyl; phenanthrenyl phenyl; 9,9-dimethyl-9H-fluorenyl; 9,9-diphenyl-9H-fluorenyl; or 9,9'-spirobifluorenyl,

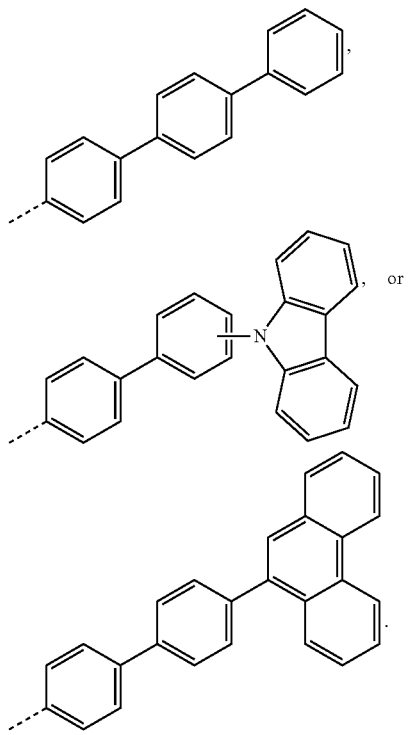

Preferably, the compound of Chemical Formula 1 may be represented by the following Chemical Formula 1-1 or Chemical Formula 1-2:

[Chemical Formula 1-1]

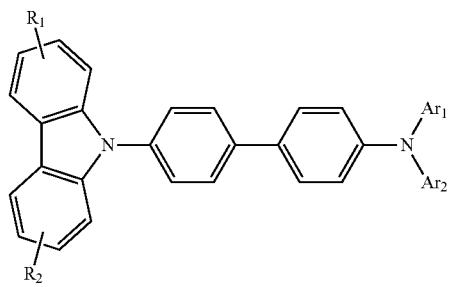

[Chemical Formula 1-2]

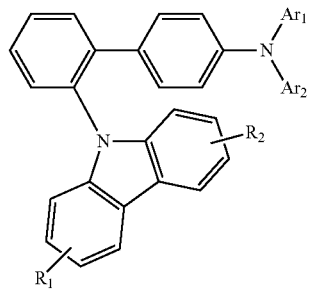

in Chemical Formula 1-1 or Chemical Formula 1-2, $R_1$, $R_2$, $Ar_1$ and $Ar_2$ are the same as defined in Chemical Formula 1.

Preferably, $R_1$ and $R_2$ are each independently hydrogen; or a substituted or unsubstituted $C_{6-30}$ aryl, and more preferably, $R_1$ and $R_2$ are each independently hydrogen; phenyl; or naphthyl.

Preferably, Ar$_2$ is phenyl; biphenyl-4-yl; naphthyl phenyl; phenanthrenyl phenyl; 9,9-dimethyl-9H-fluorenyl; 9,9-diphenyl-9H-fluorenyl; 9,9'-spirobifluorenyl,
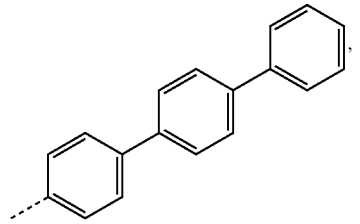
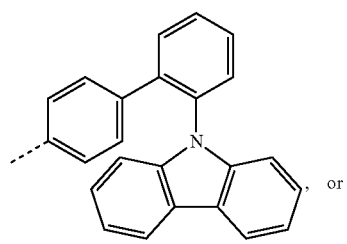
, or
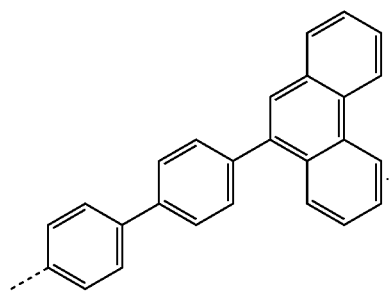
Representative examples of the compound represented by Chemical Formula 1 are as follows:
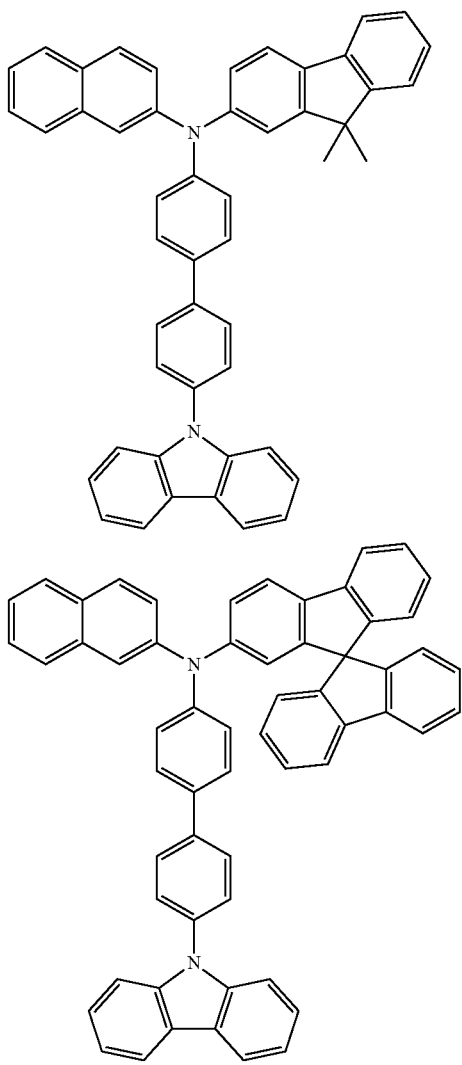
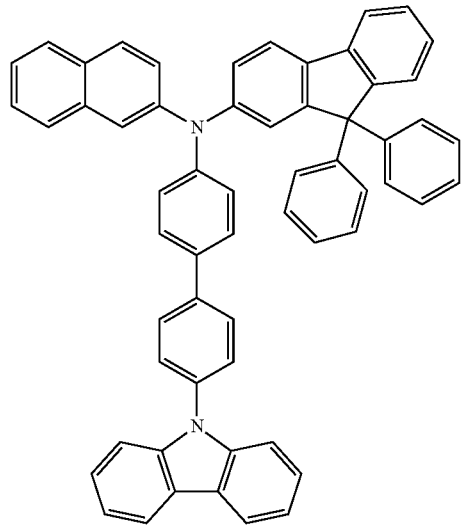
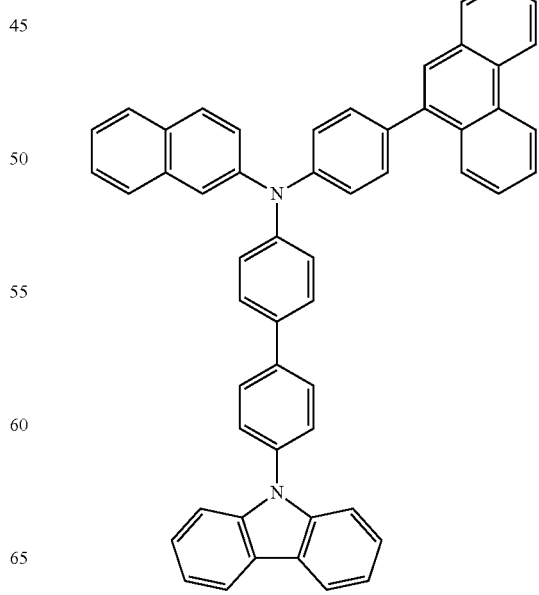

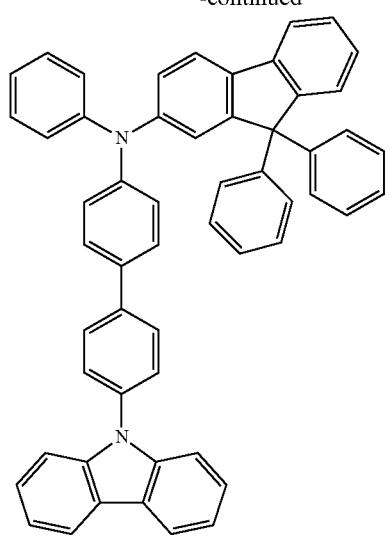
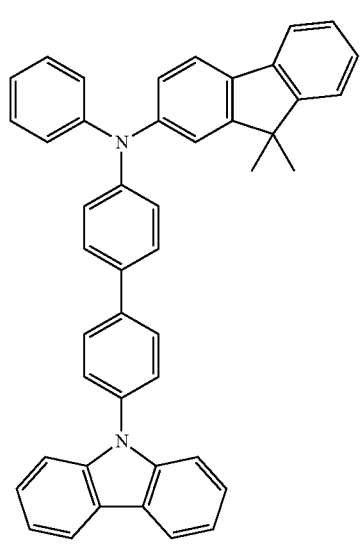
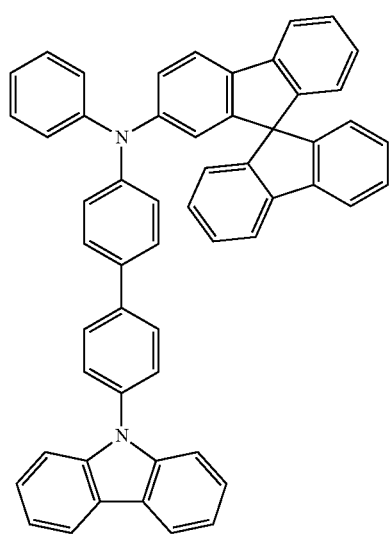
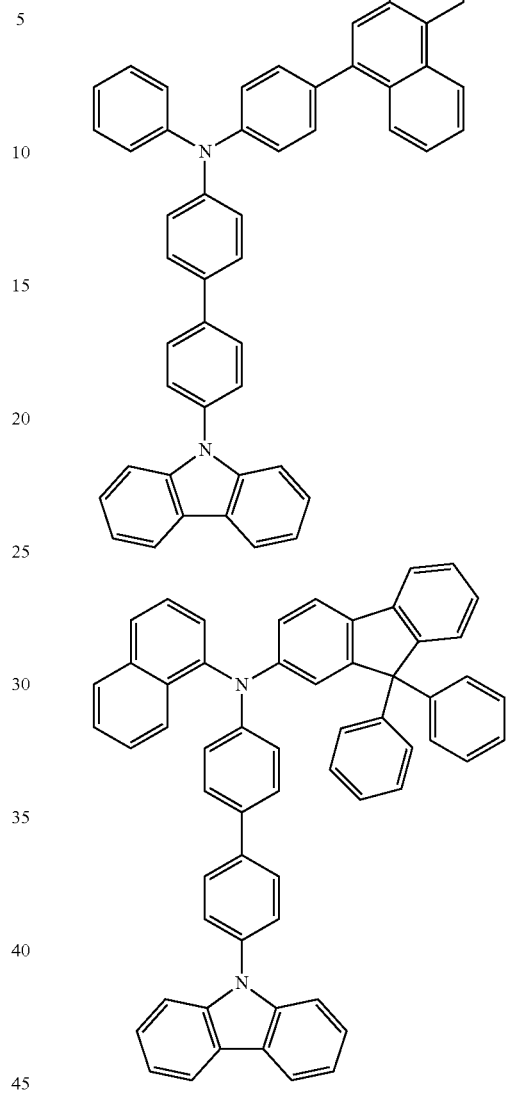
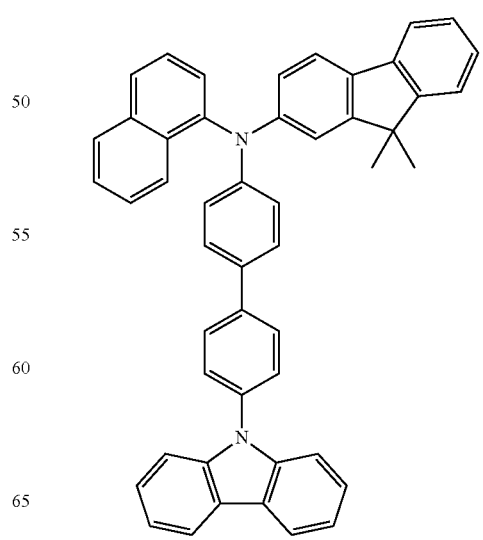

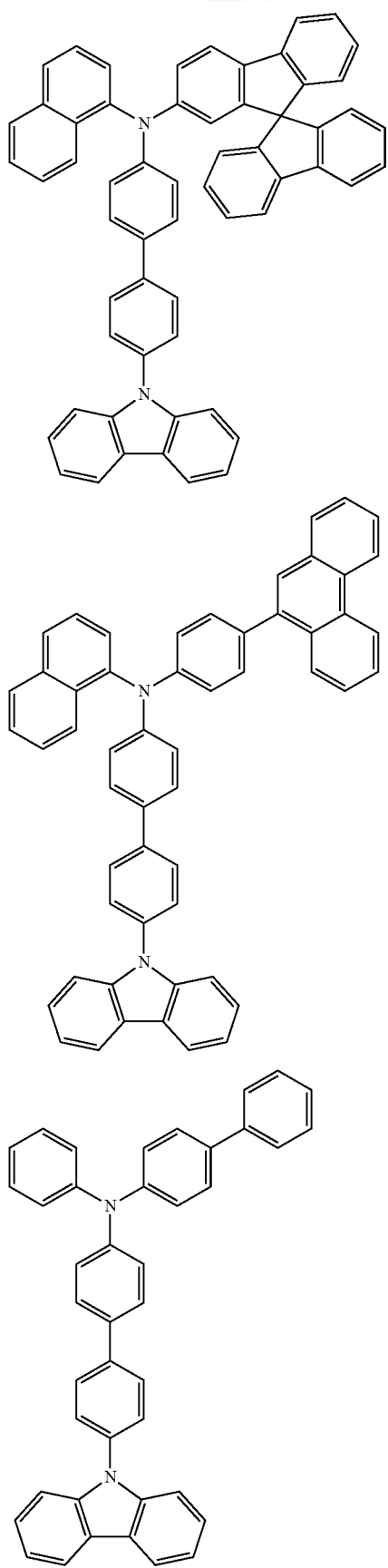
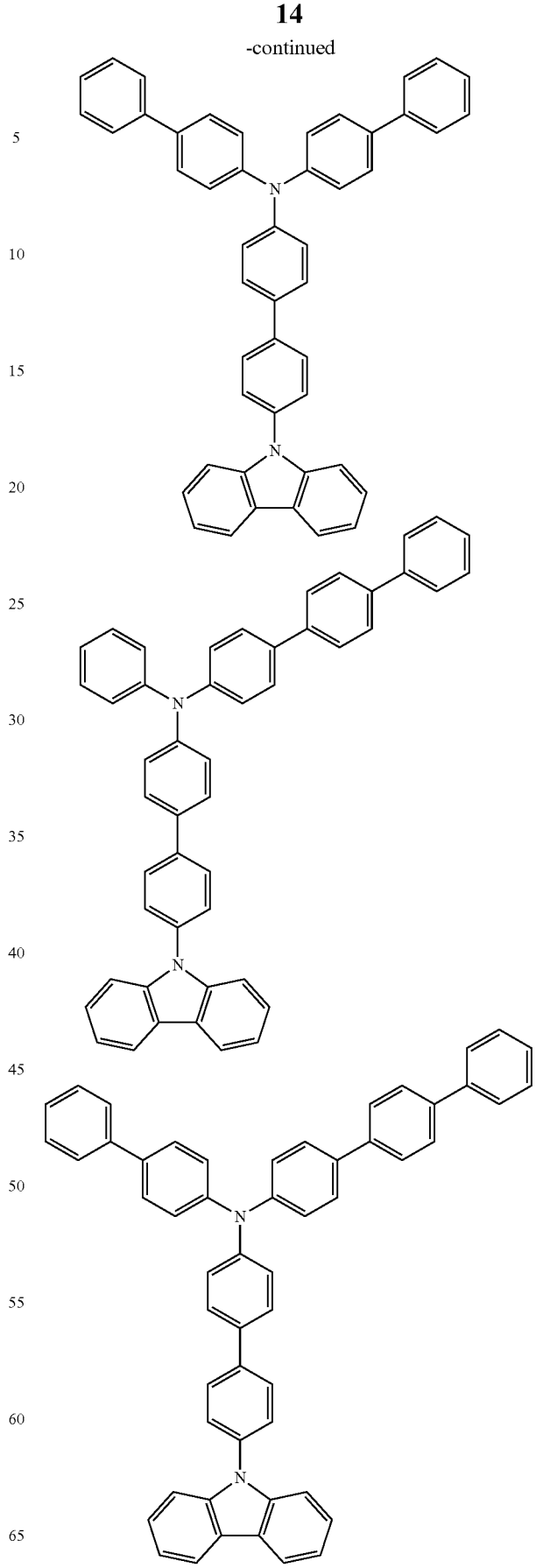

-continued
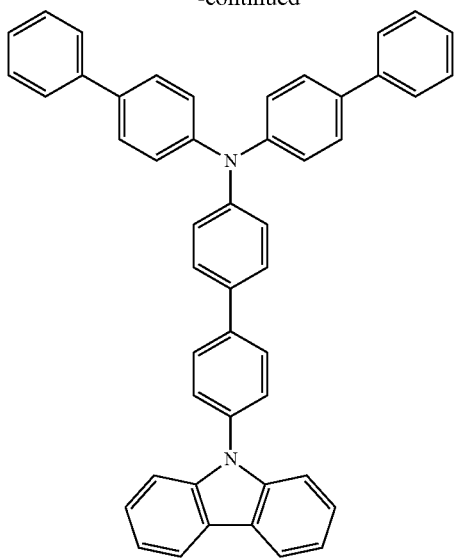
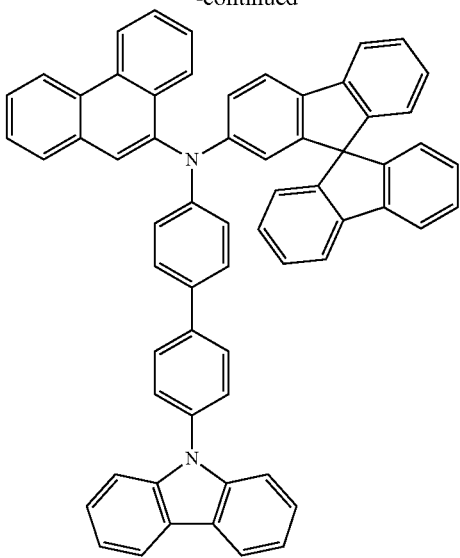
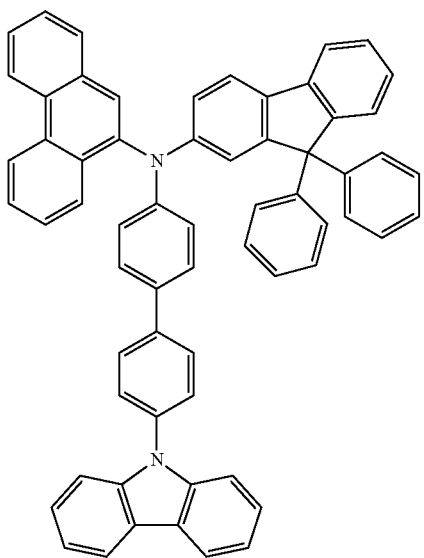
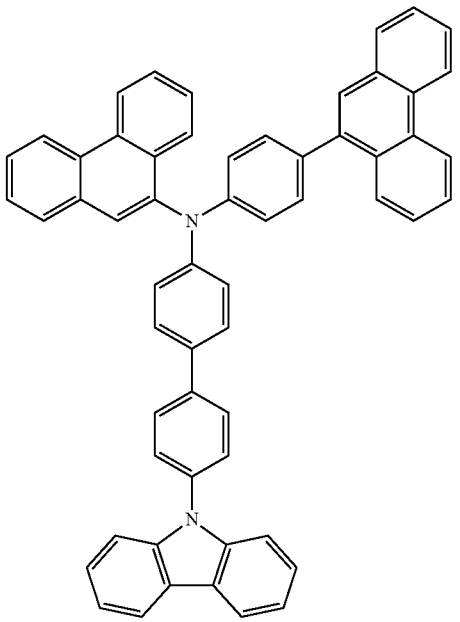
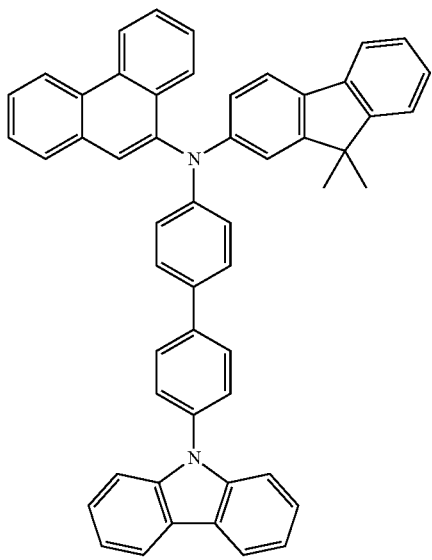
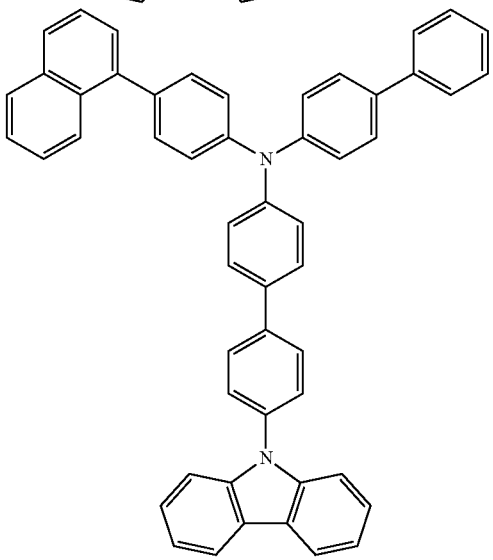

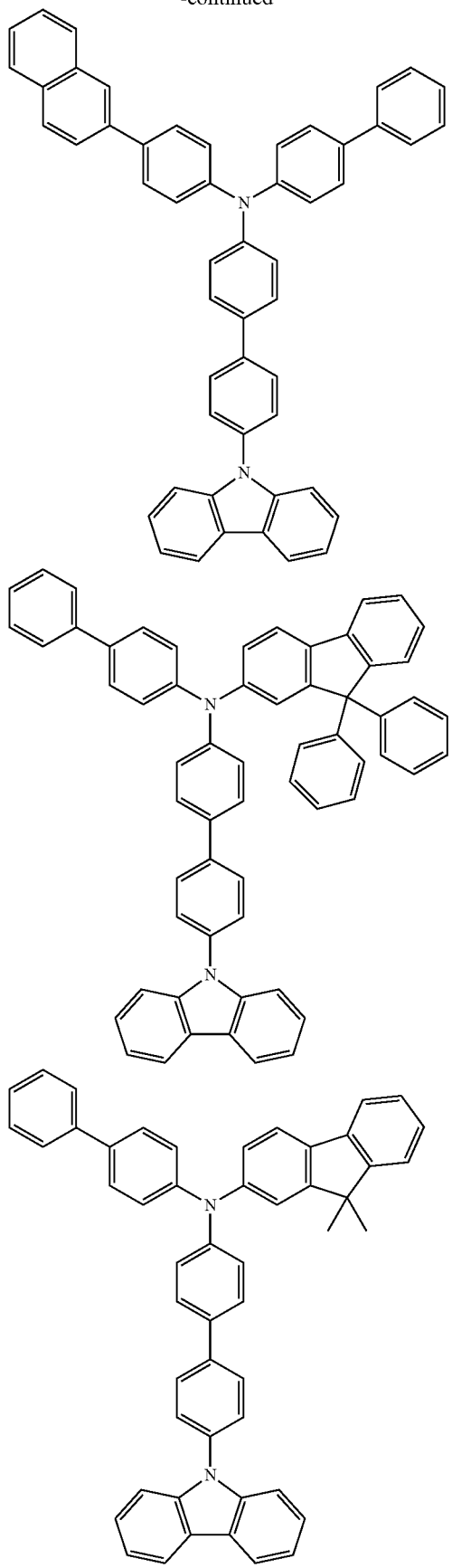
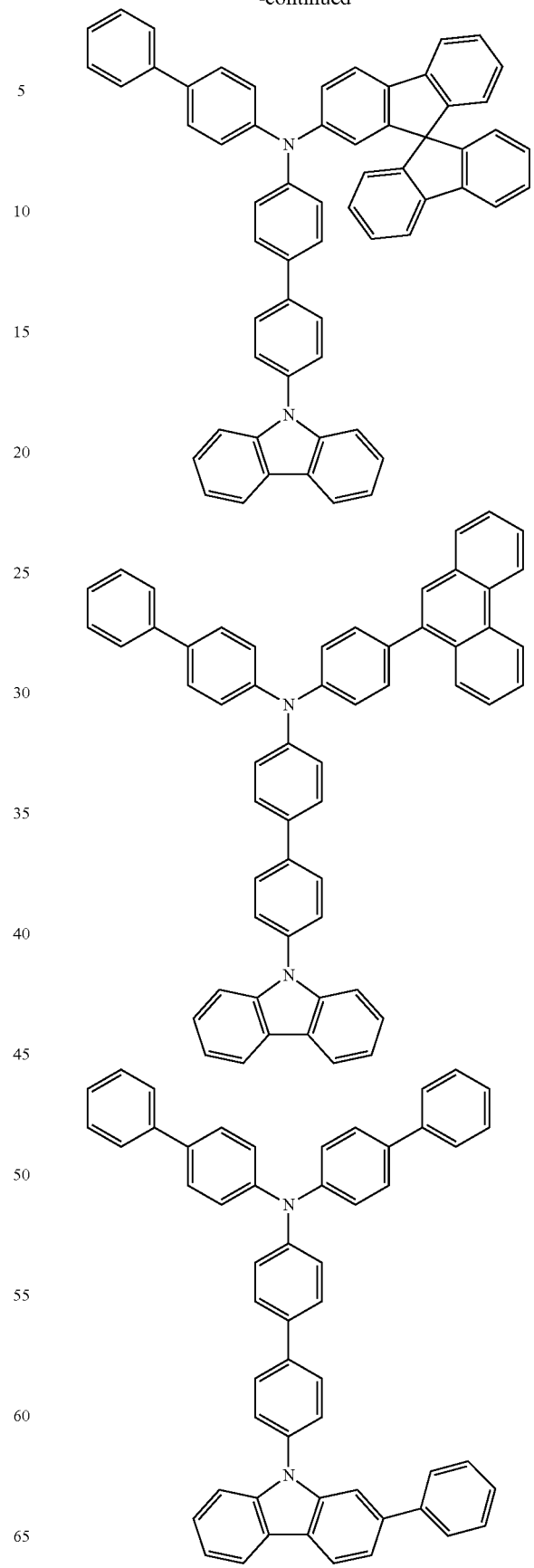

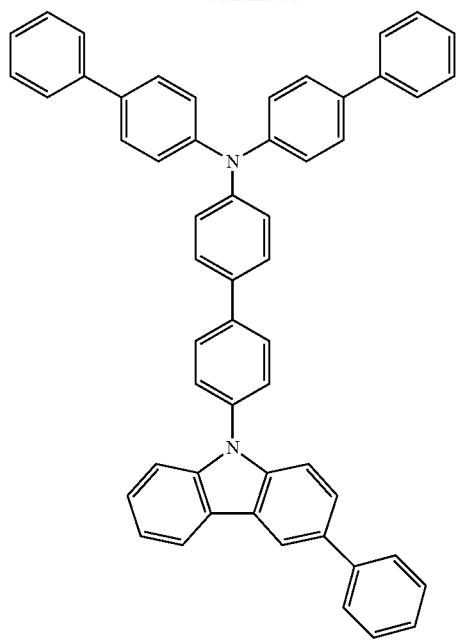
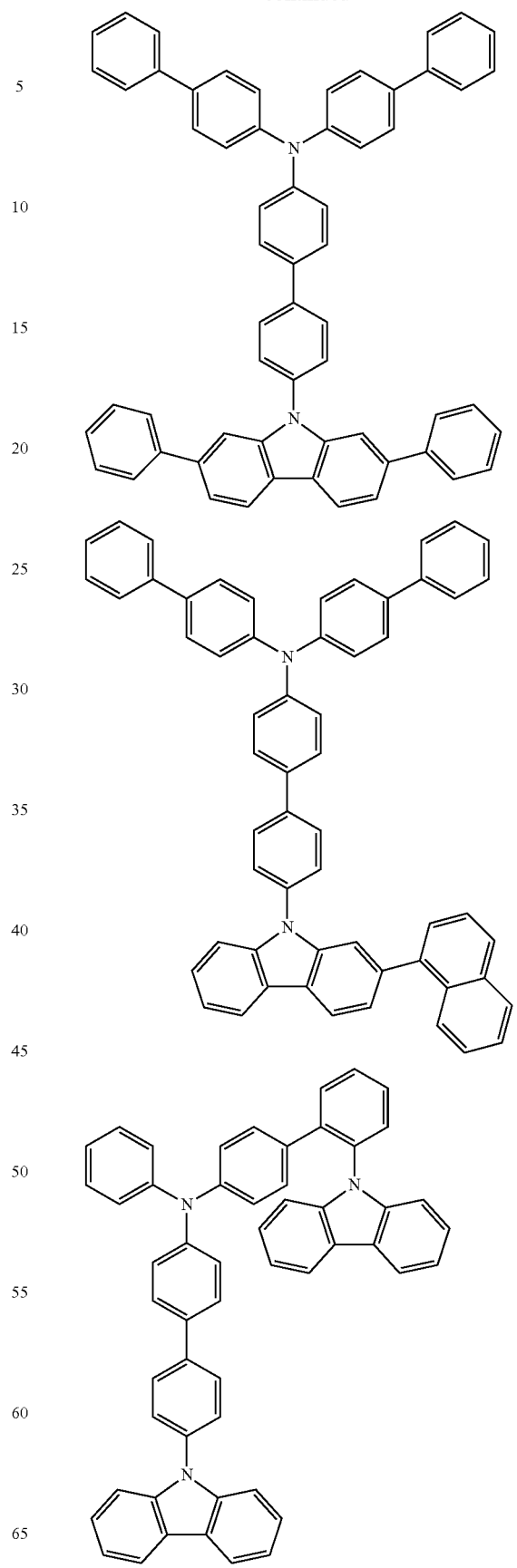

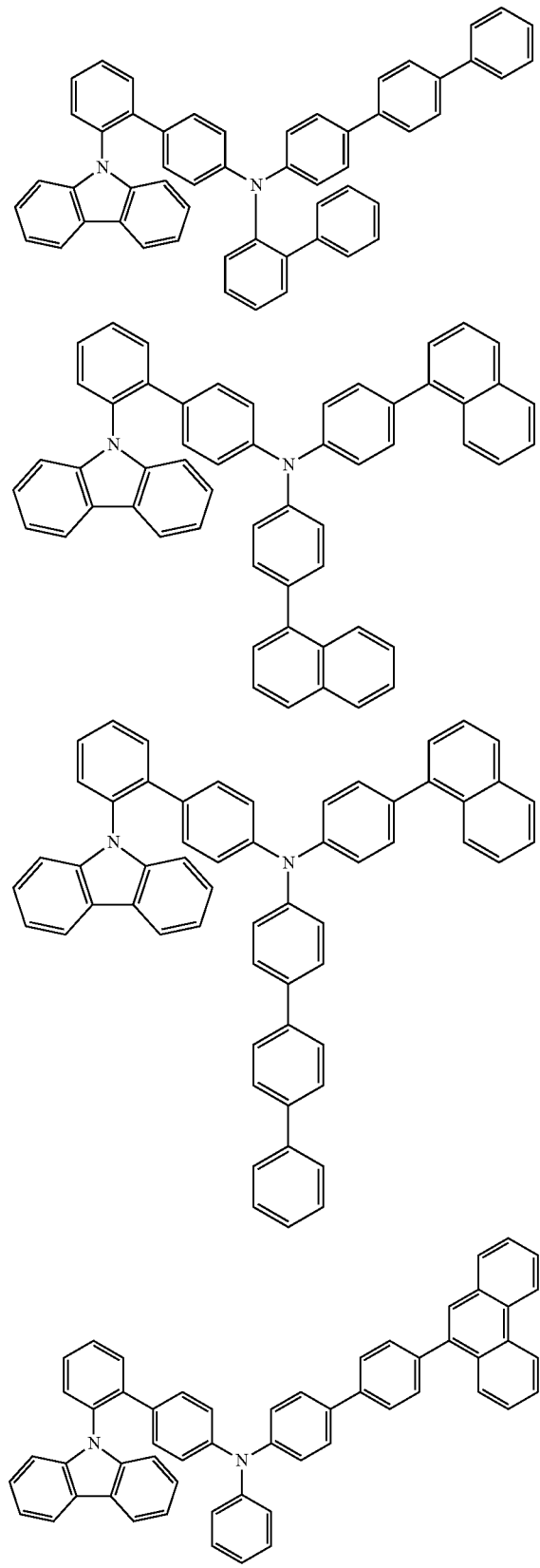

The compound represented by Chemical Formula 1 may be prepared in accordance with a preparation method as shown in Reaction Scheme 1 below, and the other remaining compounds can be prepared in a similar manner.

[Reaction Scheme 1]

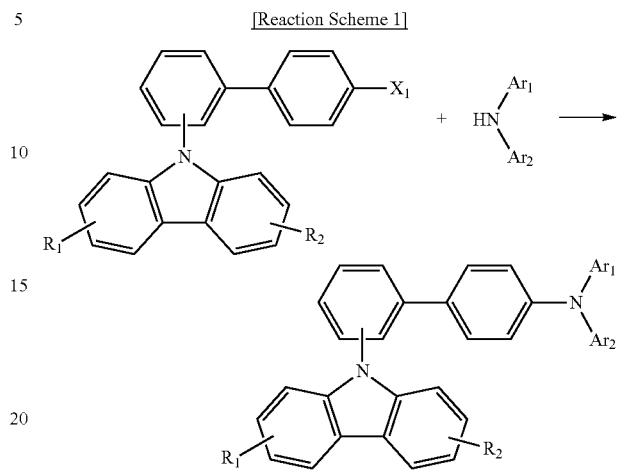

In Reaction Scheme 1, the remaining substituents excluding $X_1$ are the same as defined above, and X1 is halogen, preferably bromo or chloro, Reaction Scheme 1 is an amine substitution reaction, which is preferably carried out in the presence of a palladium catalyst and a base, and a reactive group for the amine substitution reaction can be changed as known in the art. The above preparation method will be more specifically described in the Preparation Examples described hereinafter.

Meanwhile, the organic light emitting device according to the present disclosure may include an additional hole transport layer in addition to the above-mentioned hole transport layer. In this case, the additional hole transport layer is included as a layer not adjacent to the light emitting layer. The additional hole transport layer may be used without limitation as long as it is a hole transport layer used in the technical field to which the present disclosure pertains, and specific examples thereof include an arylamine-based organic material, a conductive polymer, a block copolymer in which a conjugate portion and a non-conjugate portion are present together.

Meanwhile, the dopant material used in the light emitting layer is not particularly limited as long as it is any one used in the organic light emitting device. Examples of the dopant material include an aromatic amine derivative, a styrylamine compound, a boron complex, a fluoranthene compound, a metal complex, and the like. Specifically, the aromatic amine derivative is a substituted or unsubstituted fused aromatic ring derivative having an arylamino group, and examples thereof include pyrene, anthracene, chrysene, periflanthene and the like, which have an arylamino group. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, the metal complex includes an iridium complex, a platinum complex, and the like, but is not limited thereto.

Preferably, a compound represented by the following Chemical Formula 2 may be used as the host.

[Chemical Formula 2]

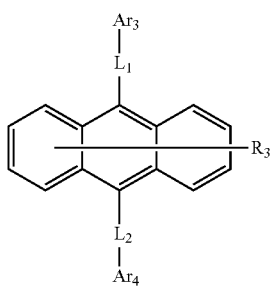

In Chemical Formula 2, $R_3$ is hydrogen; deuterium; halogen; cyano; nitro; amino; a substituted or unsubstituted $C_{1-60}$ alkyl; a substituted or unsubstituted $C_{3-60}$ cycloalkyl; a substituted or unsubstituted $C_{2-60}$ alkenyl; a substituted or unsubstituted $C_{6-60}$ aryl; or a substituted or unsubstituted $C_{2-60}$ heteroaryl containing any one or more heteroatoms selected from the group consisting of N, O and S, $Ar_3$ and $Ar_4$ are each independently a substituted or unsubstituted $C_{6-60}$ aryl; or a substituted or unsubstituted $C_{2-60}$ heteroaryl containing any one or more heteroatoms selected from the group consisting of N, O and S, and $L_1$ and $L_2$ are each independently a single bond; a substituted or unsubstituted $C_{6-60}$ arylene; or a substituted or unsubstituted $C_{2-60}$ heteroarylene containing any one or more heteroatoms selected from the group consisting of N, O and S.

Preferably, $R_3$ is hydrogen; a substituted or unsubstituted $C_{6-30}$ aryl; or a substituted or unsubstituted $C_{6-30}$ heteroaryl containing any one or more heteroatoms selected from the group consisting of N, O and S, more preferably, $R_3$ is phenyl; biphenylyl; naphthyl; dibenzofuranyl; dibenzothiophenyl; phenyl carbazolyl; or naphthyl phenyl, and most preferably, $R_3$ is phenyl; biphenylyl; naphthyl; dibenzofuranyl; dibenzothiophenyl; 9-phenyl-9H-carbazolyl; or naphthyl phenyl Preferably, $Ar_3$ and $Ar_4$ are each independently a substituted or unsubstituted $C_{6-30}$ aryl; or a substituted or unsubstituted $C_{6-30}$ heteroaryl containing any one or more heteroatoms selected from the group consisting of N, O and S, more preferably, $Ar_3$ and $Ar_4$ are each independently phenyl; biphenylyl; terphenylyl; naphthyl; phenanthrenyl; binaphthylyl; naphthyl phenyl; phenanthrenyl phenyl; phenyl naphthyl; dibenzofuranyl; dibenzothiophenyl; benzonaphthofuranyl; or benzonaphthothiophenyl, and most preferably, $Ar_3$ and $Ar_4$ are each independently phenyl; biphenylyl; terphenylyl; naphthyl; phenanthrenyl; binaphthylyl; naphthyl phenyl; phenanthrenyl phenyl; phenyl naphthyl; dibenzofuranyl; dibenzothiophenyl; benzo[d]naphtho[1,2-b]furanyl; benzo[d]naphtho[2,3-b]furanyl; benzo[d]naphtho[2,1-b]furanyl; benzo[d]naphtho[1,2-b]thiophenyl; benzo[d]naphtho[2,3-b]thiophenyl; or benzo[d]naphtho[2,1-b]thiophenyl.

Preferably, $L_1$ and $L_2$ are each independently a single bond; a substituted or unsubstituted $C_{6-30}$ arylene; or; a substituted or unsubstituted $C_{6-30}$ heteroarylene containing any one or more heteroatoms selected from the group consisting of N, O and S, more preferably, $L_1$ and $L_2$ are each independently a single bond; phenylene; biphenylene; naphthylene; dibenzofuranylene; or dibenzothiophenylene;

Representative examples of the compound represented by Chemical Formula 2 are as follows;

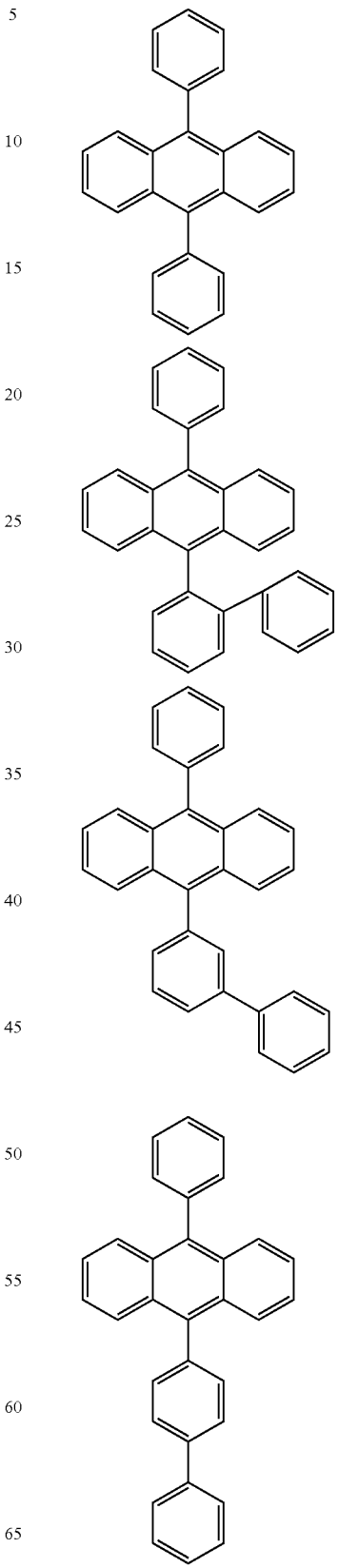

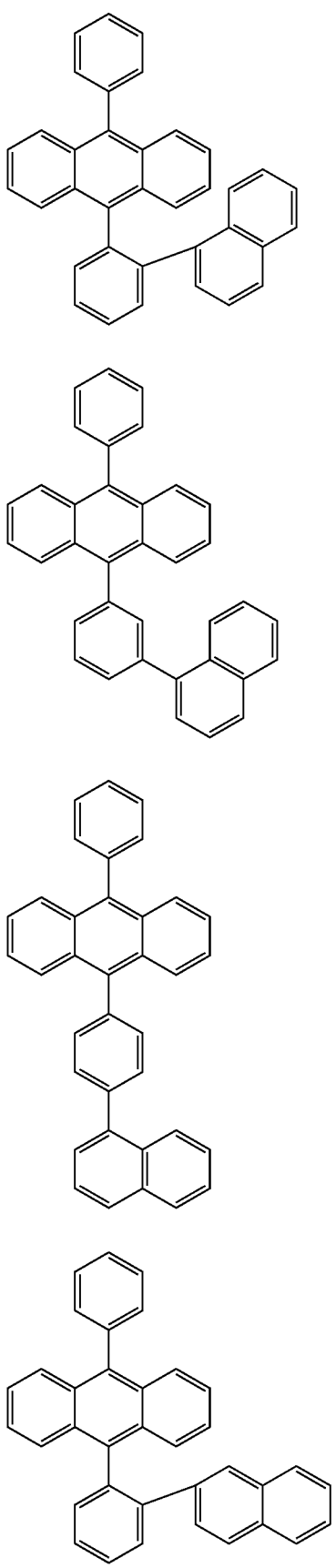
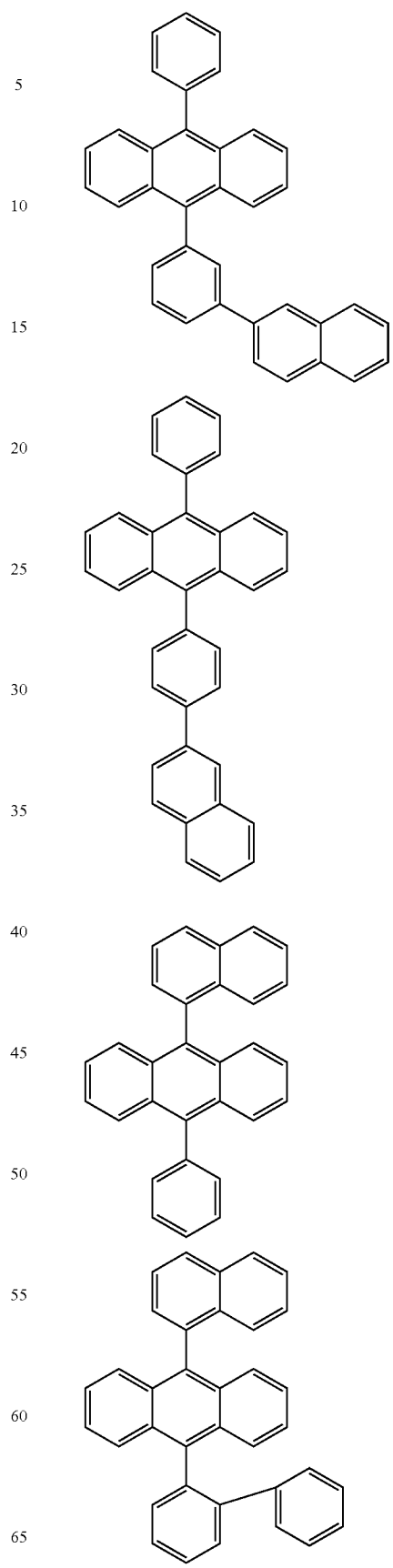

-continued
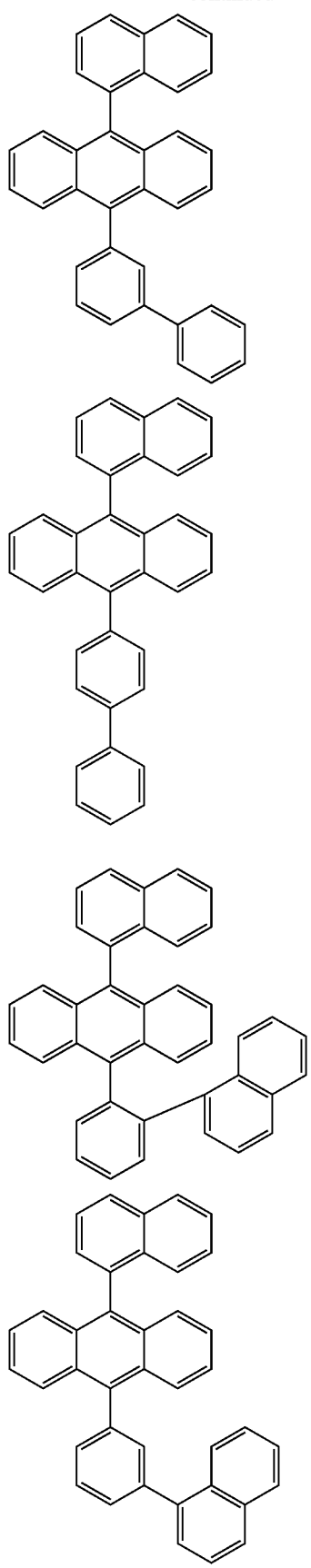
-continued
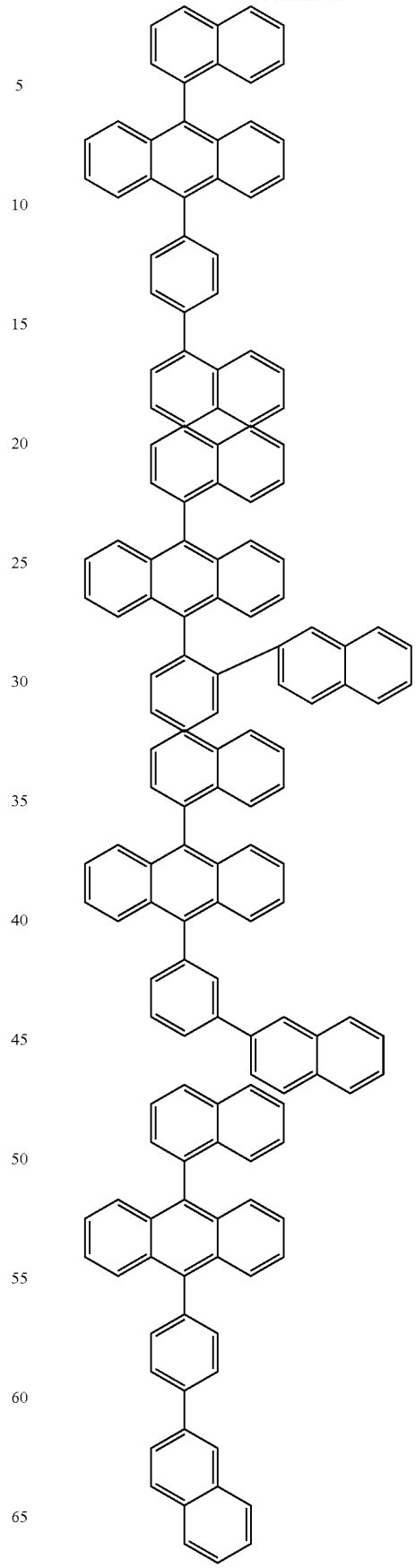

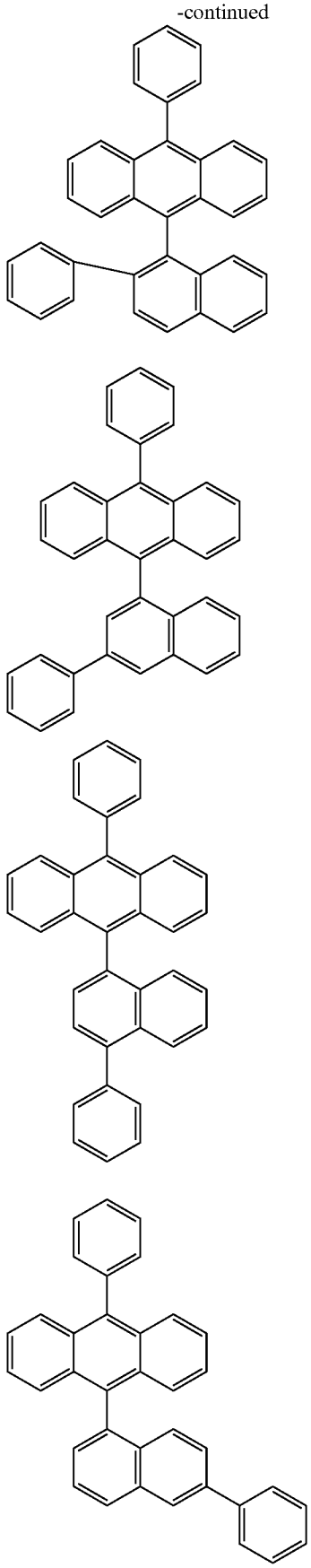
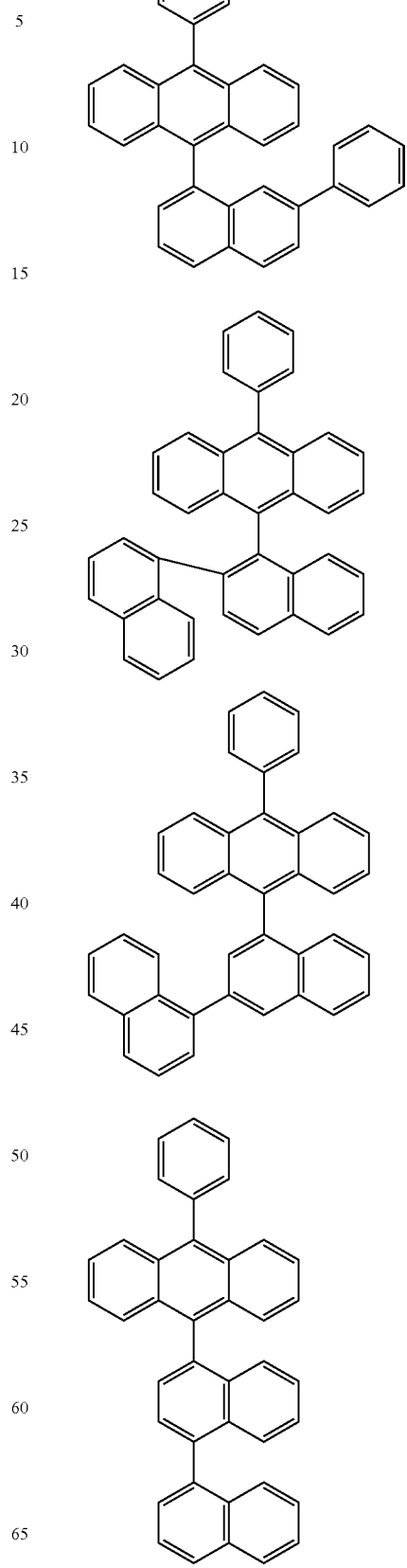

31
-continued
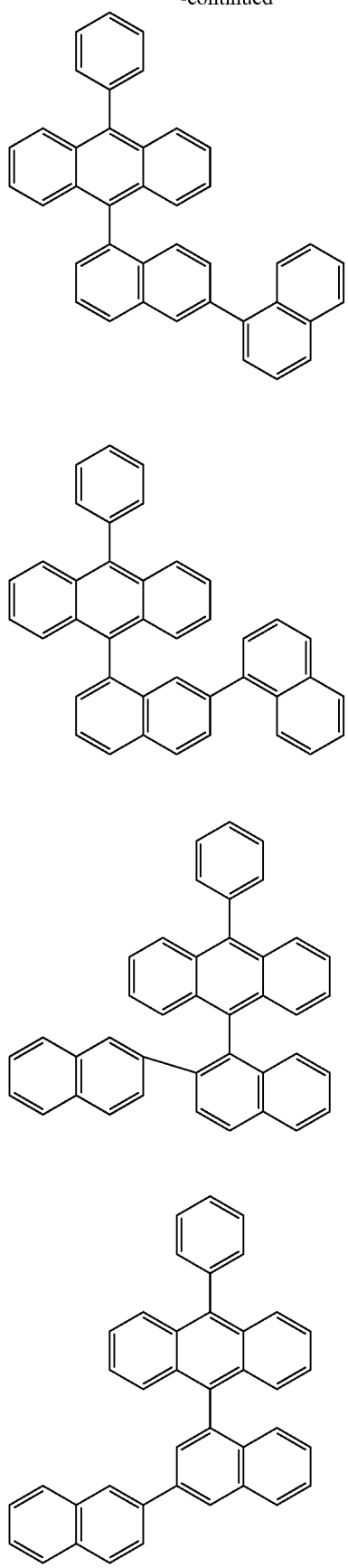
32
-continued
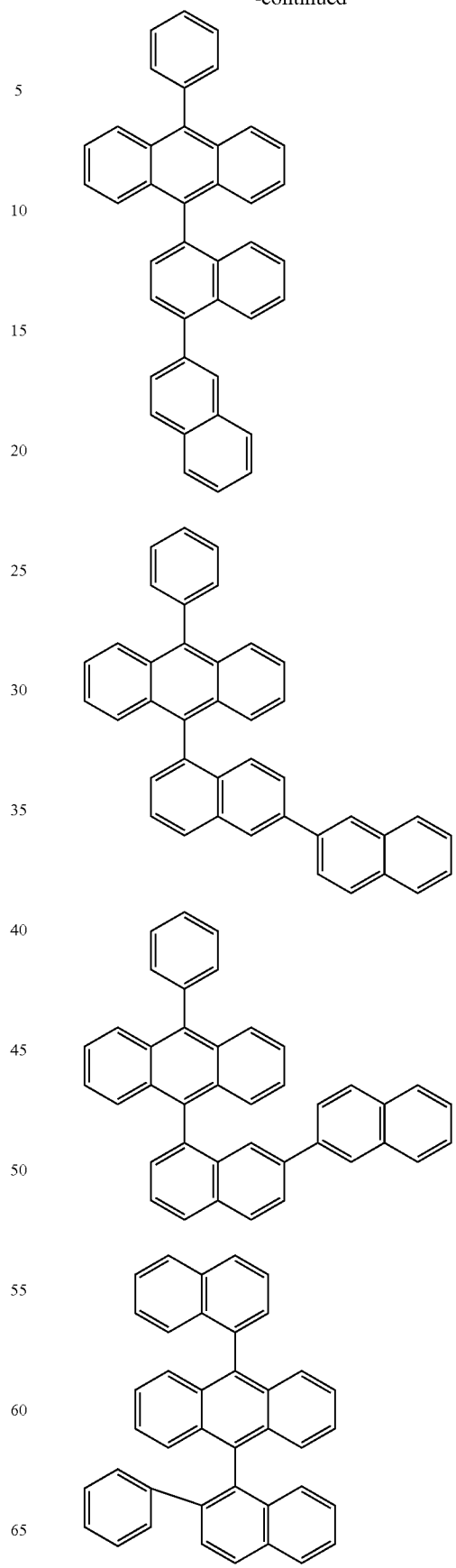

33
-continued
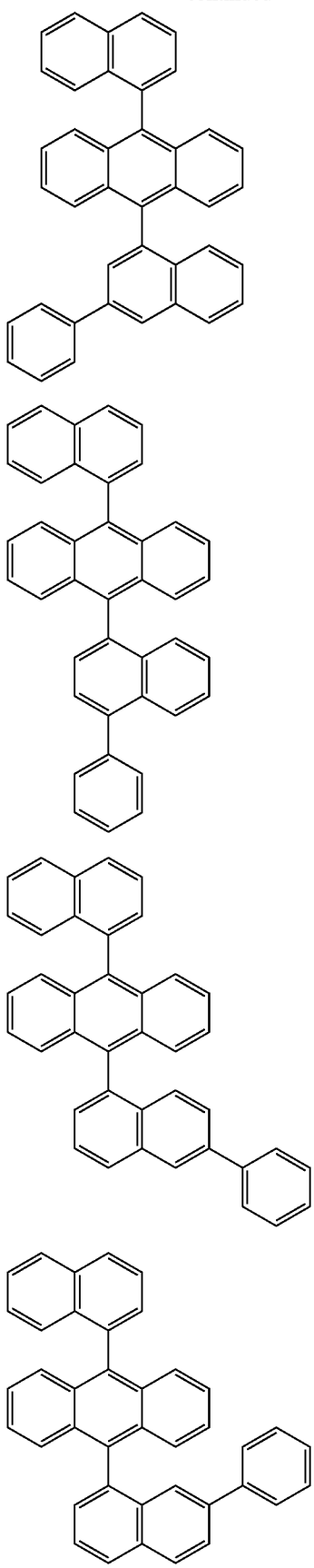
34
-continued
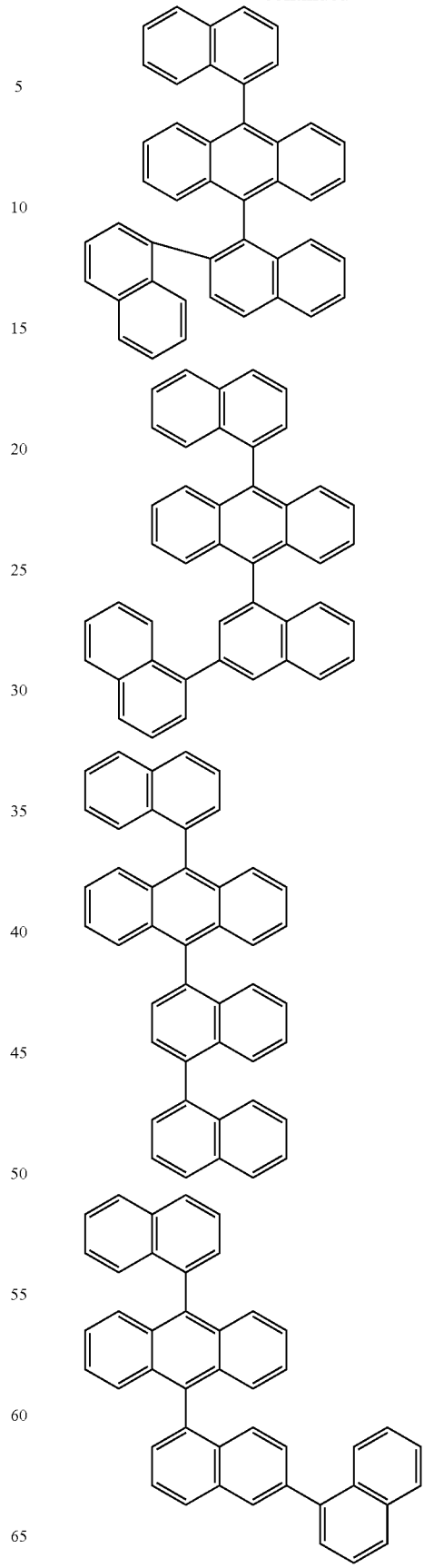

-continued
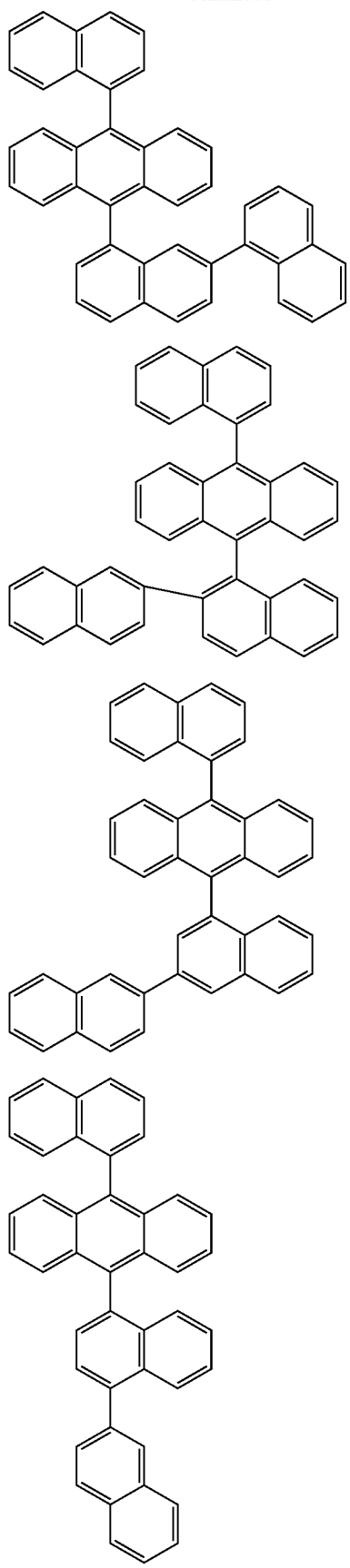
-continued
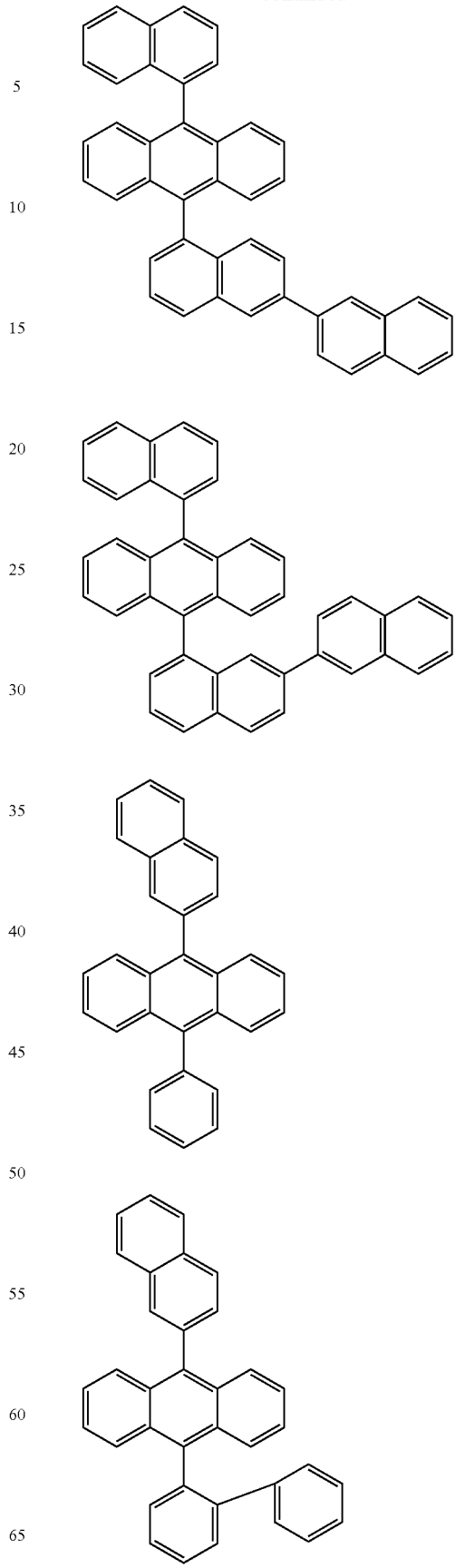

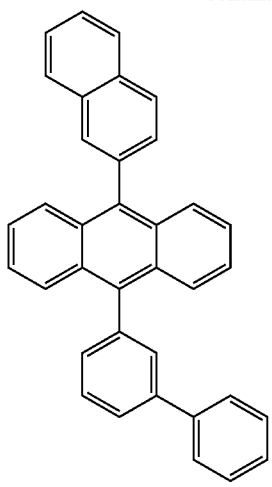
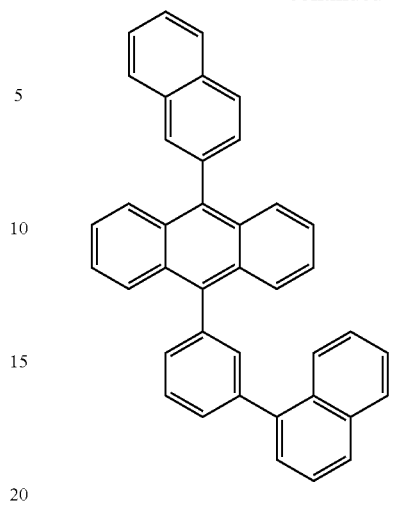
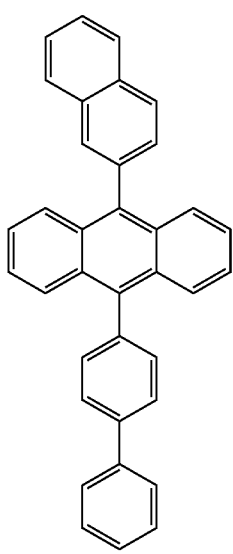
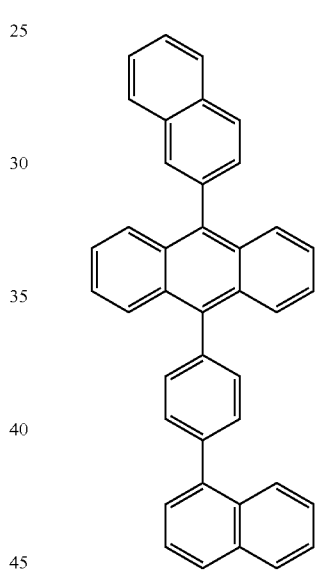
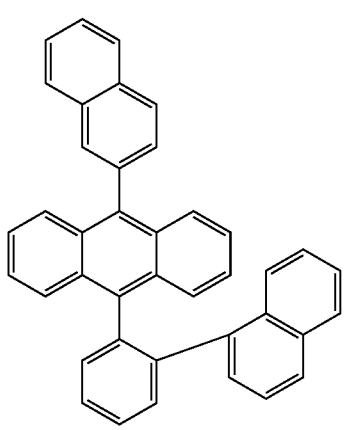
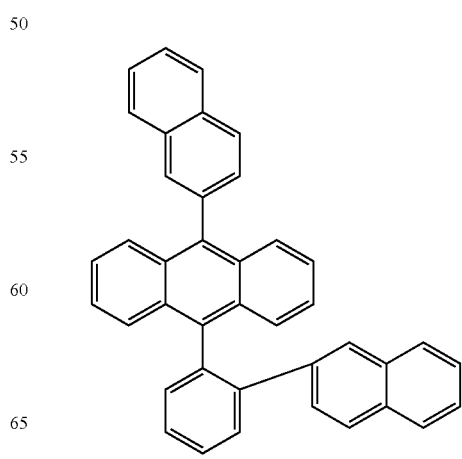

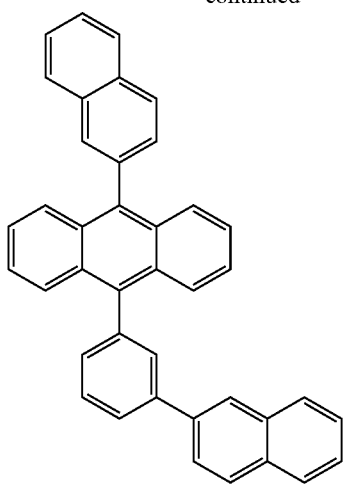
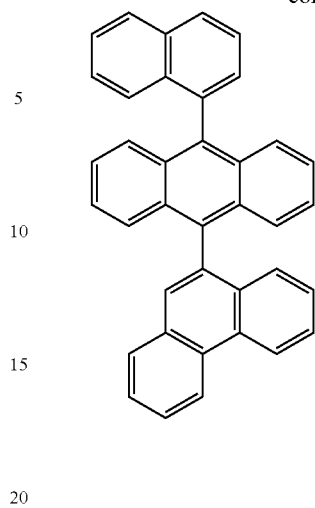
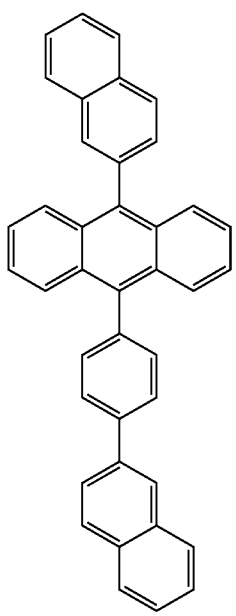
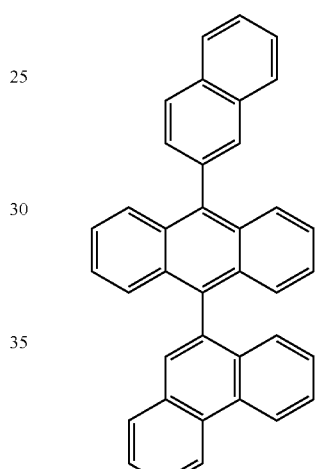
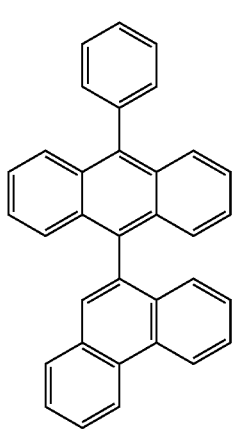
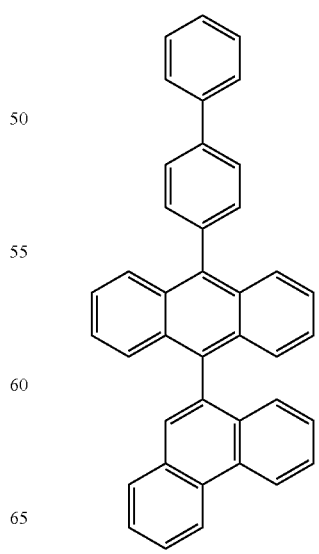

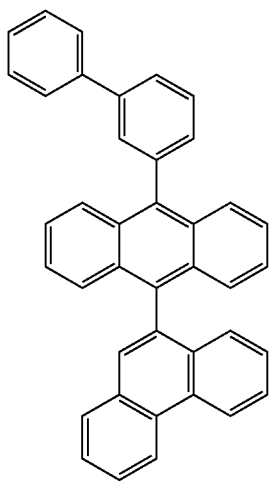
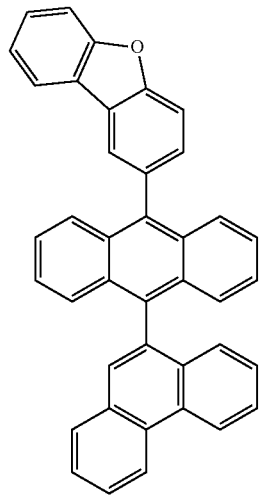
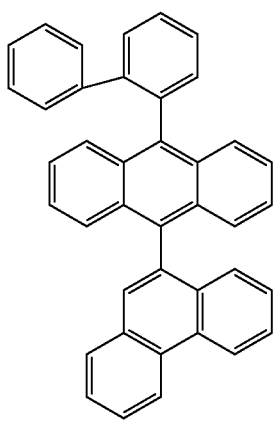
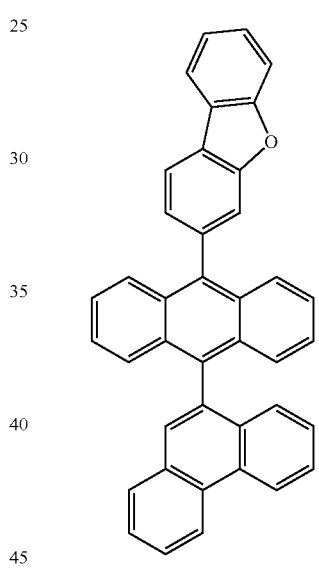
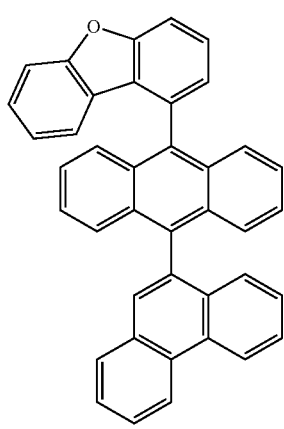
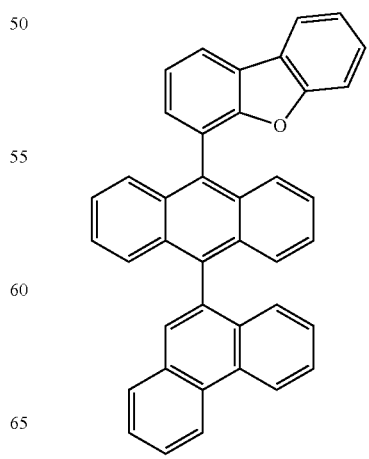

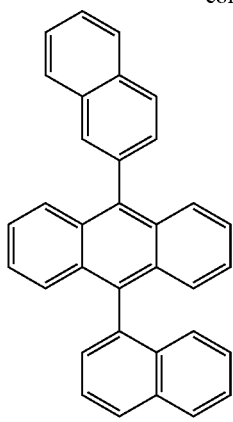
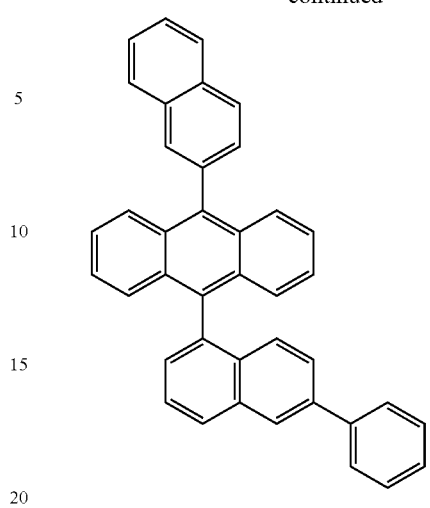
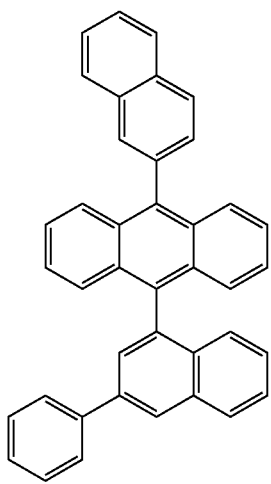
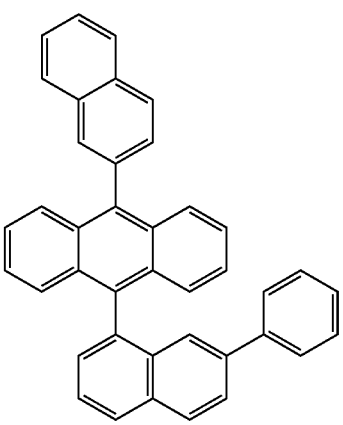
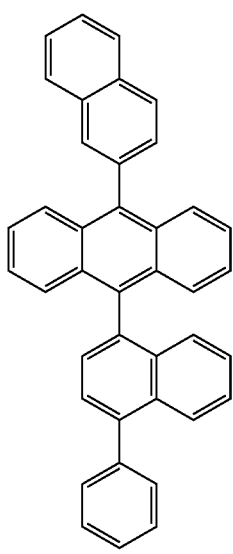
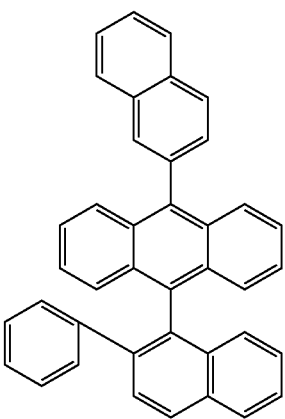

-continued
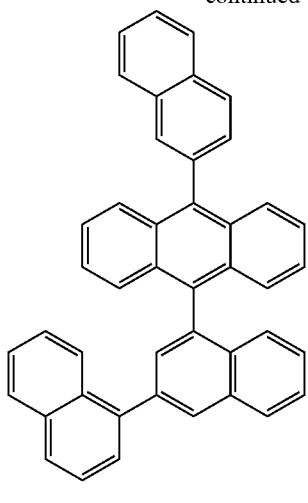
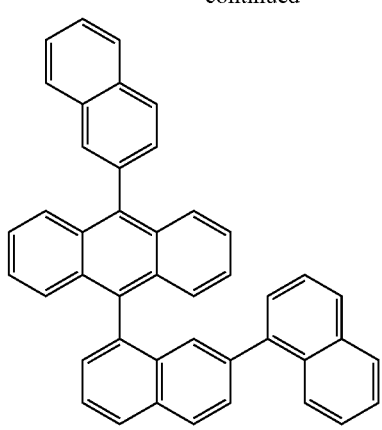
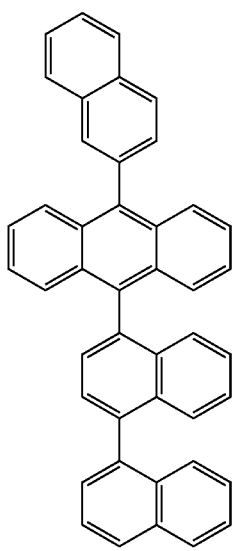
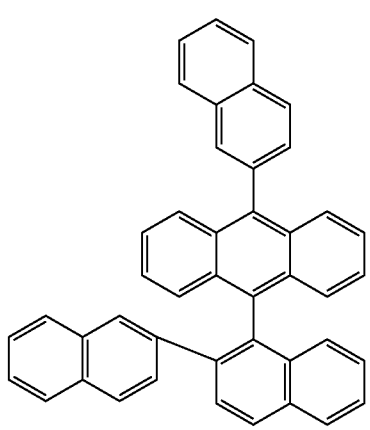
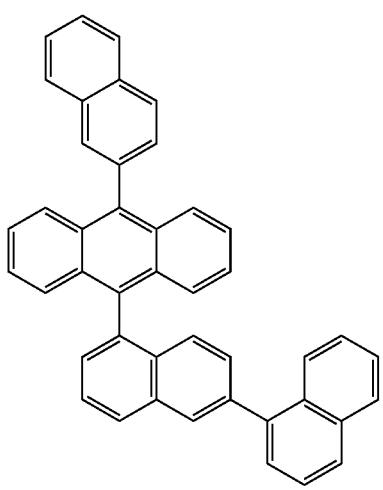
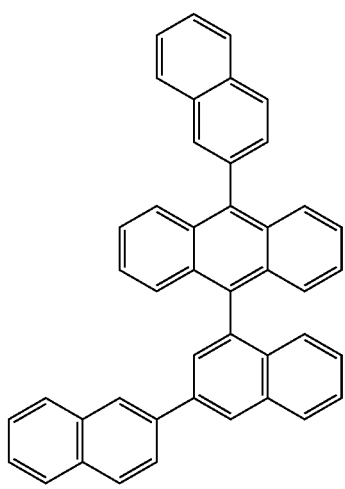

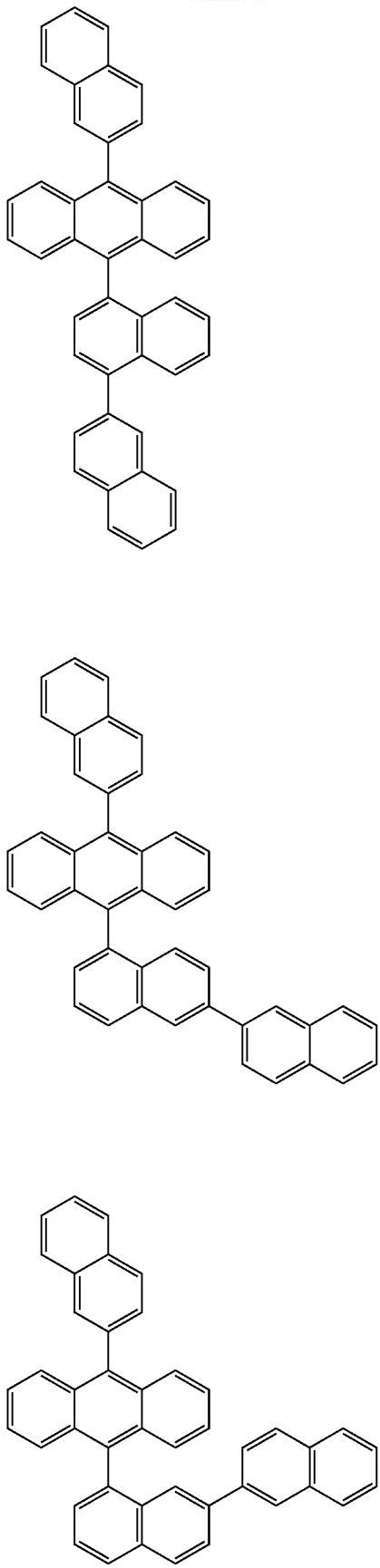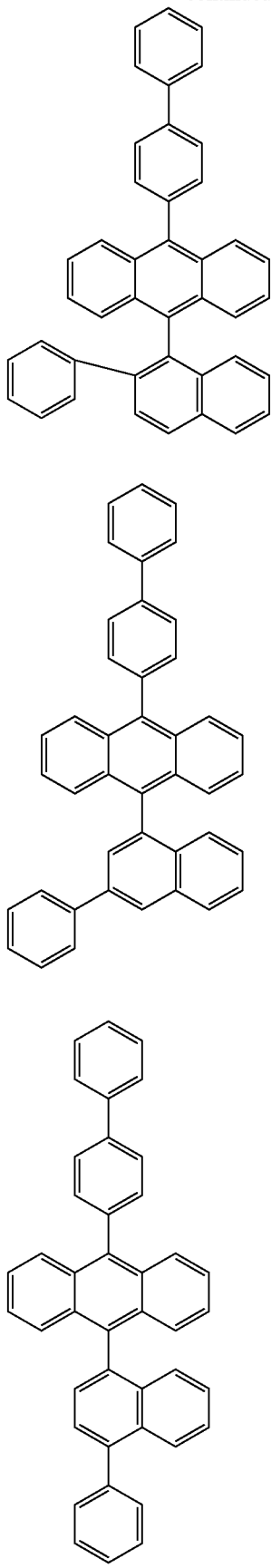

49
-continued
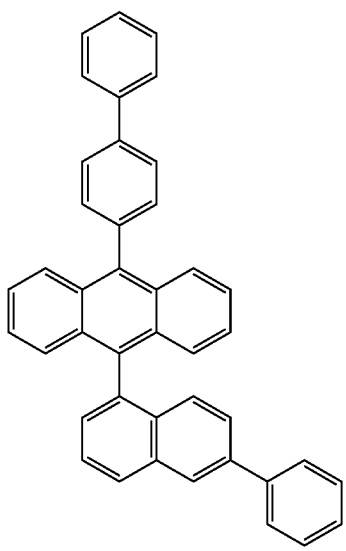
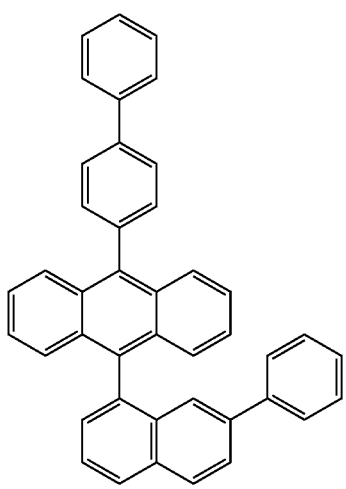
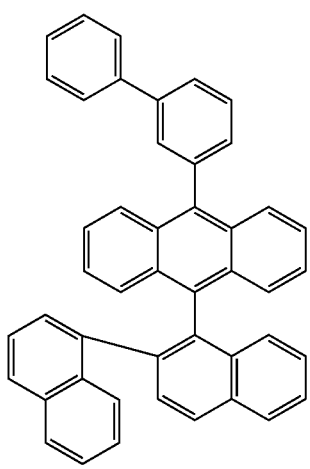
50
-continued
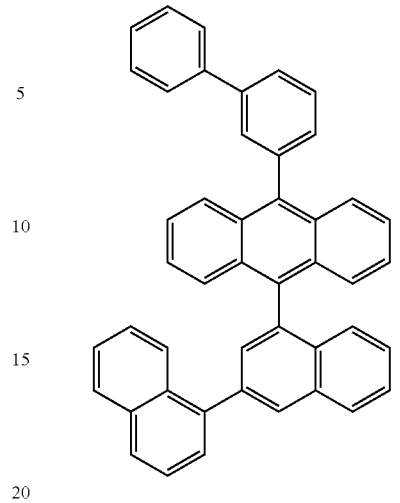
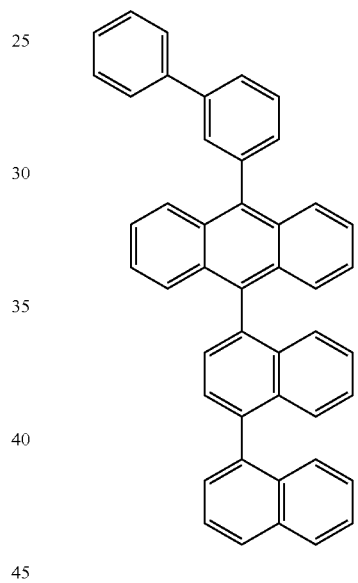
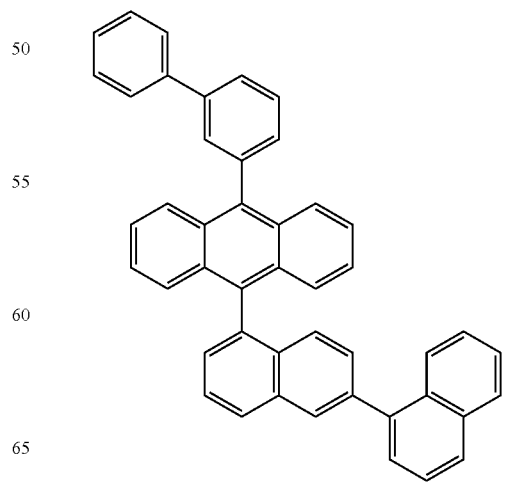

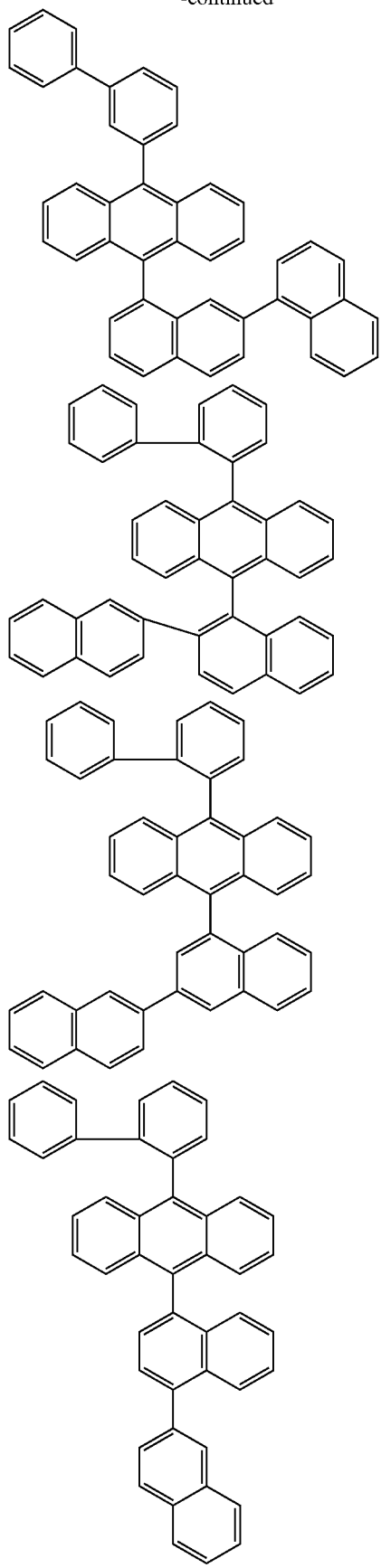
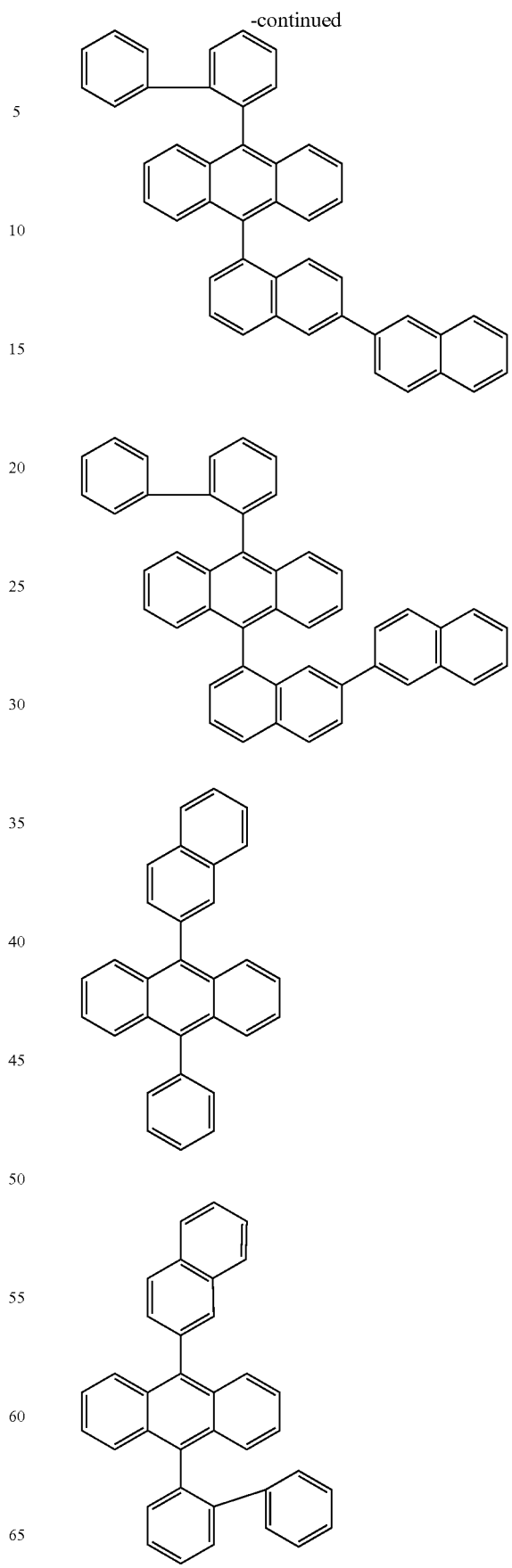

53
-continued
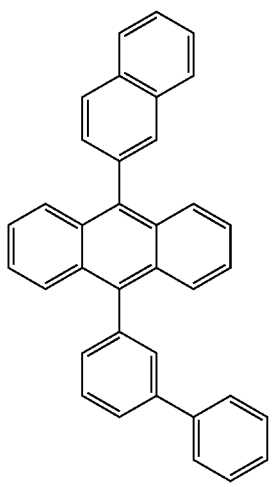
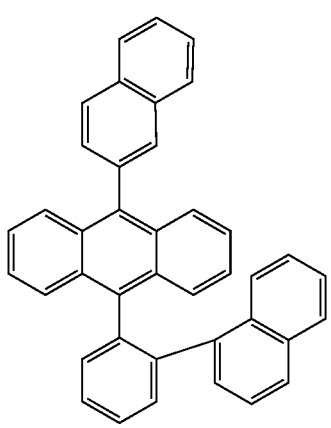
54
-continued
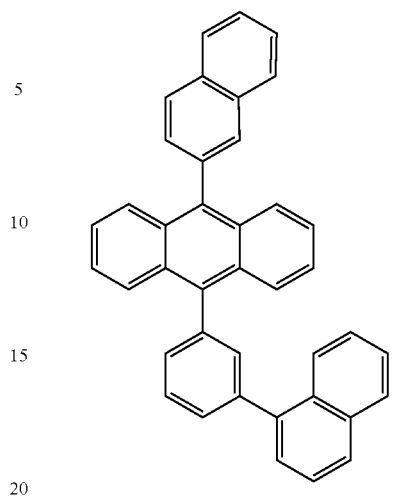
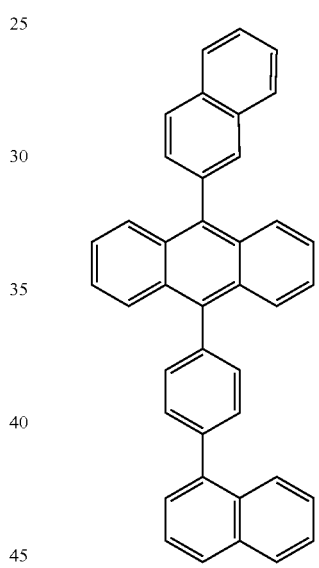
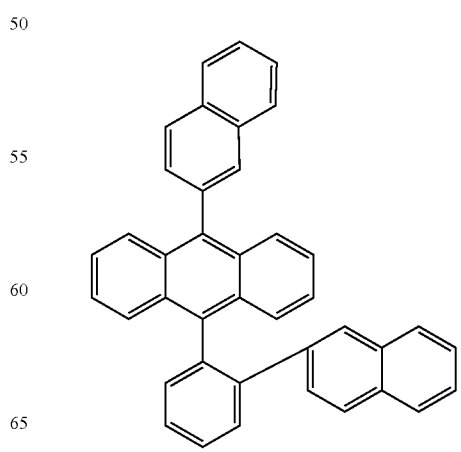

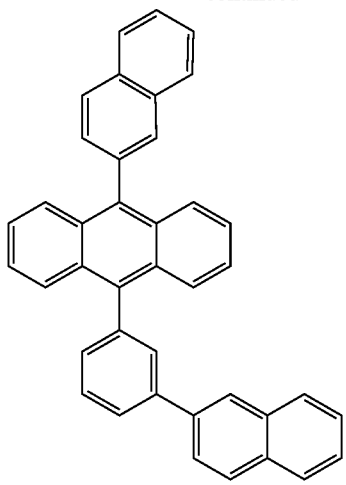
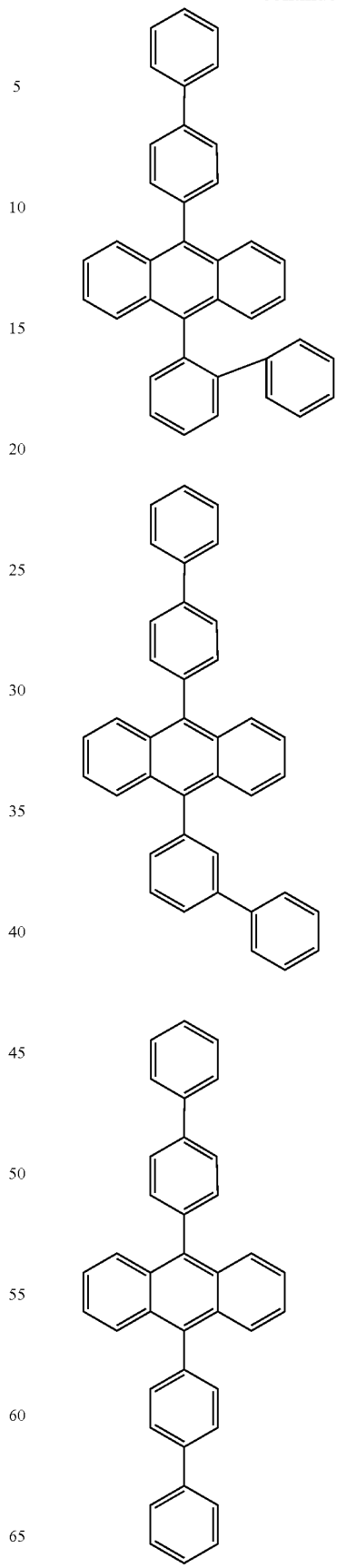

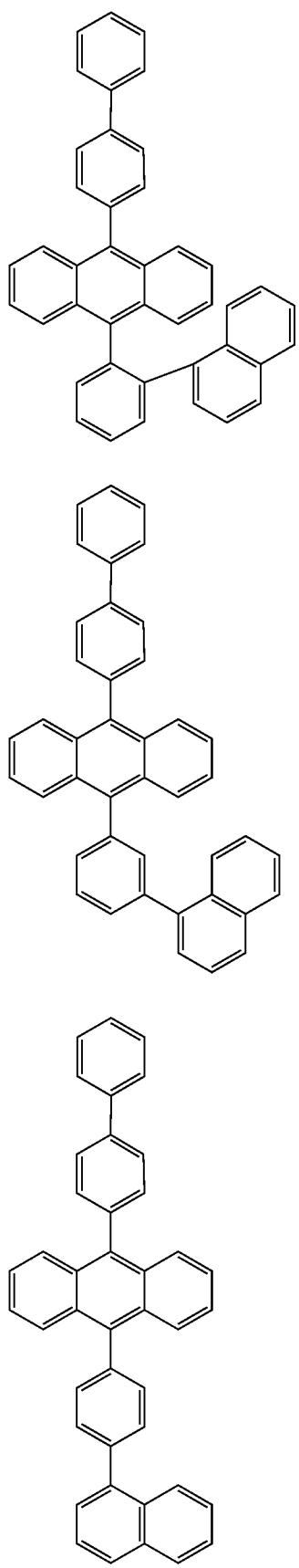
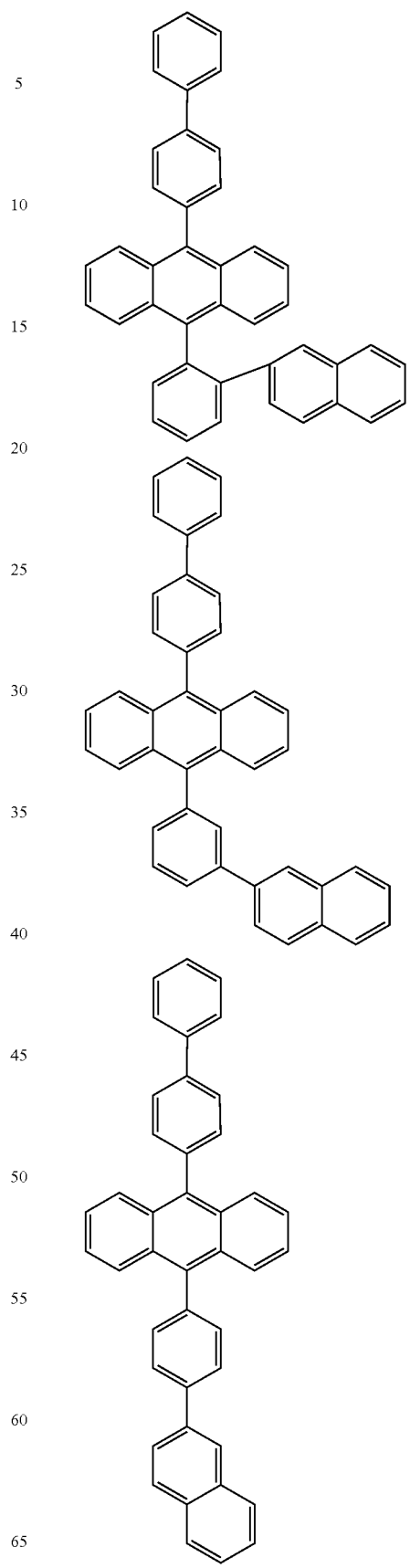

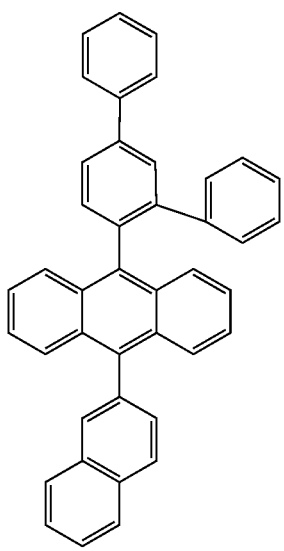
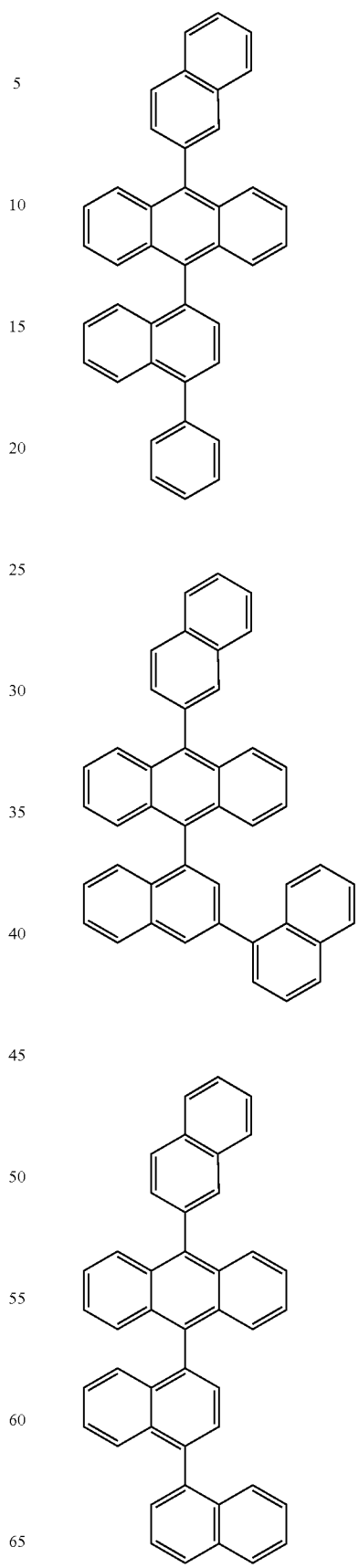

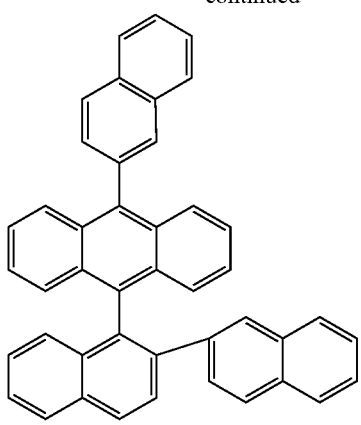
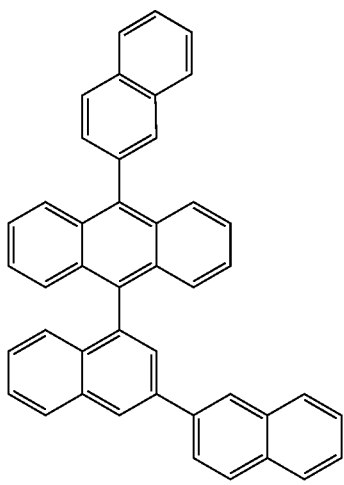
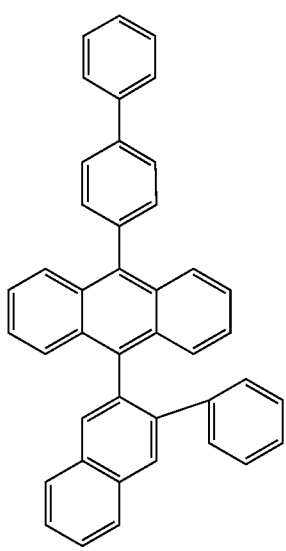
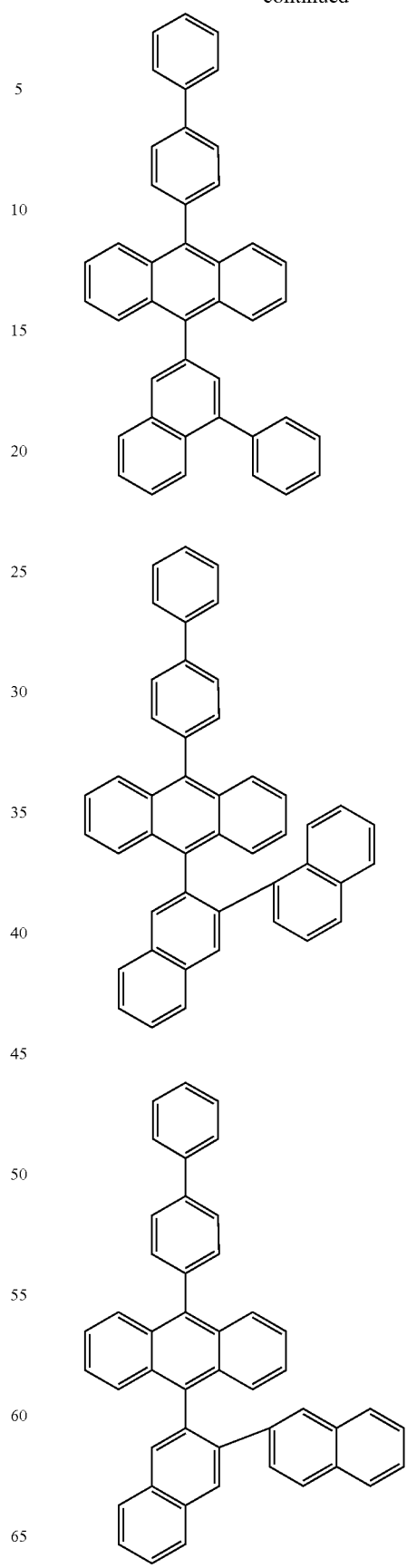

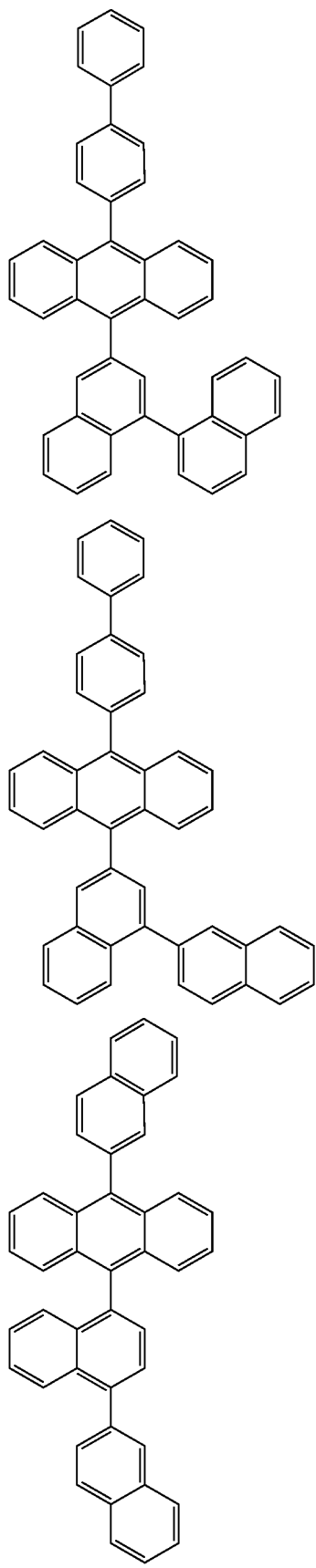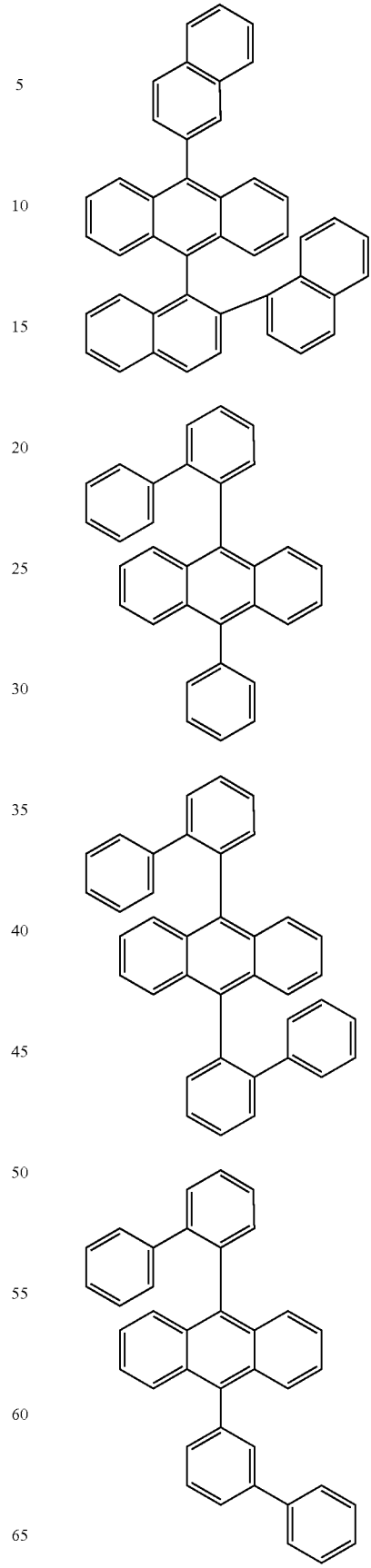

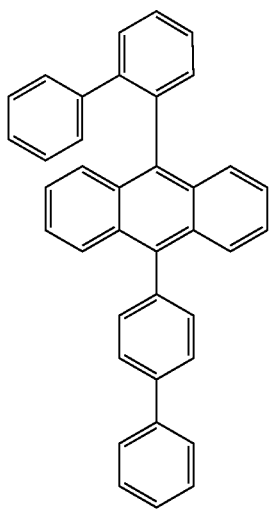
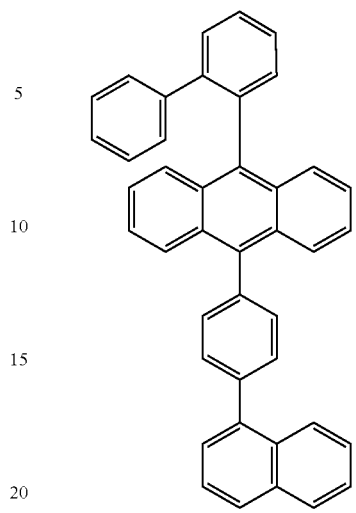
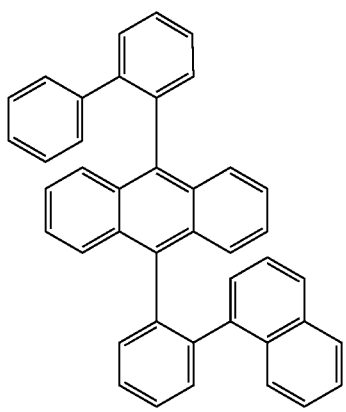
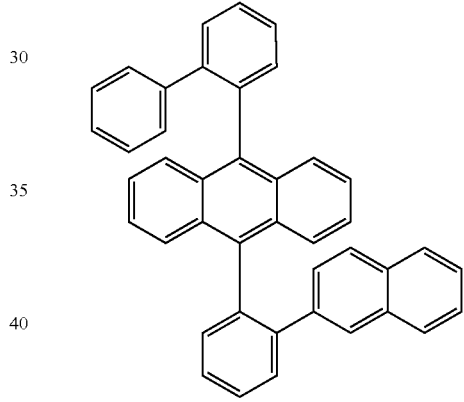
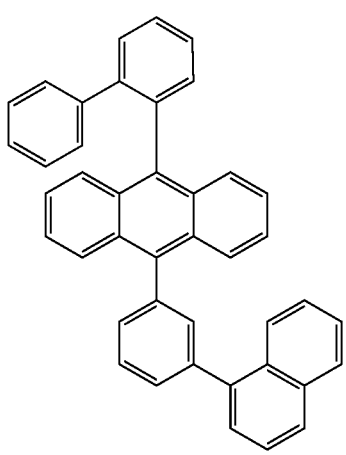
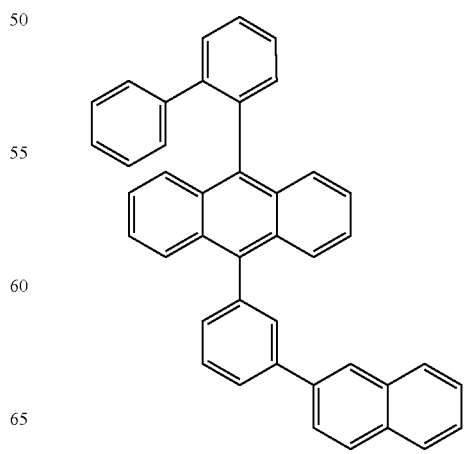

67
-continued
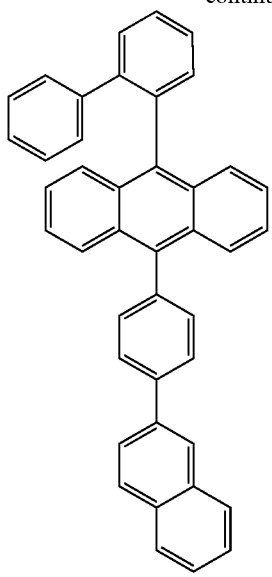
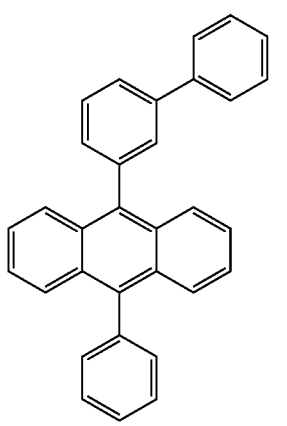
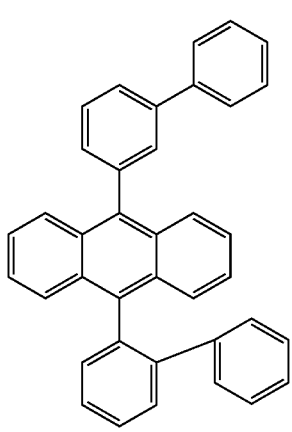
68
-continued
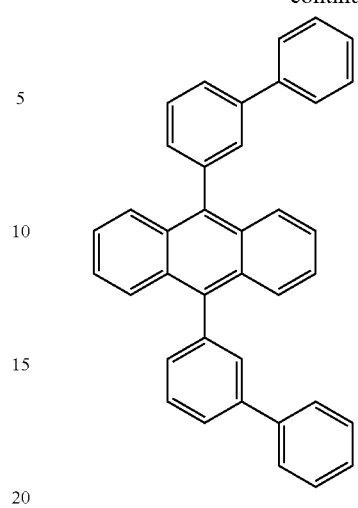
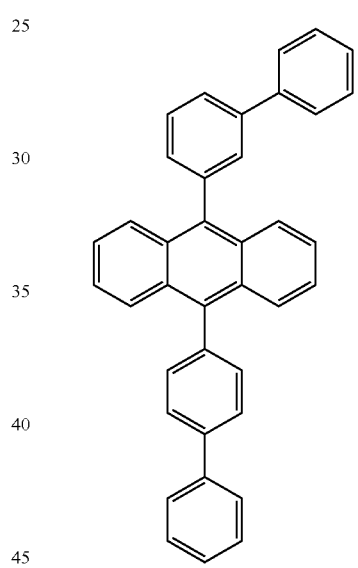
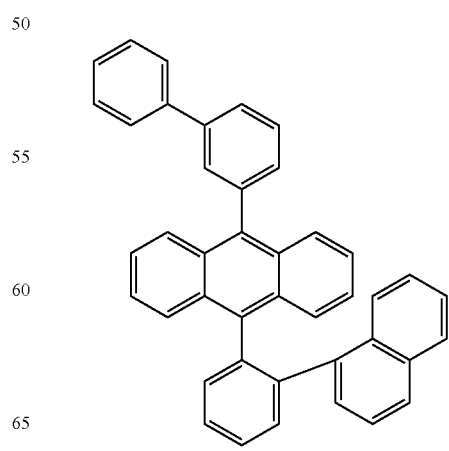

69
-continued
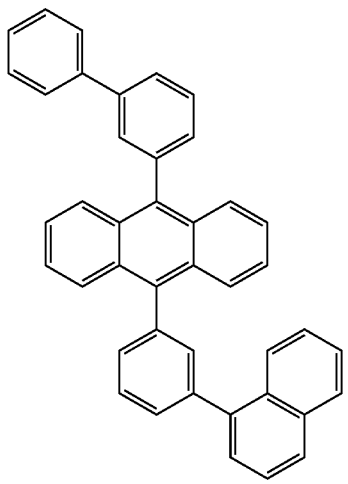
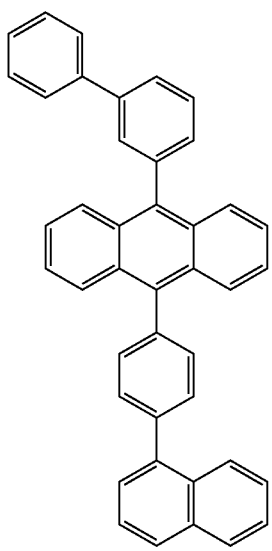
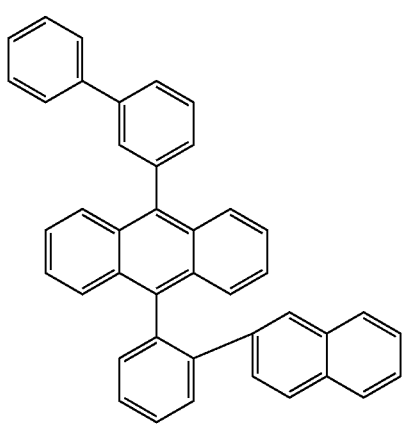
70
-continued
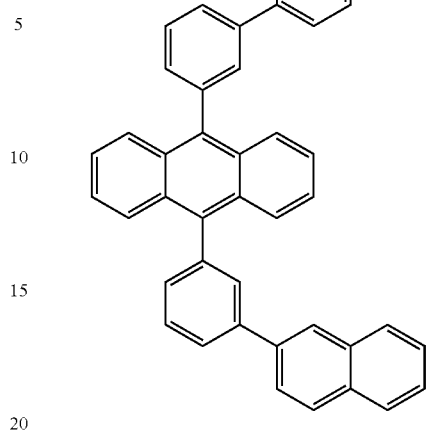
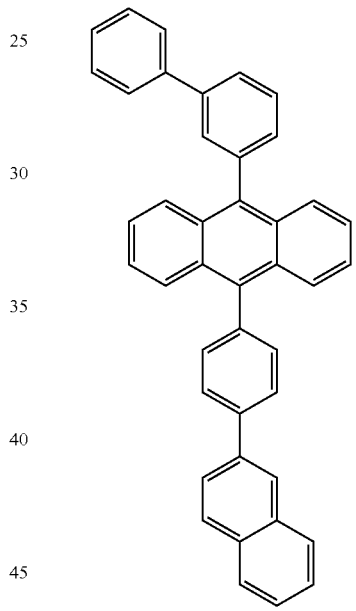
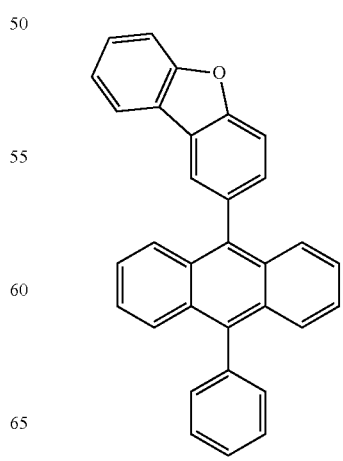

71
-continued
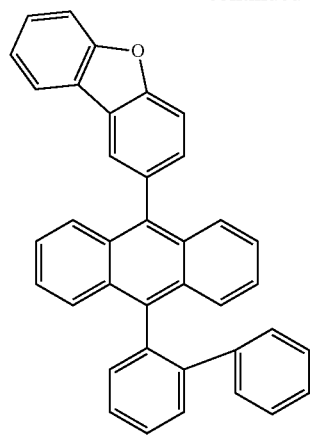
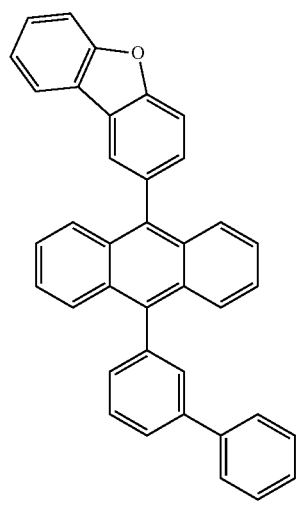
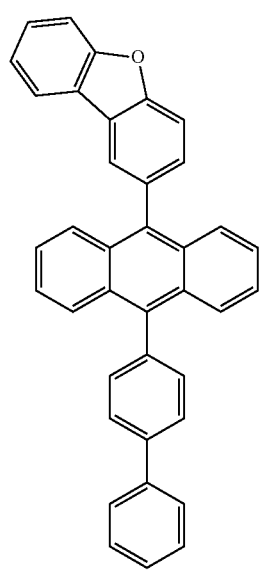
72
-continued
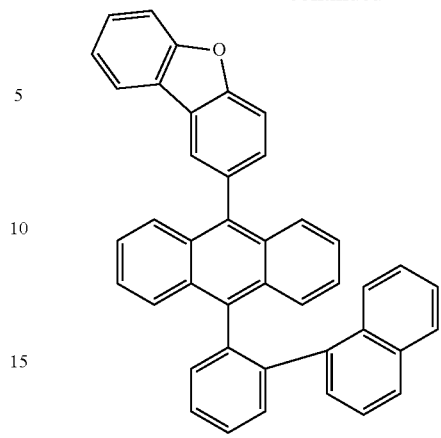
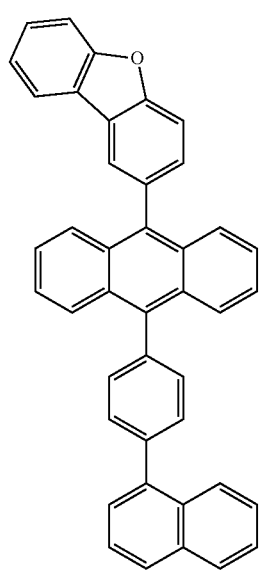

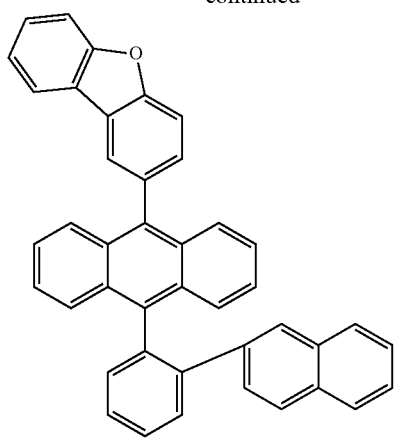
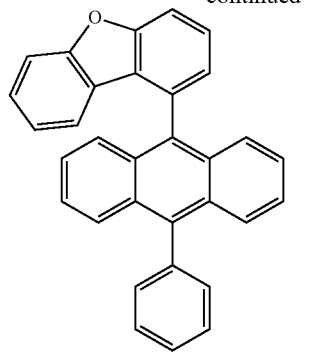
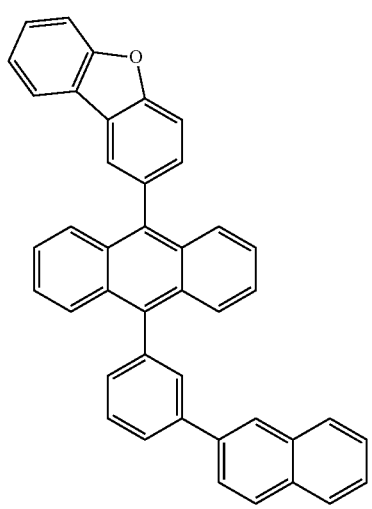
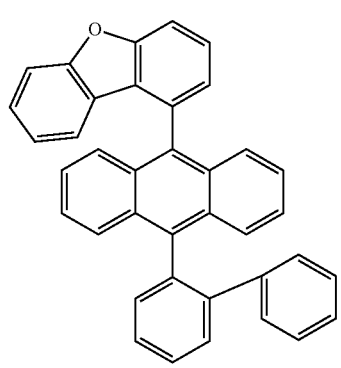
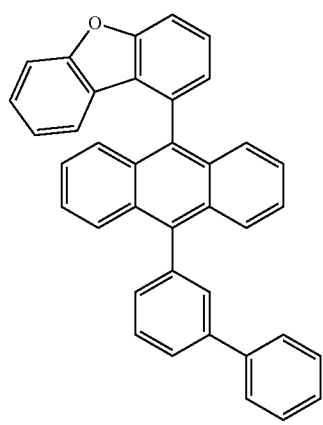
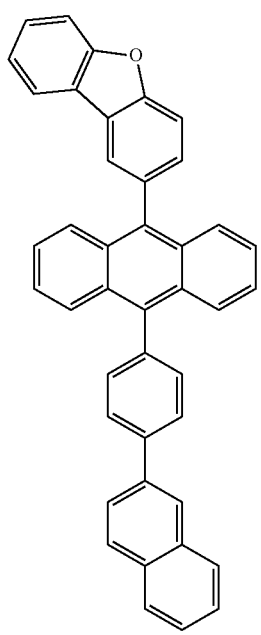
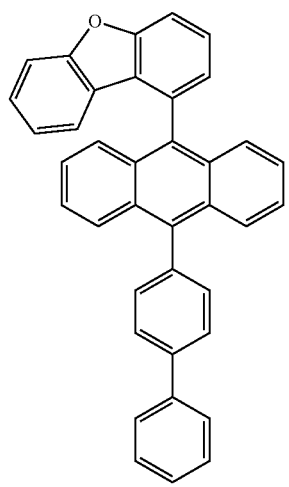

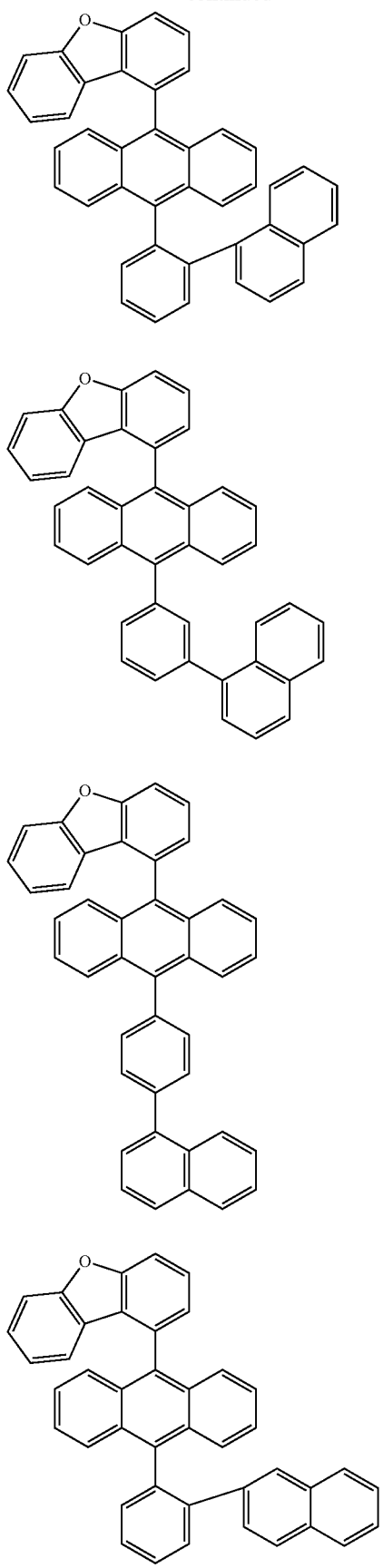
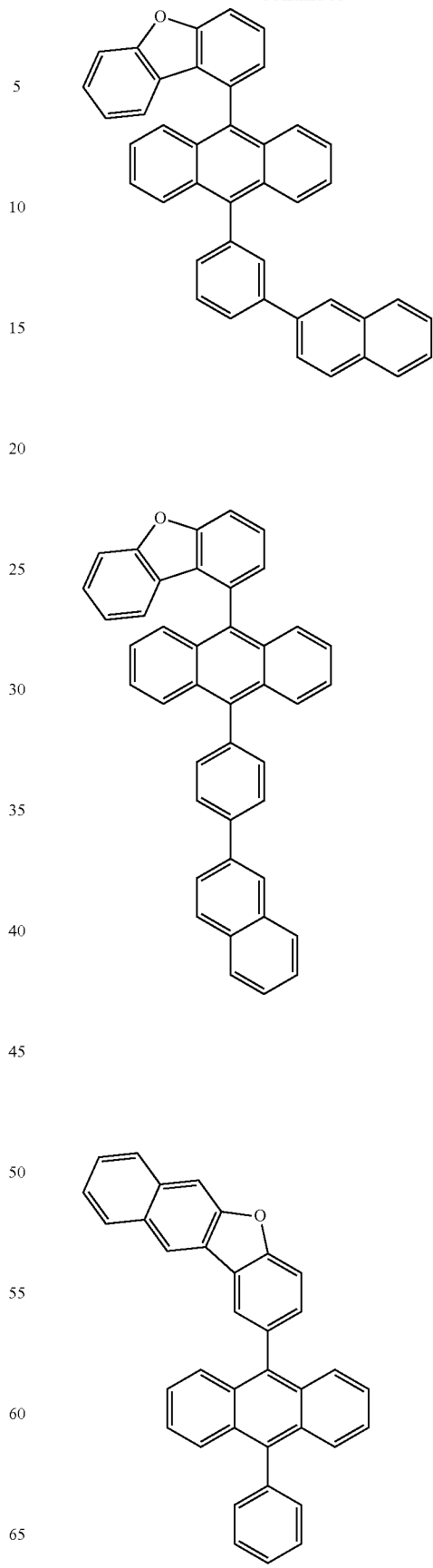

77
-continued
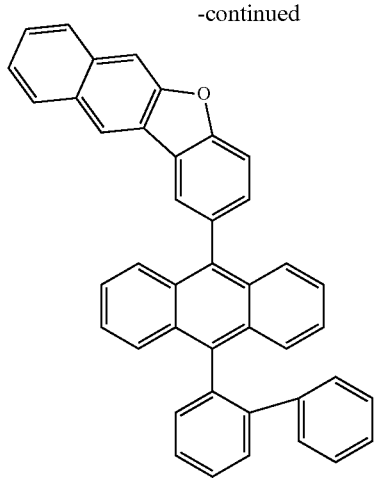
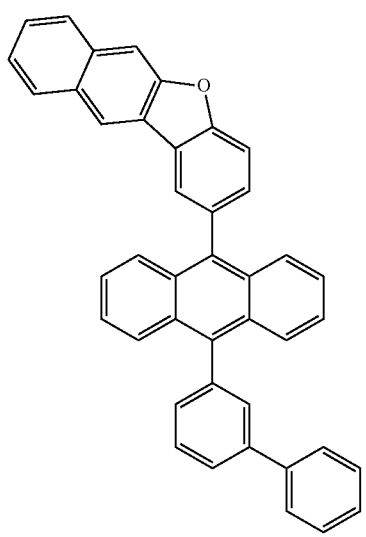
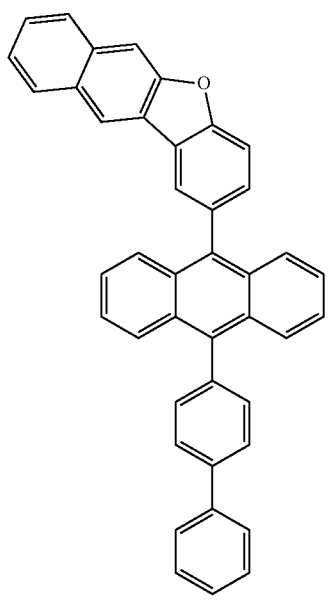
78
-continued
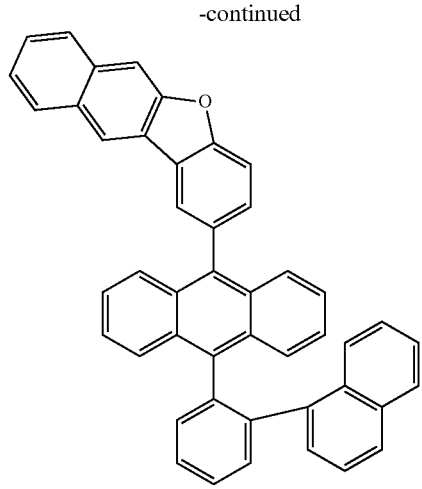
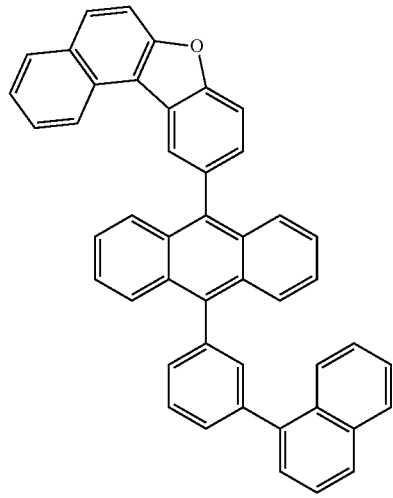
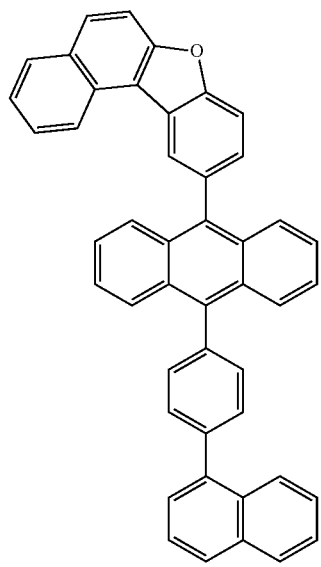

79
-continued
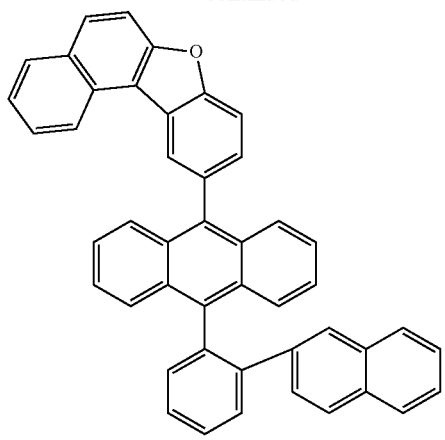
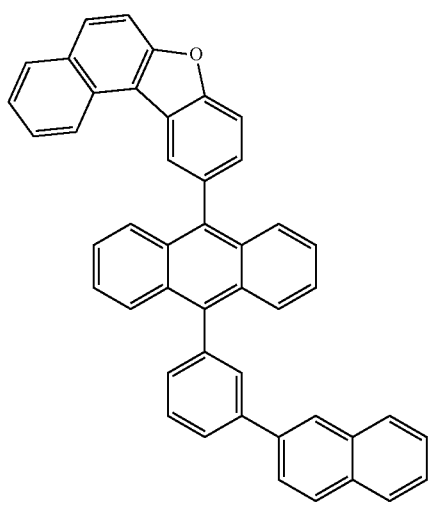
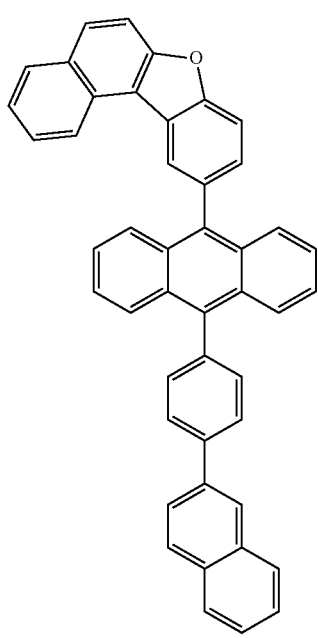
80
-continued
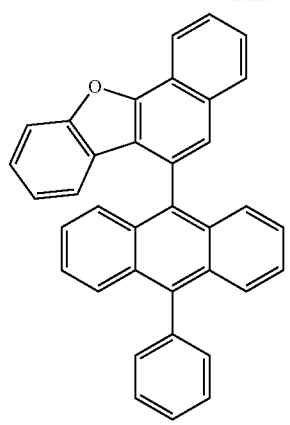
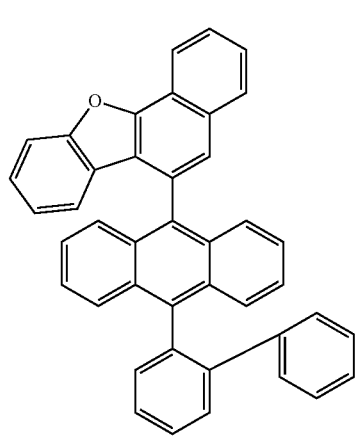
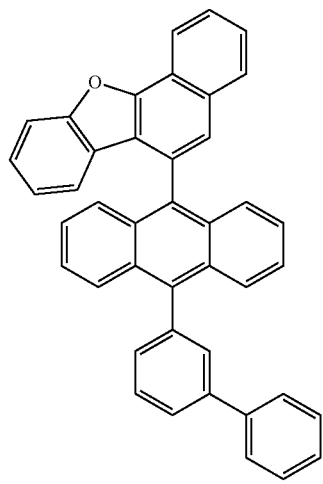

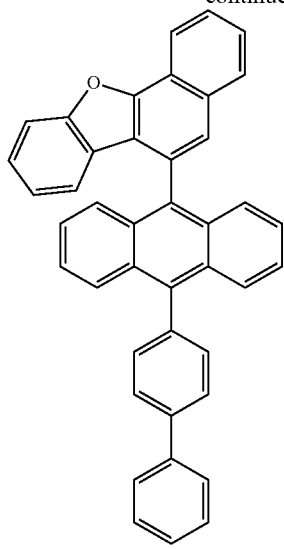
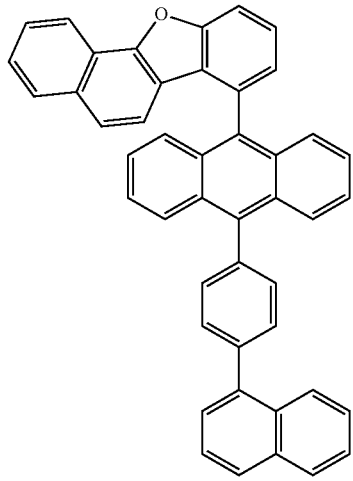
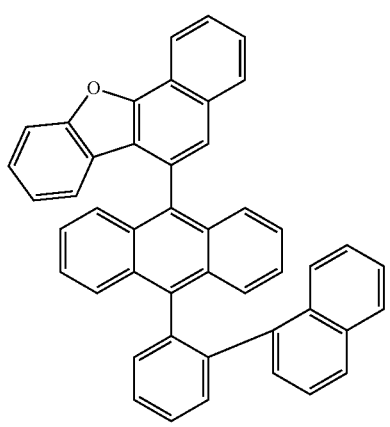
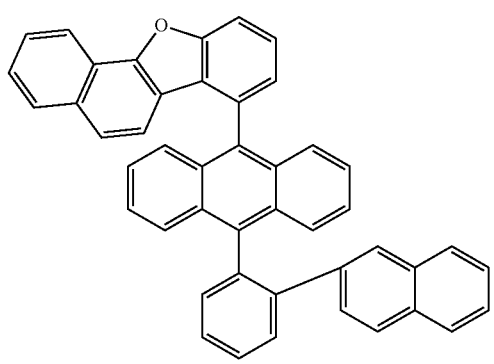
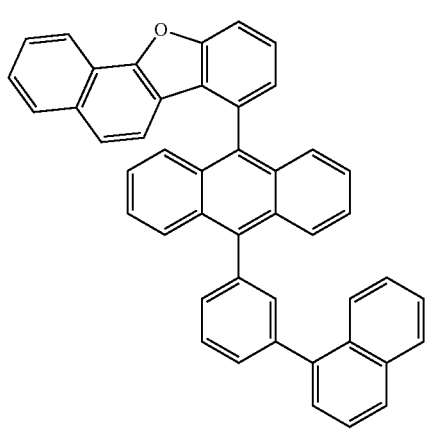
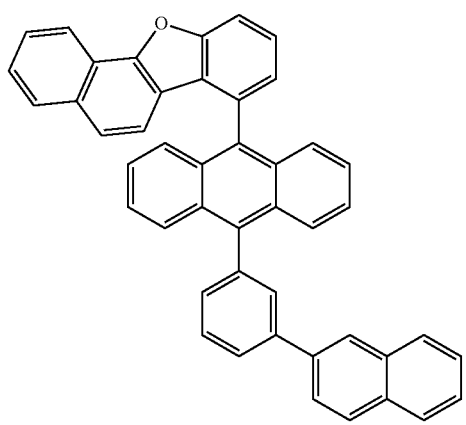

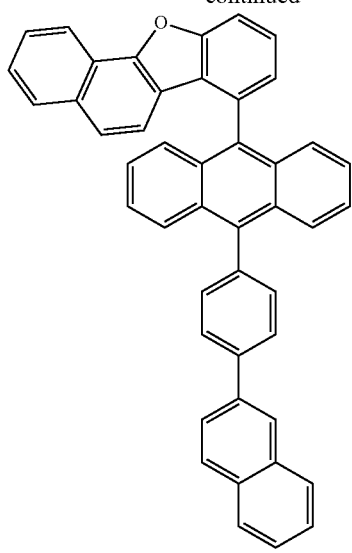
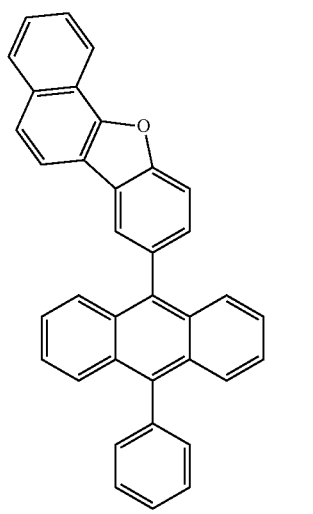
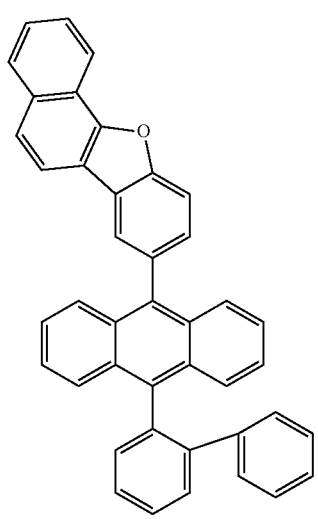
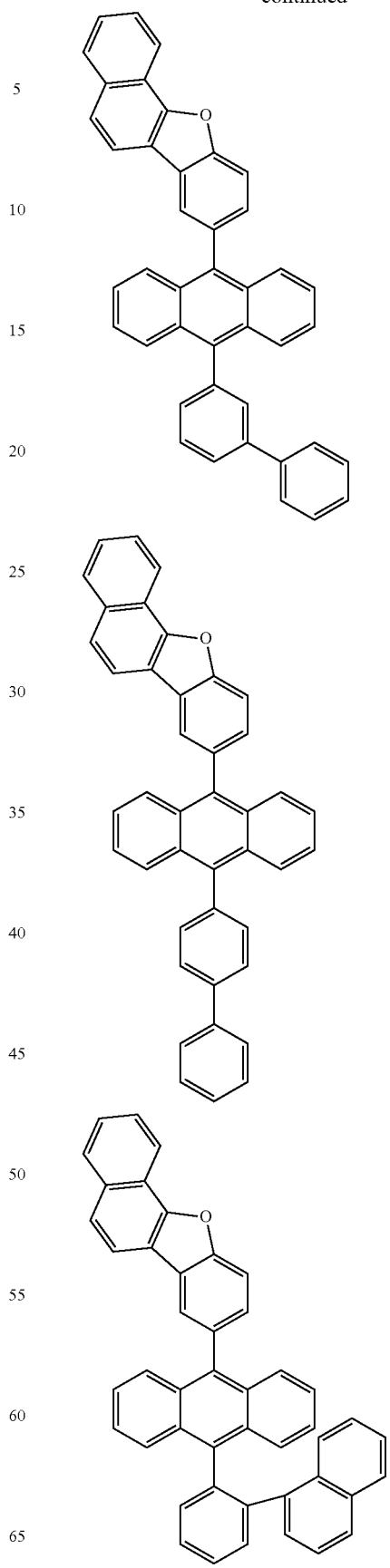

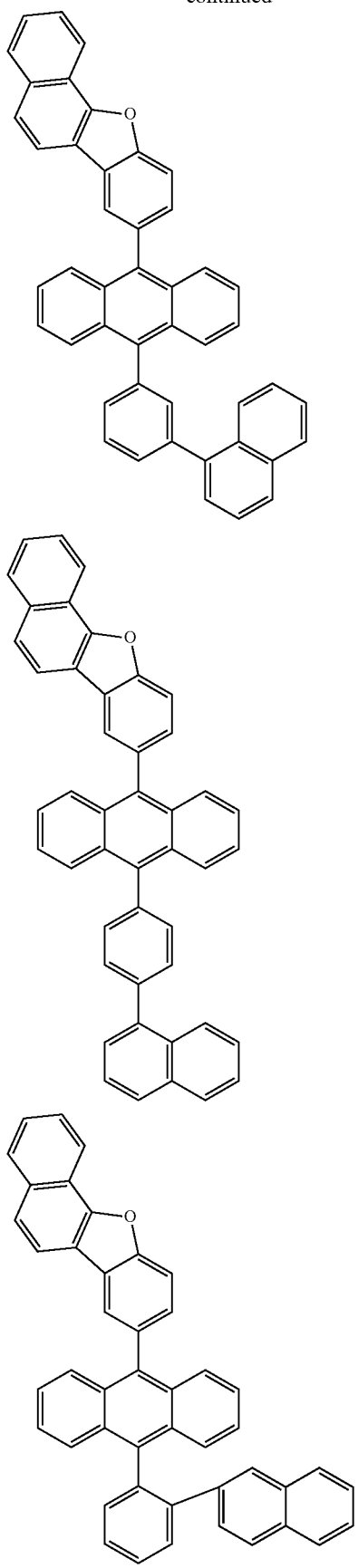
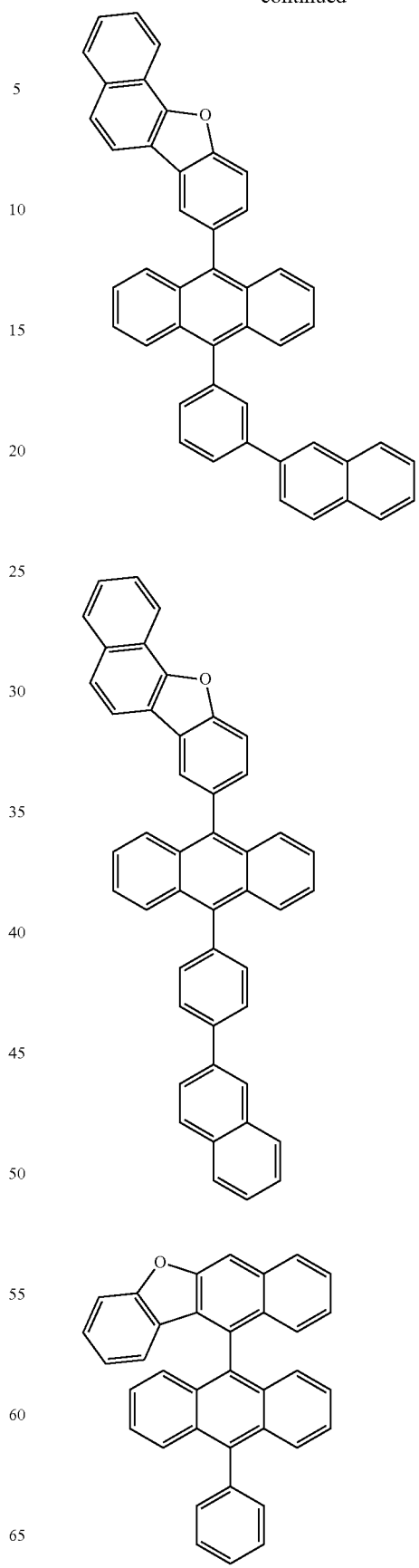

87
-continued
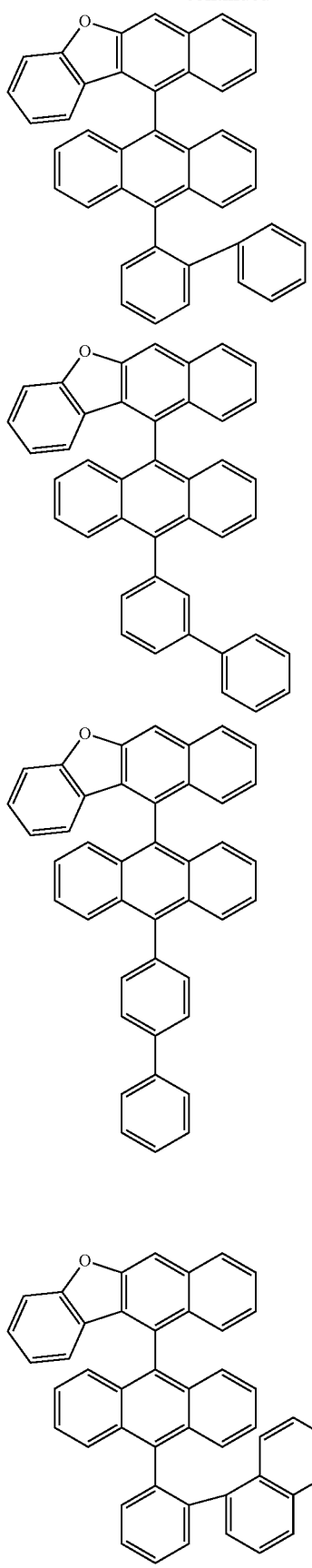
88
-continued
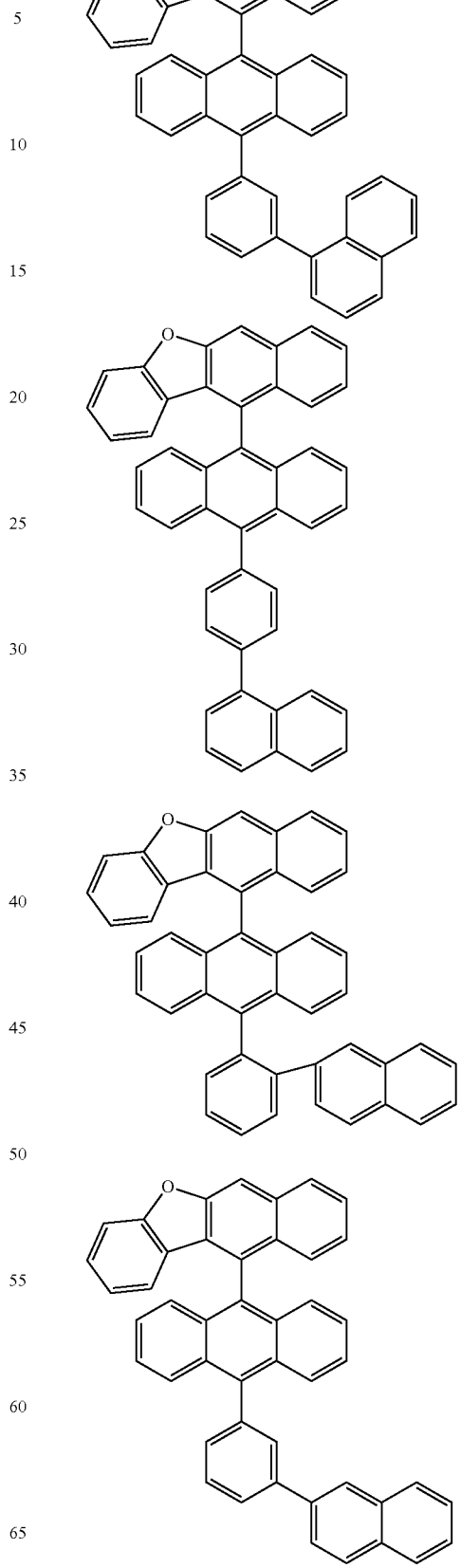

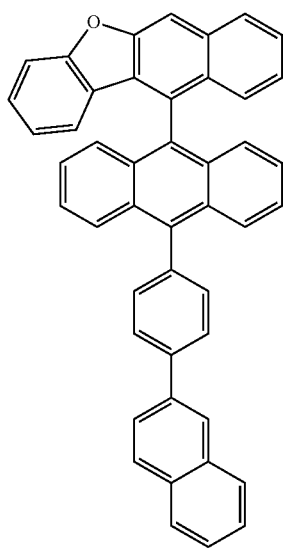
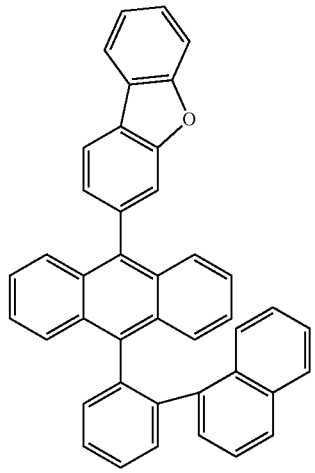
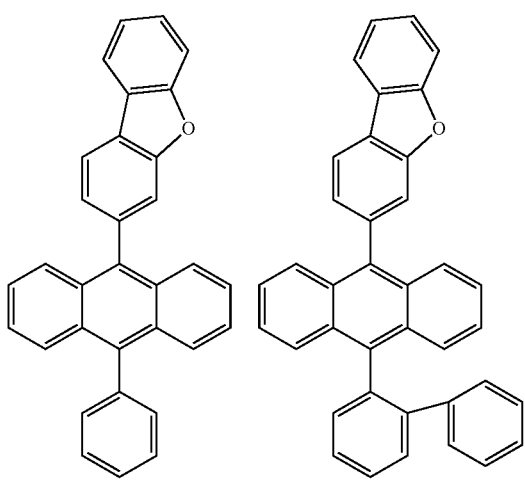
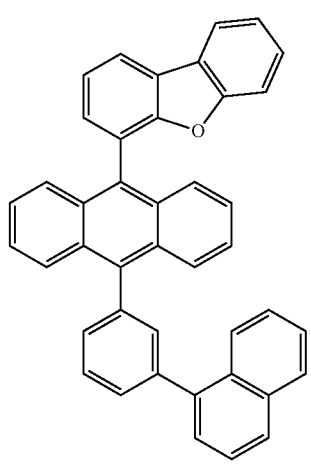
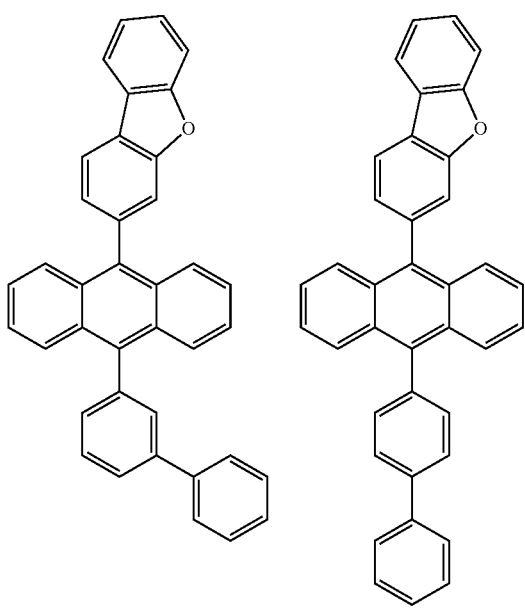
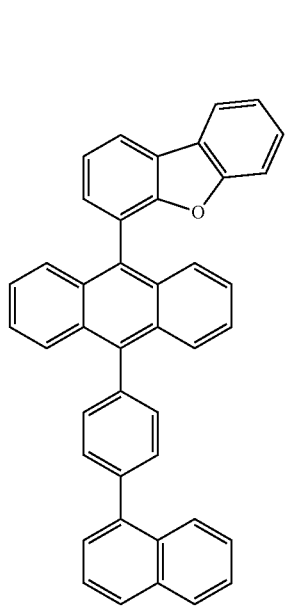

-continued
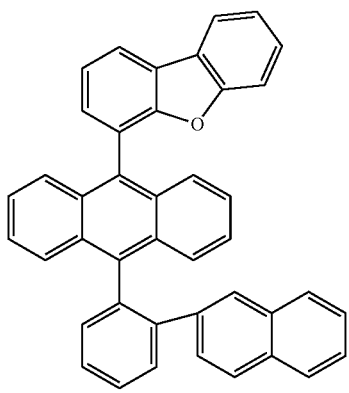
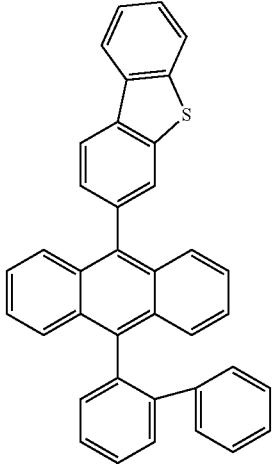
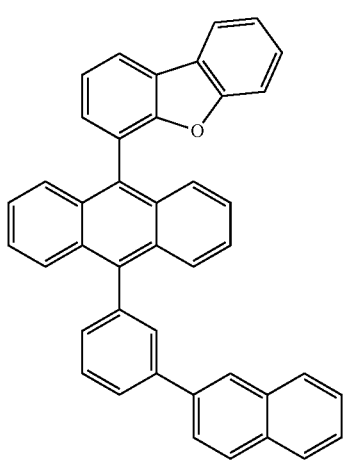
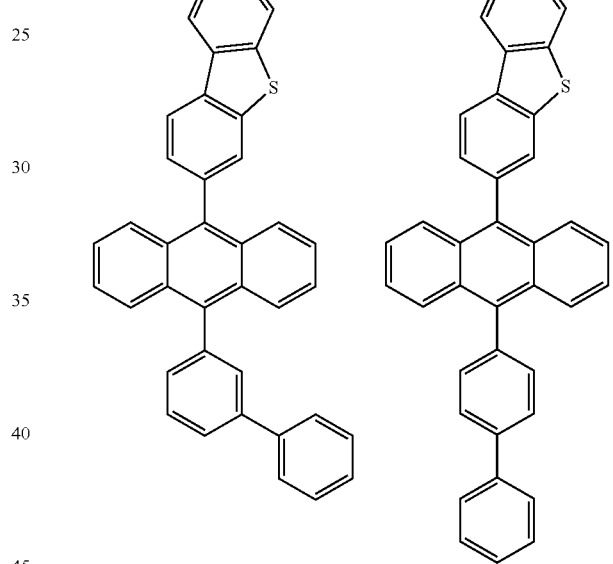
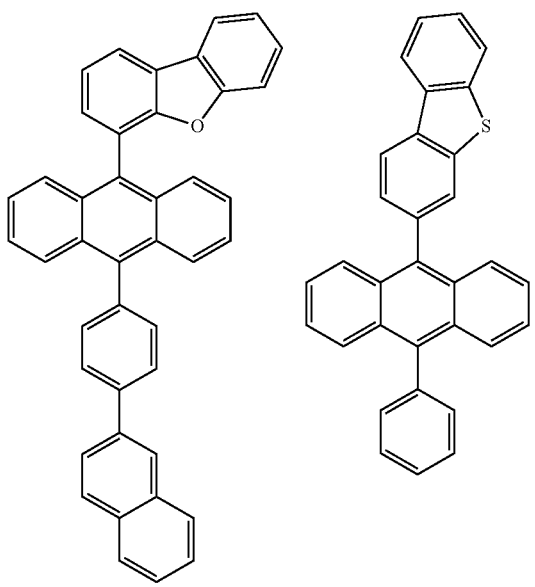
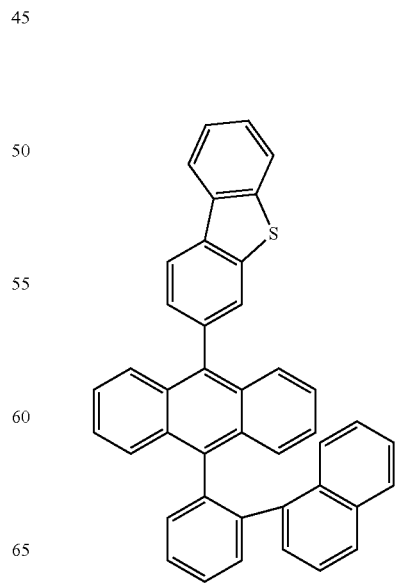

-continued
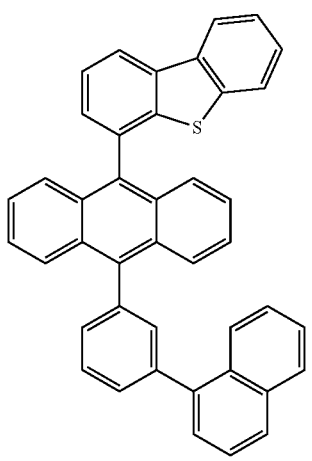
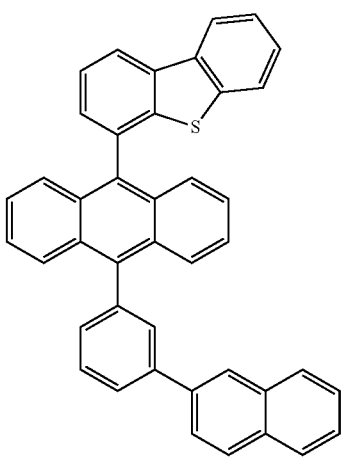
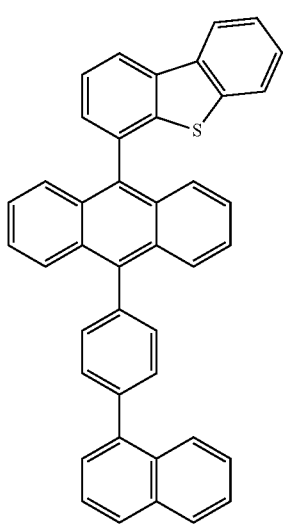
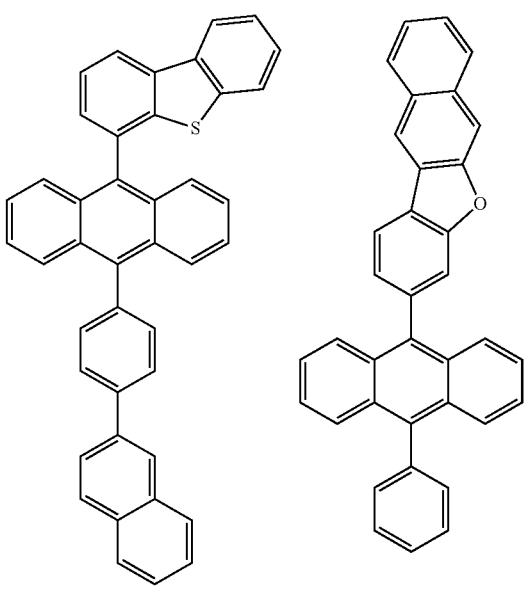
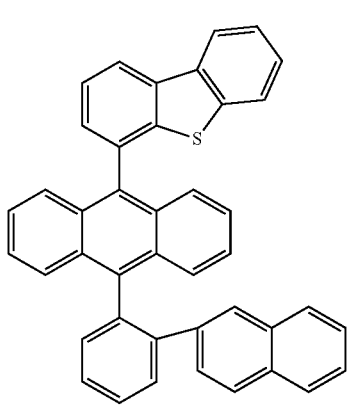
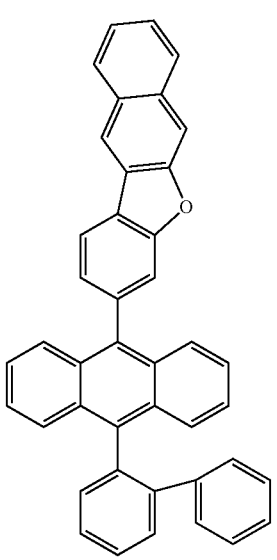

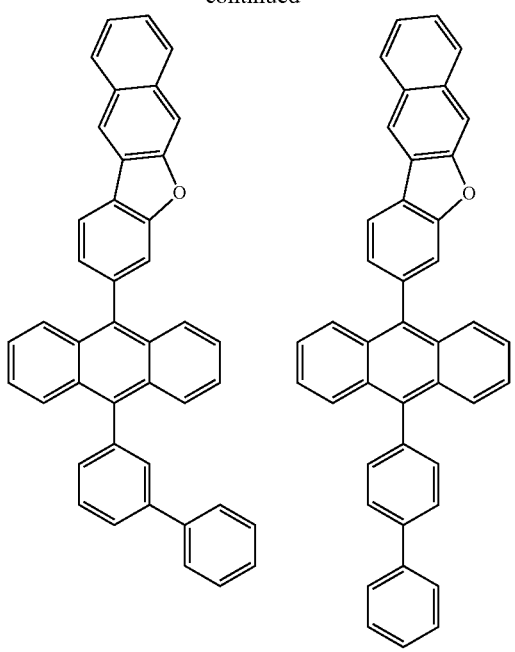
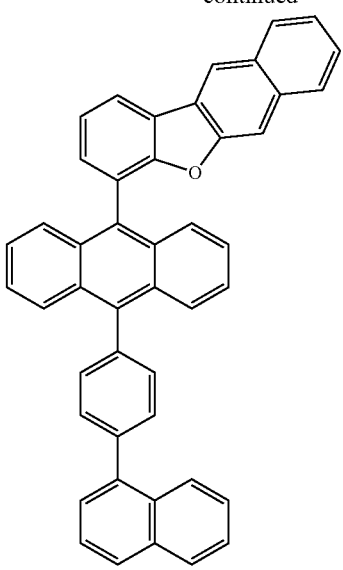
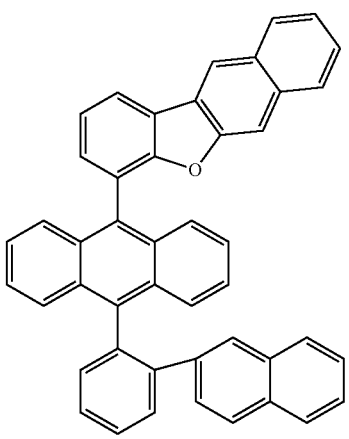
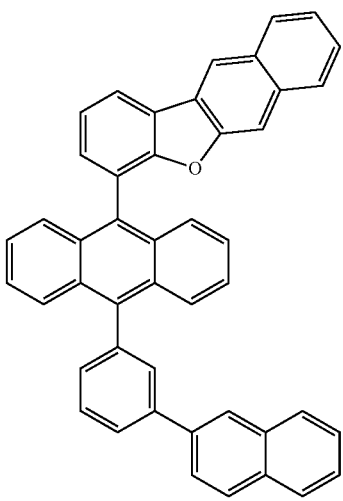

97
-continued
98
-continued
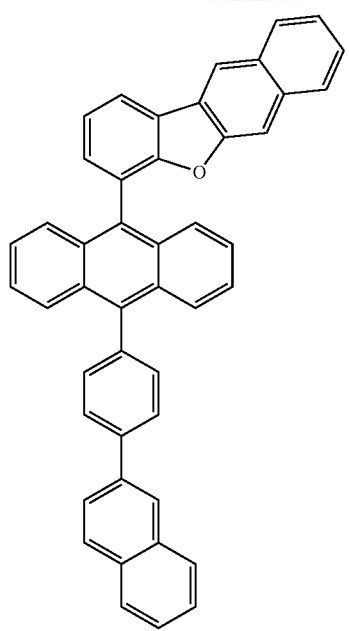
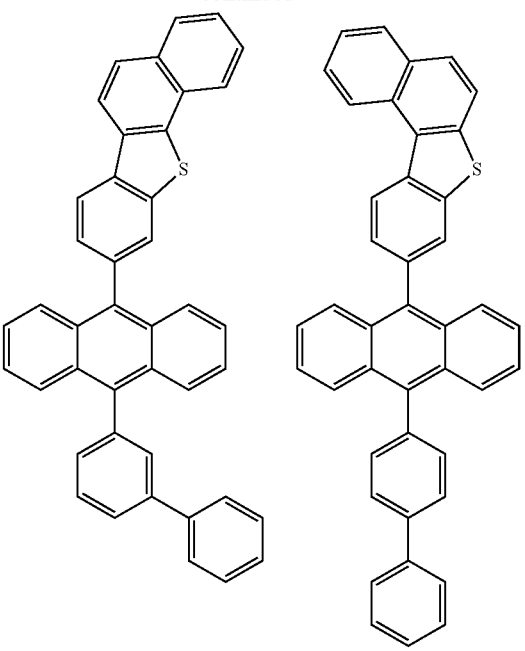
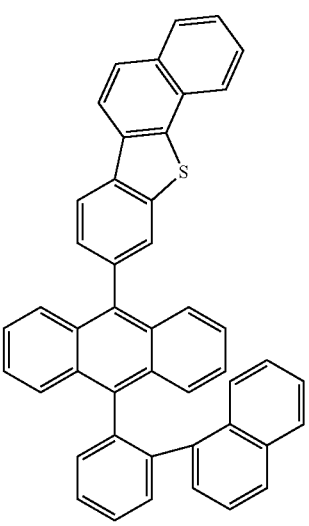
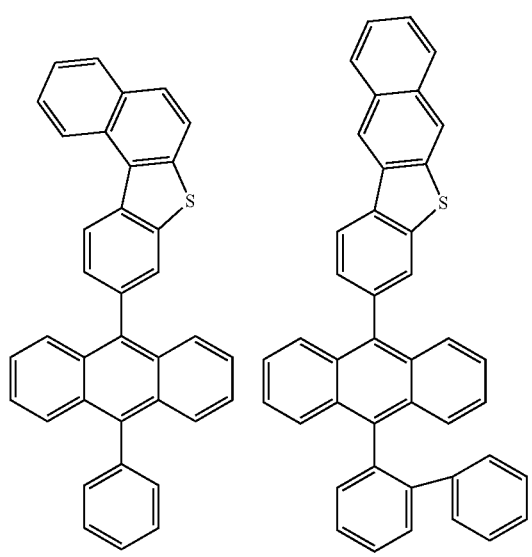

99
-continued
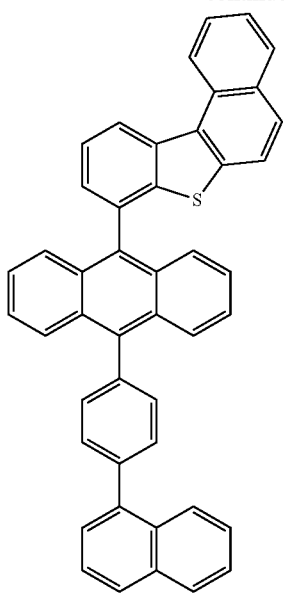
100
-continued
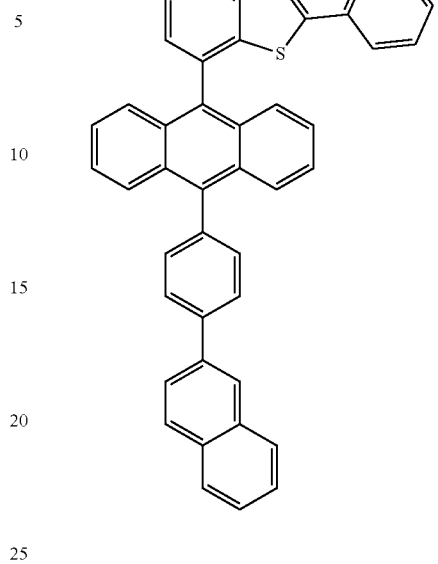
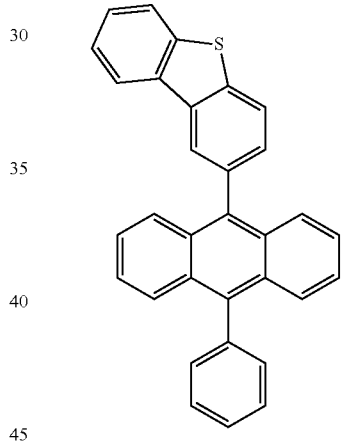
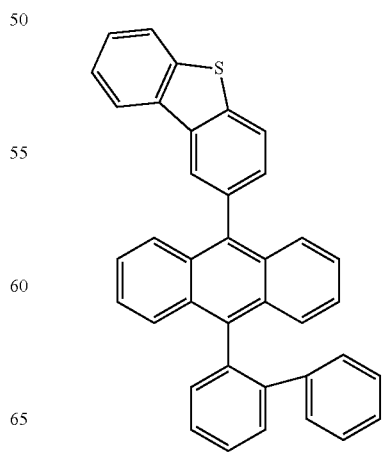

101
-continued
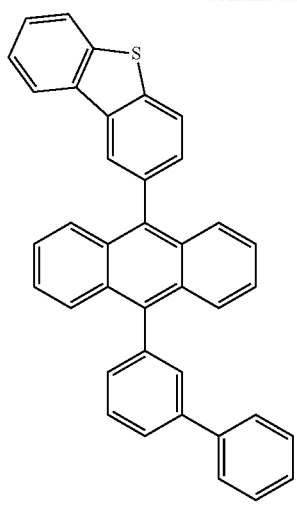
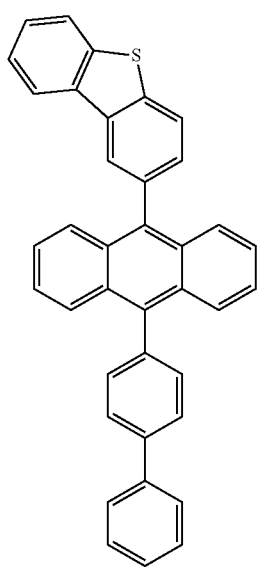
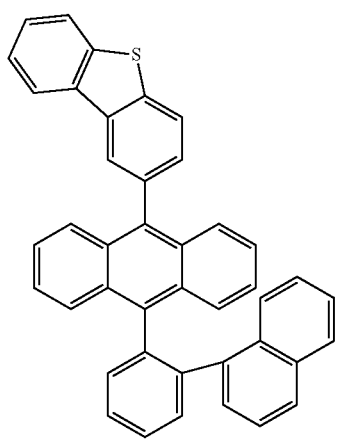
102
-continued
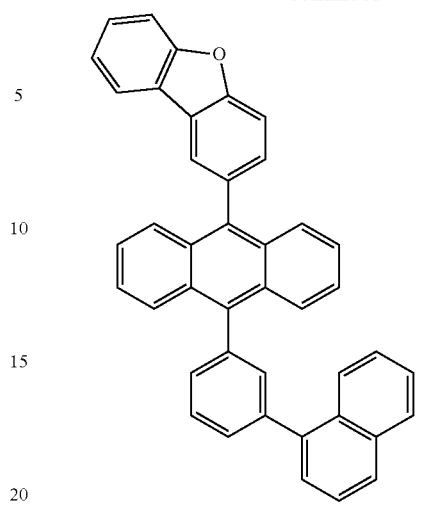
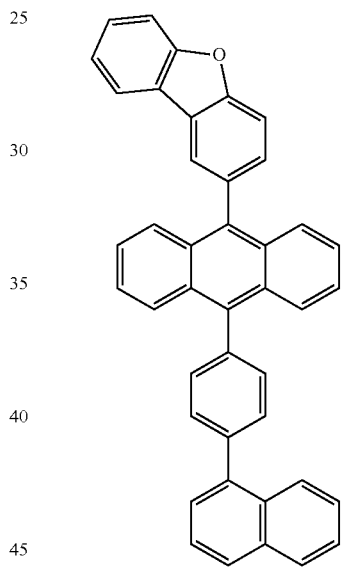
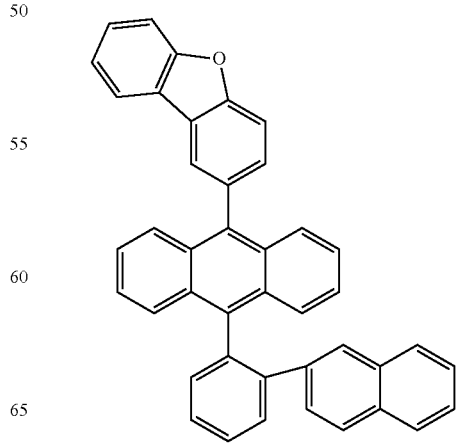

103
-continued
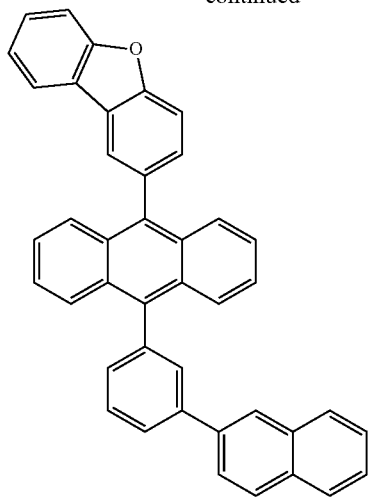
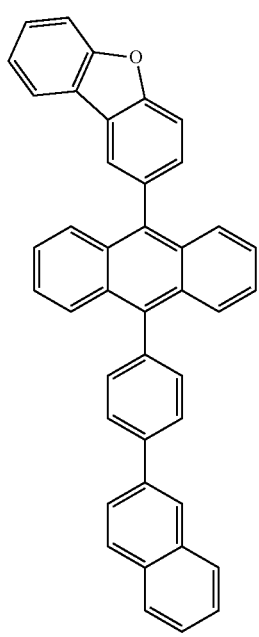
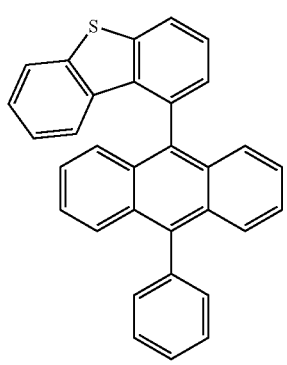
104
-continued
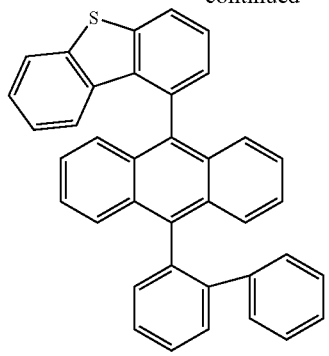
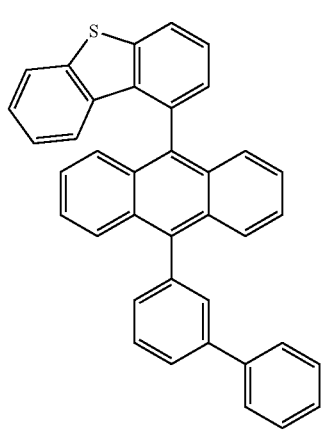
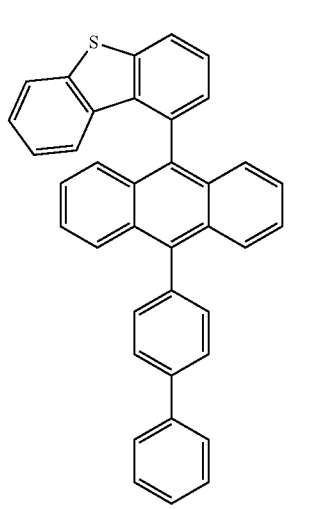
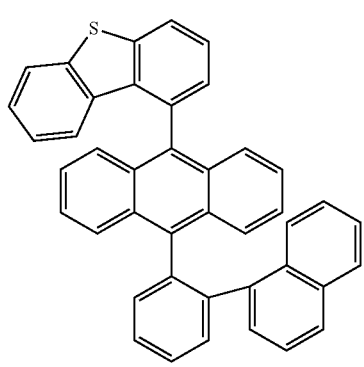

105
-continued
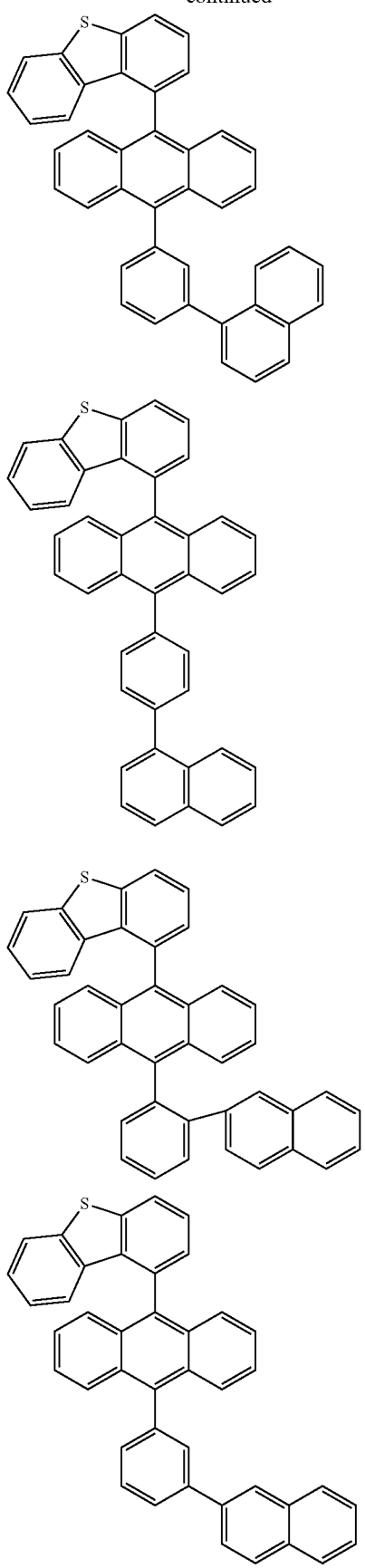
106
-continued
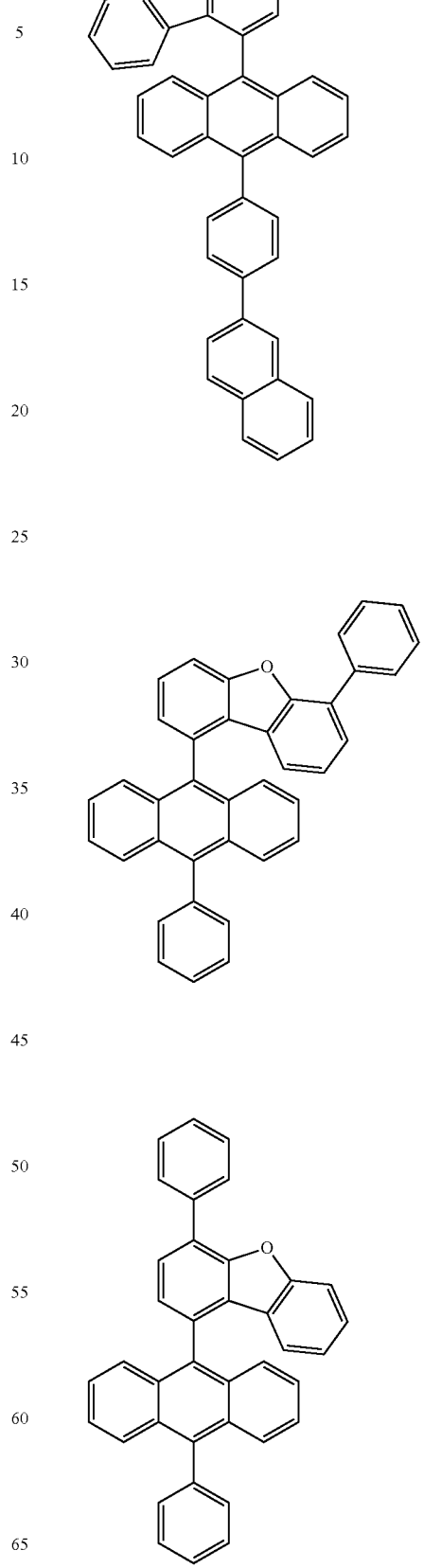

107
-continued
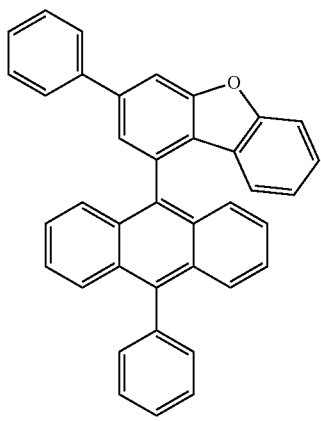
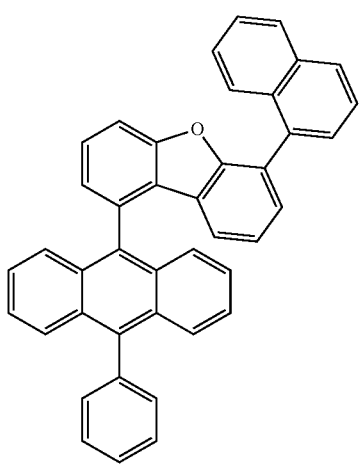
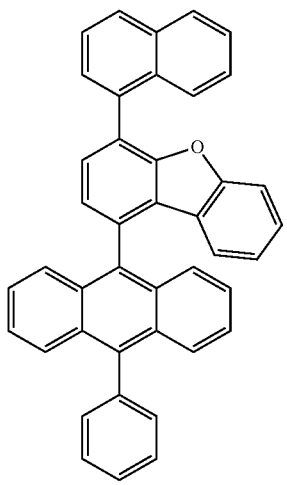
108
-continued
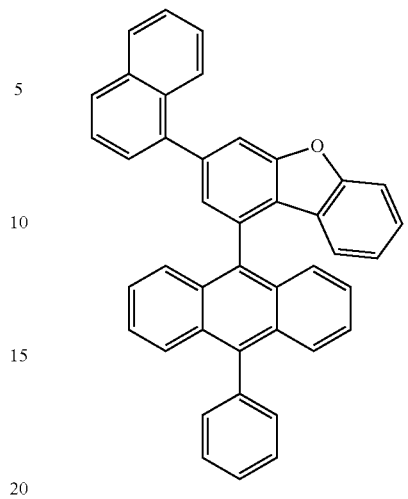
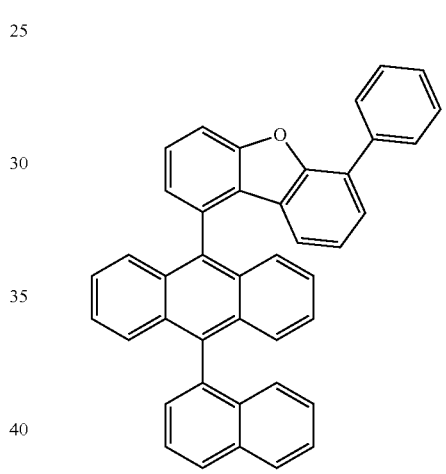
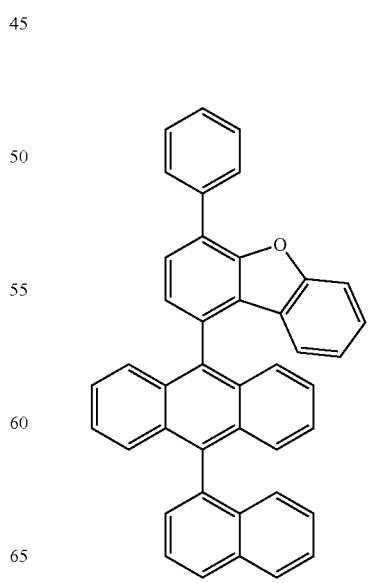

109
-continued
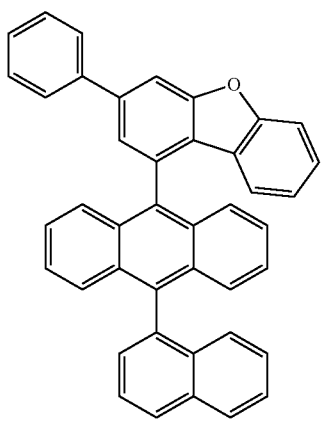
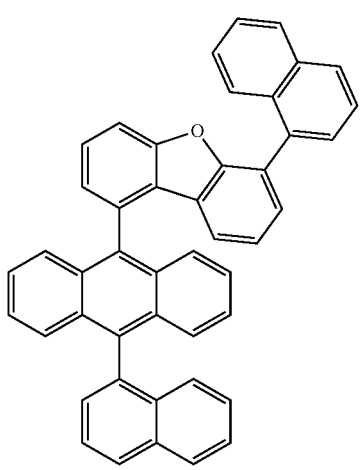
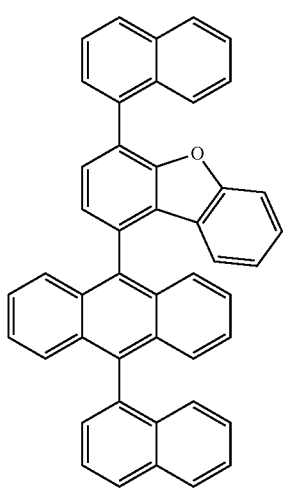
110
-continued
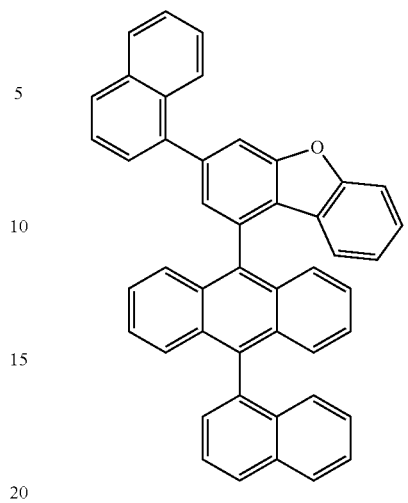
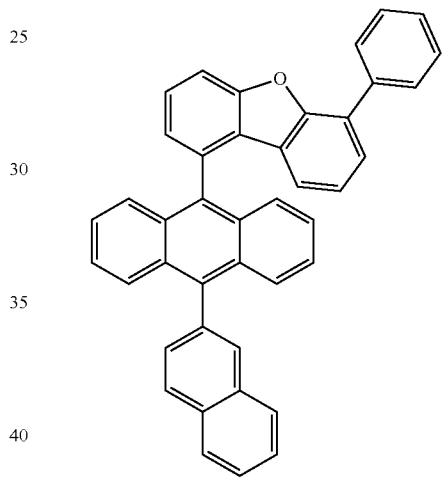
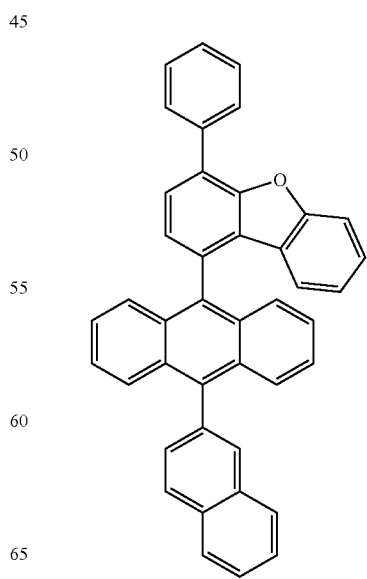

111
-continued
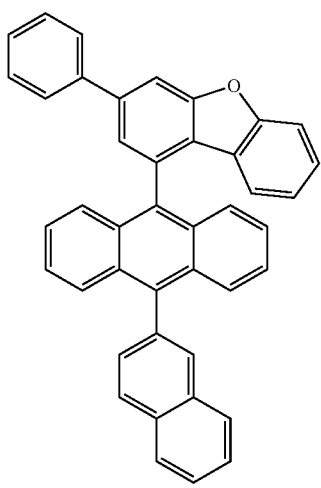
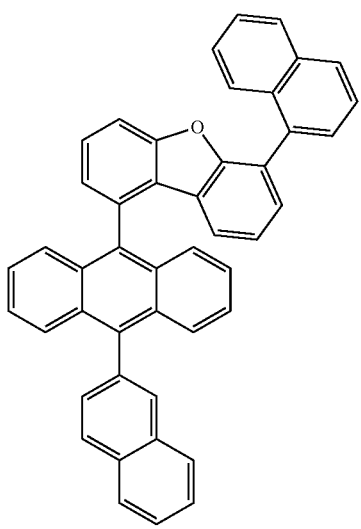
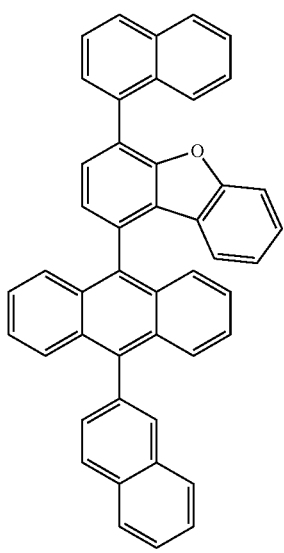
112
-continued
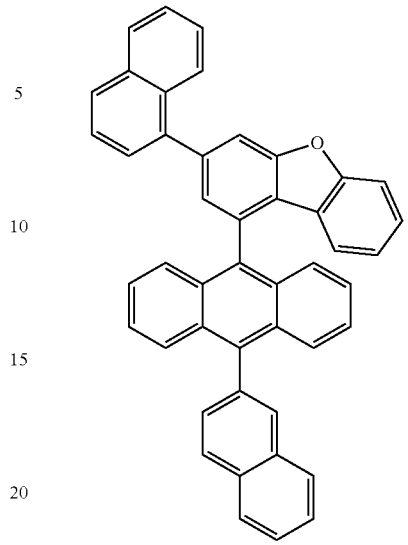
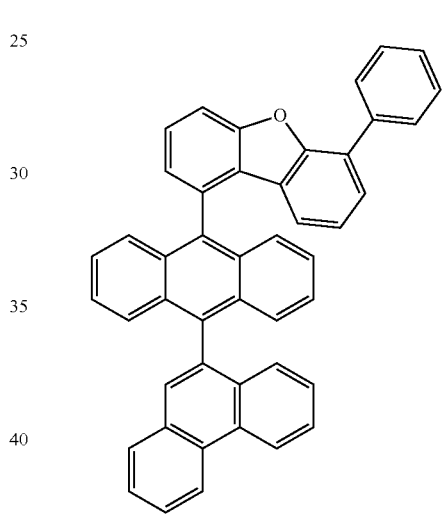
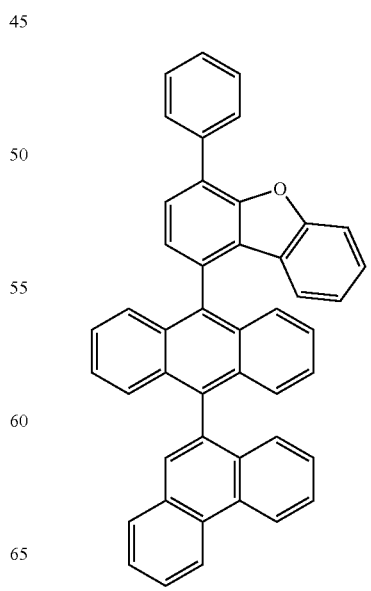

113
-continued
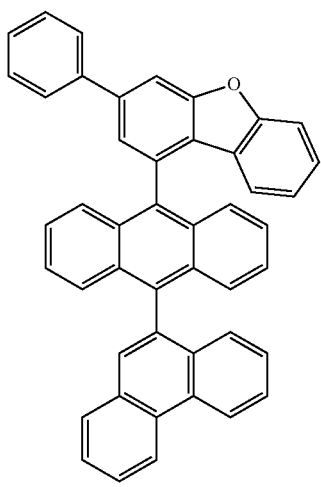
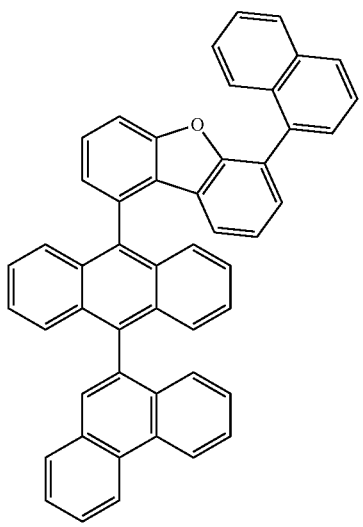
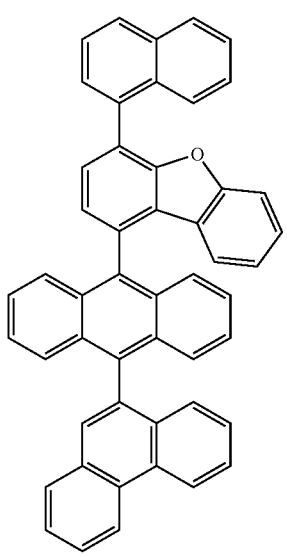
114
-continued
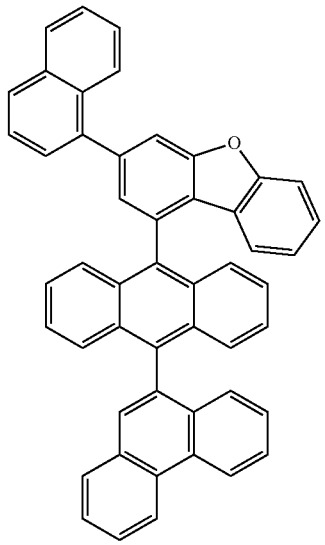
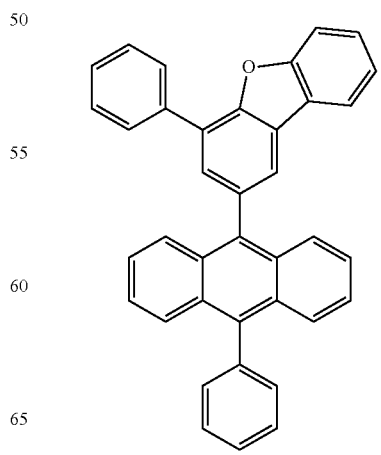

115
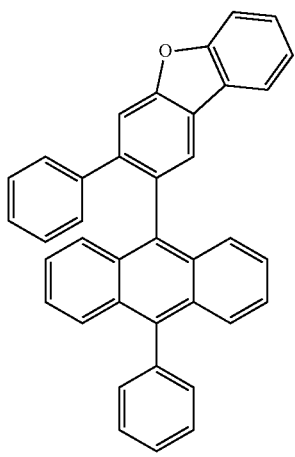
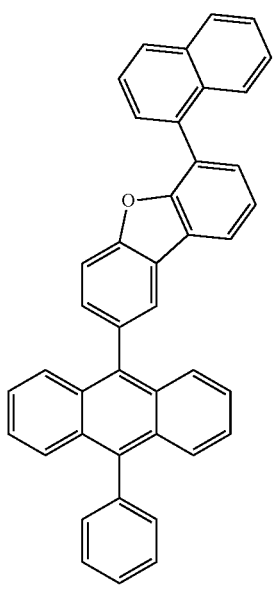
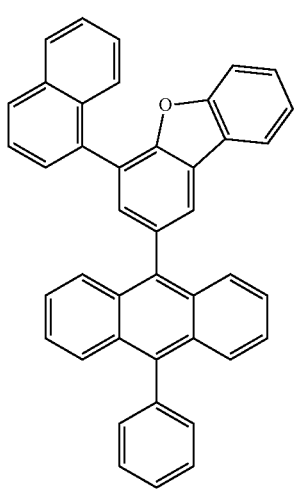
116
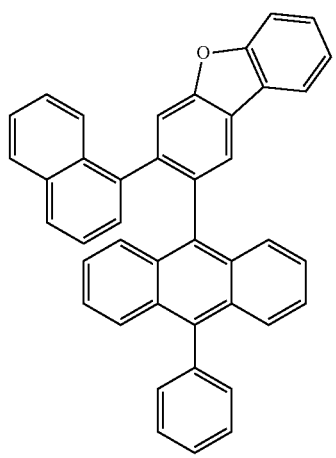
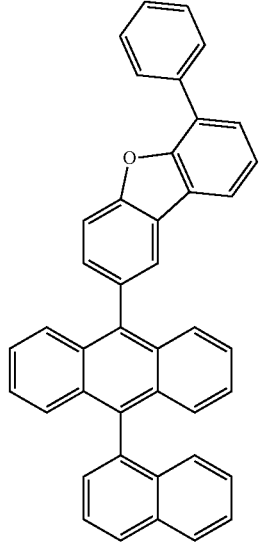
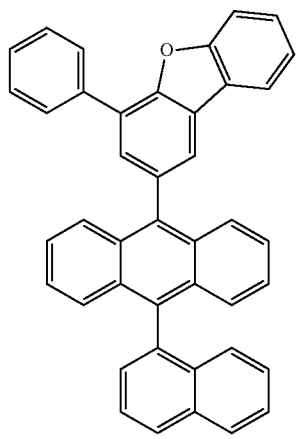

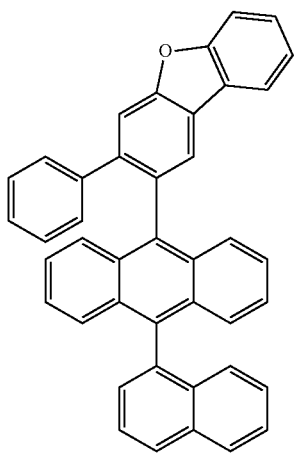
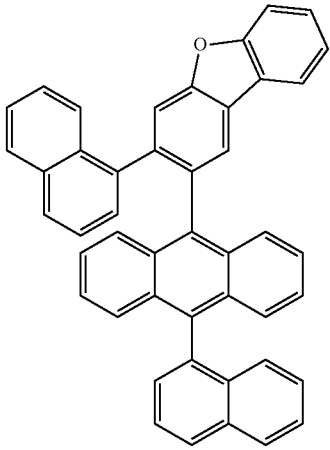
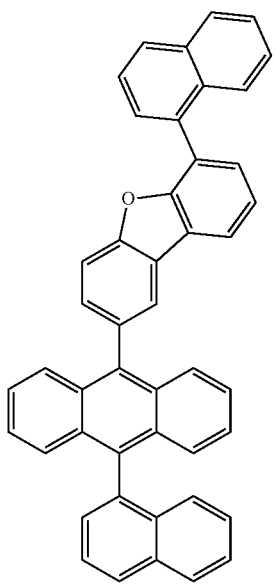
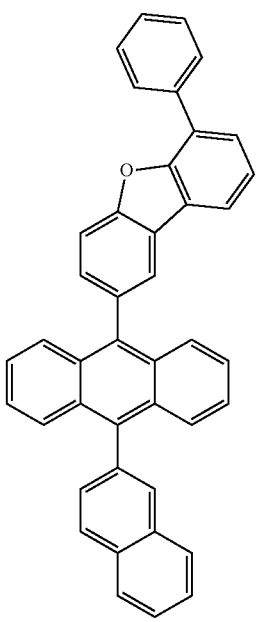
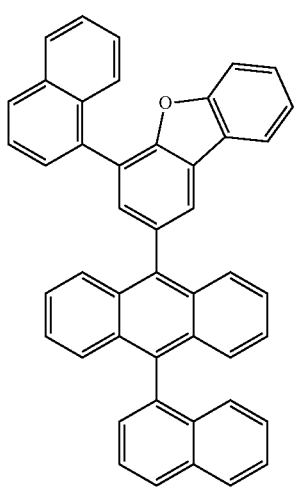
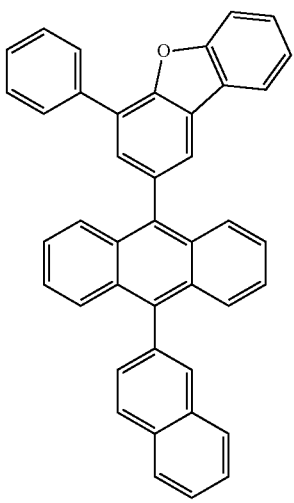

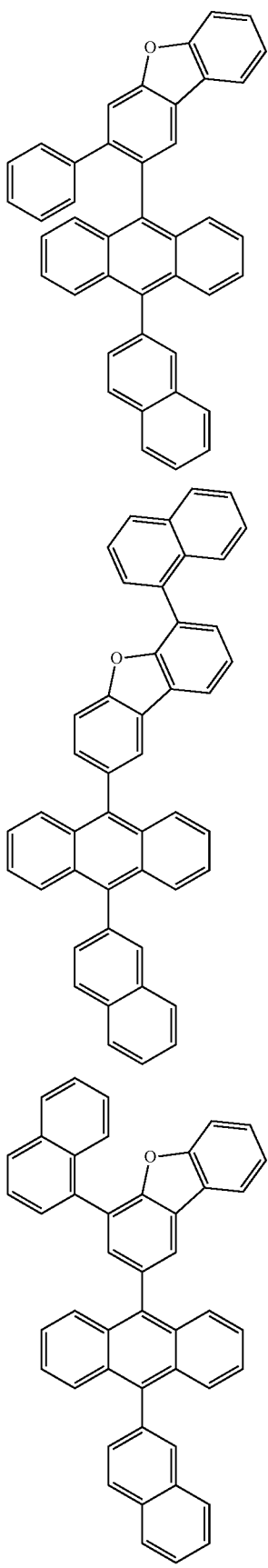
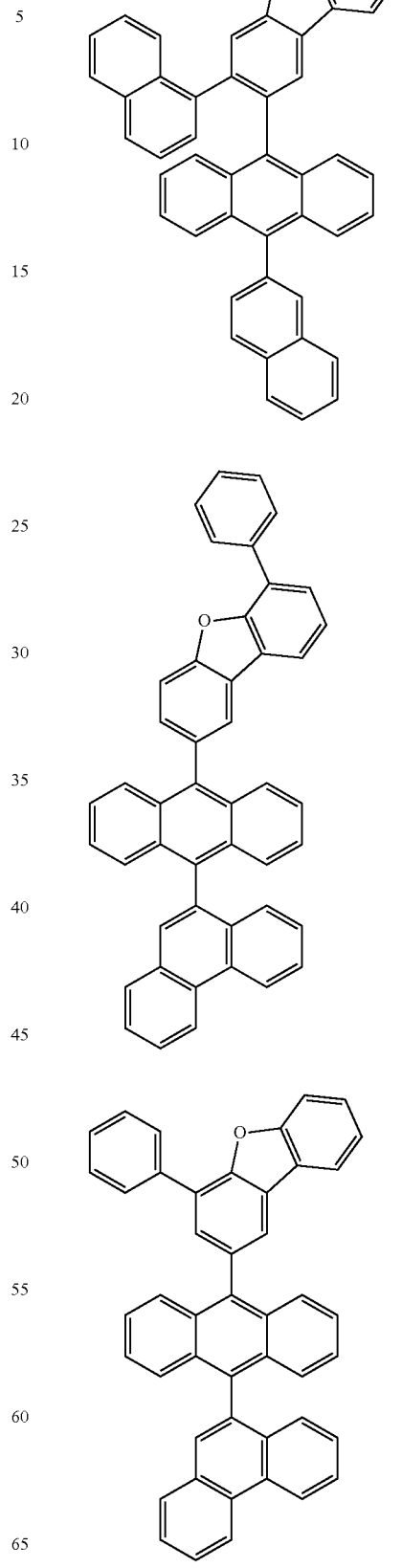

121
-continued
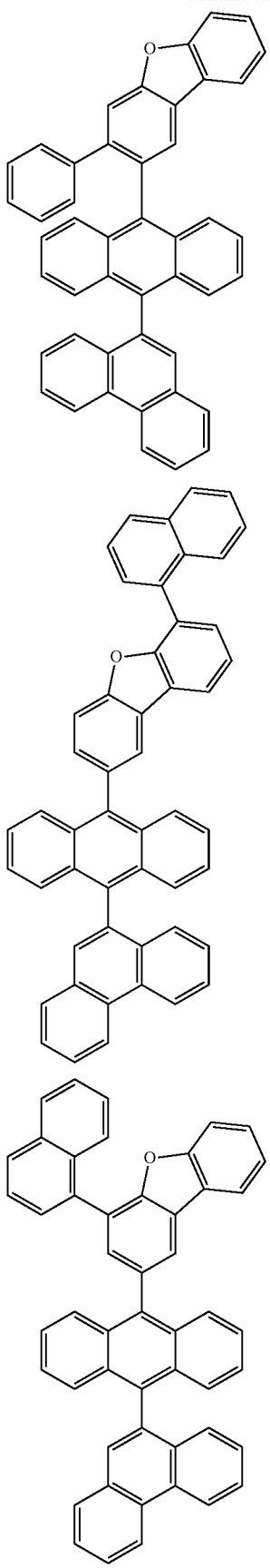
122
-continued
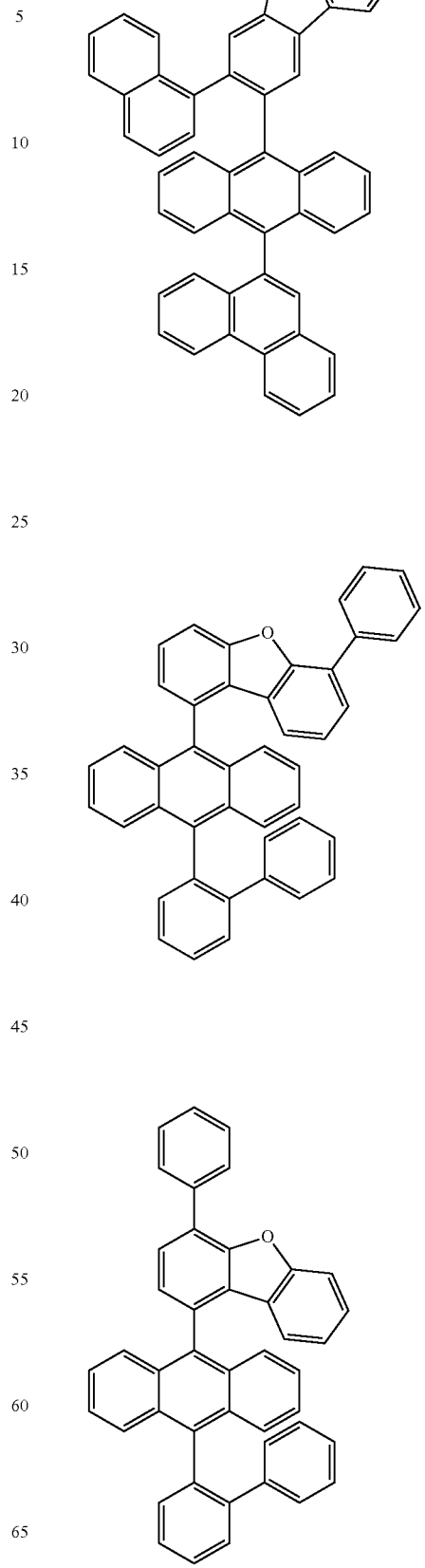

123
-continued
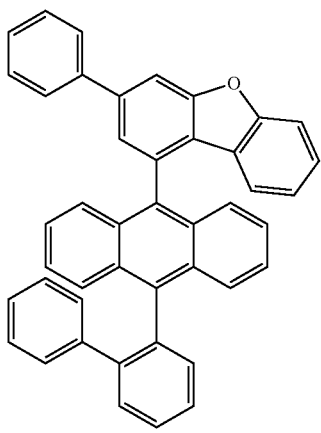
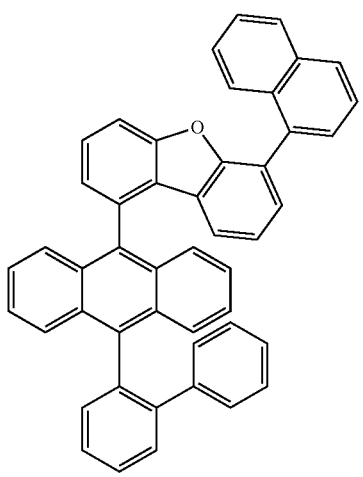
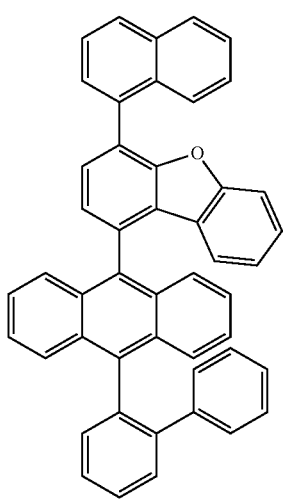
124
-continued
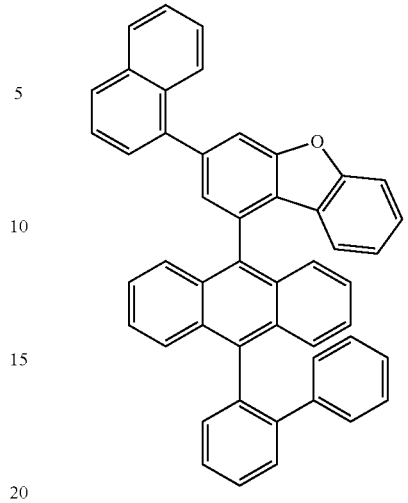
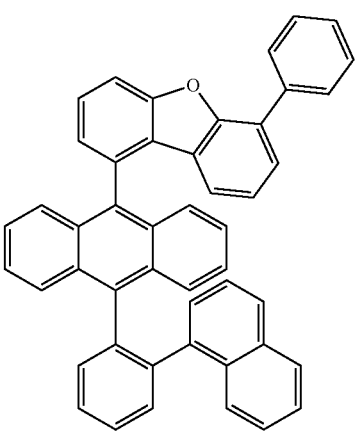

125
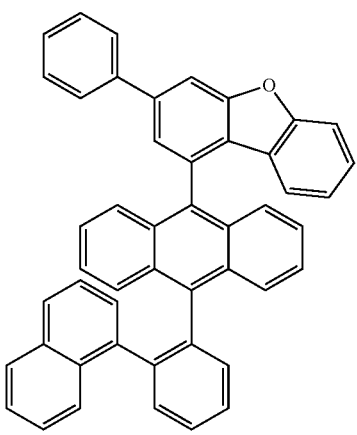
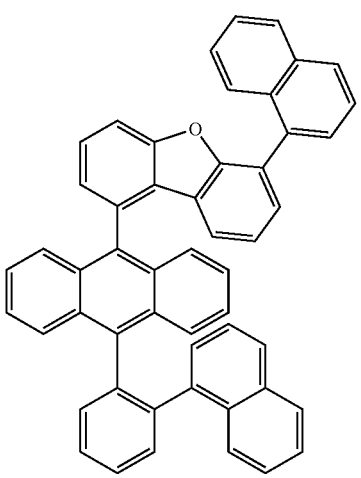
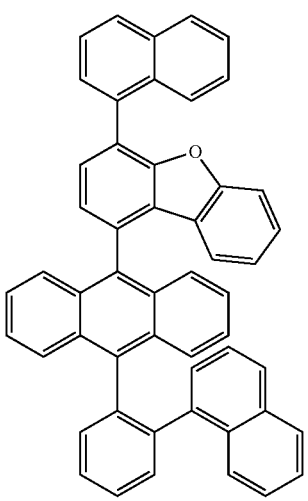
126
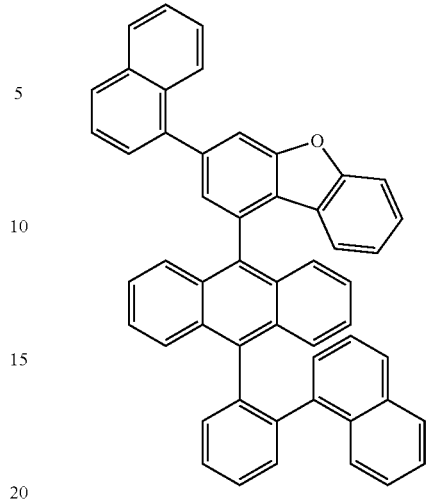
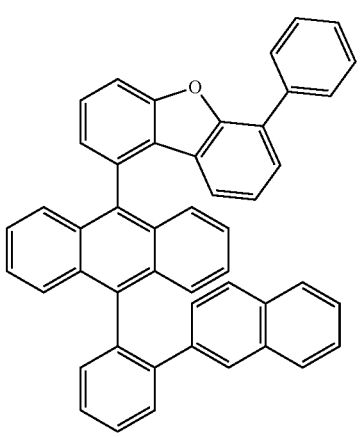
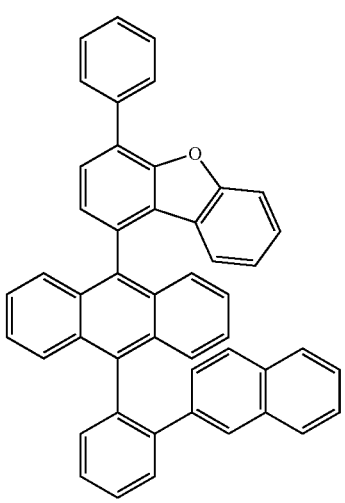

127
-continued
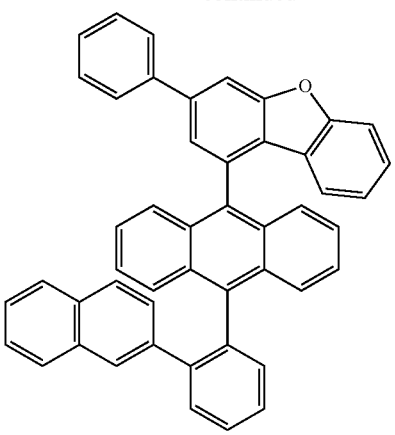
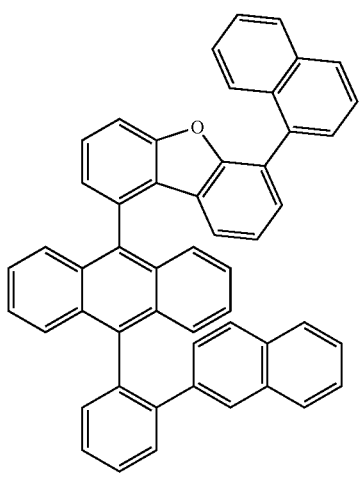
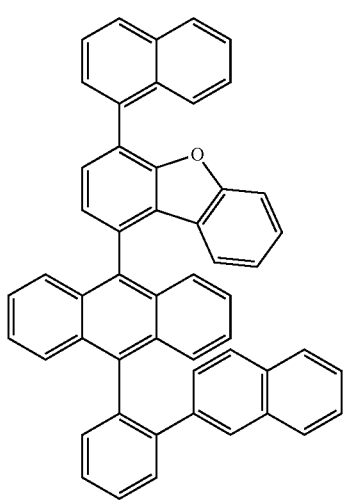
128
-continued
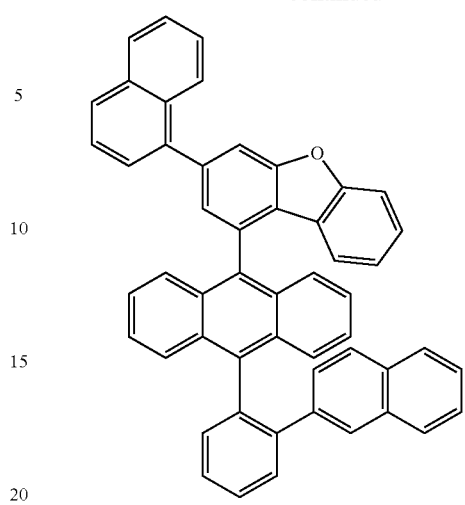
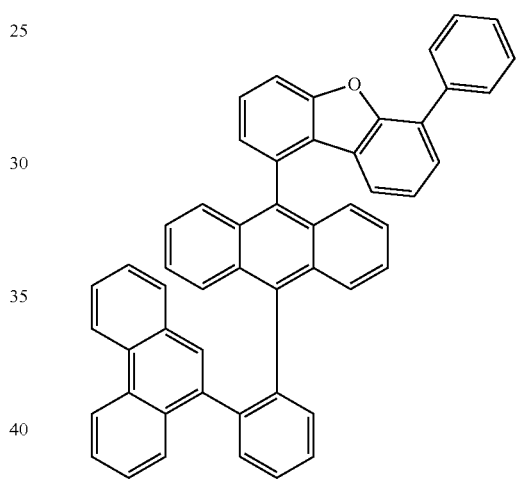
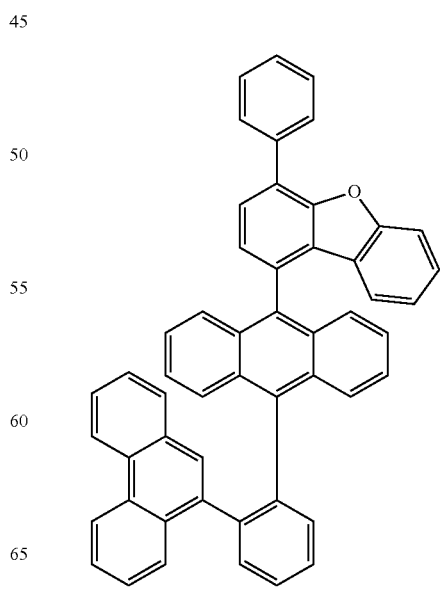

129
-continued
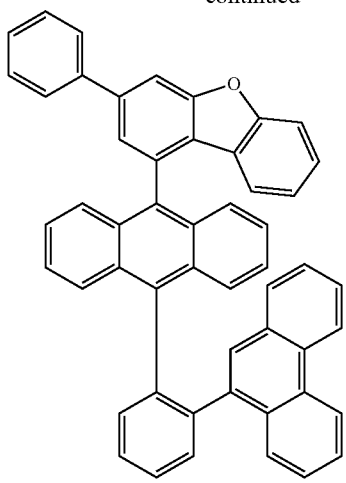
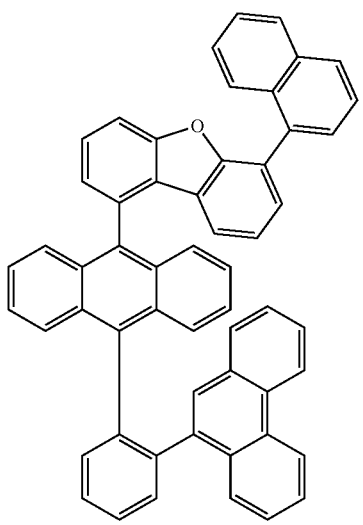
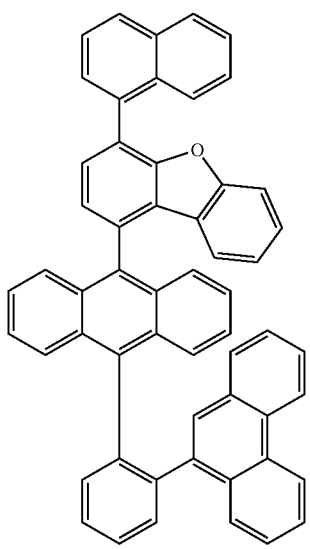
130
-continued
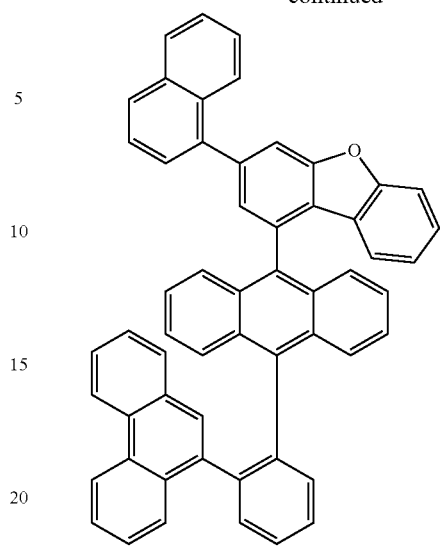
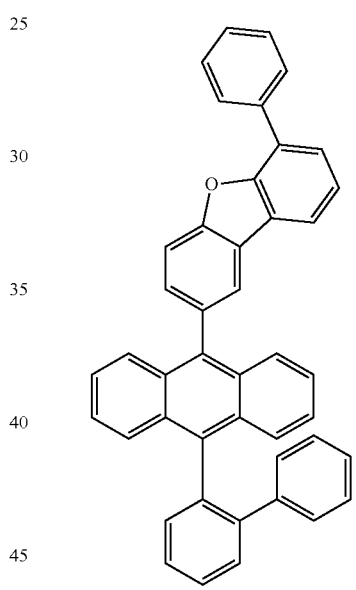
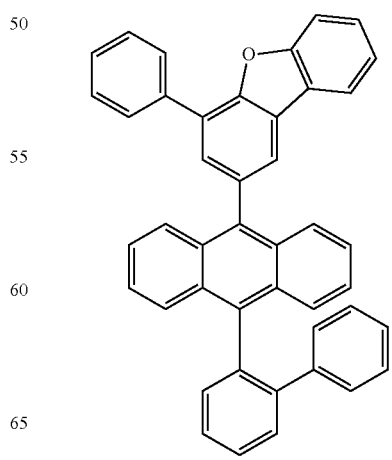

131
-continued
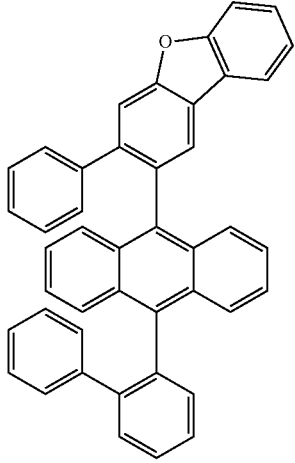
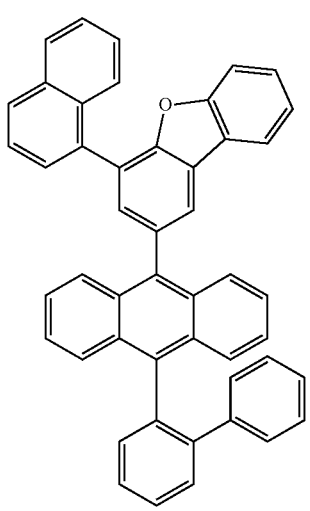
132
-continued
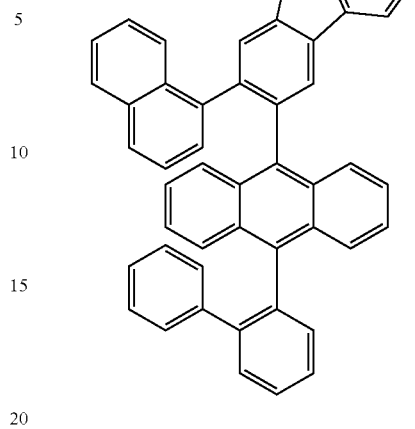
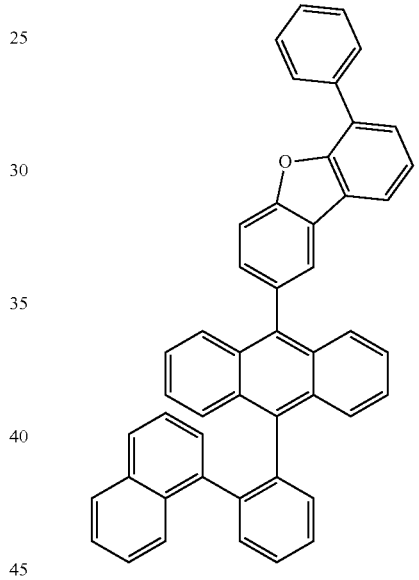
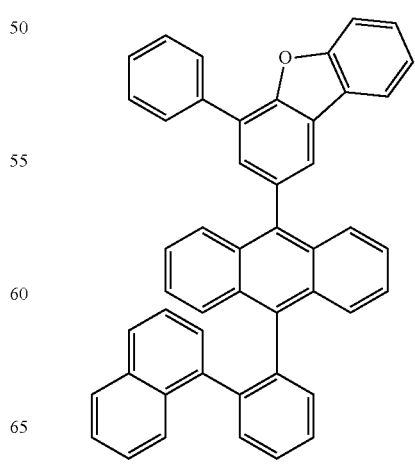

133
-continued
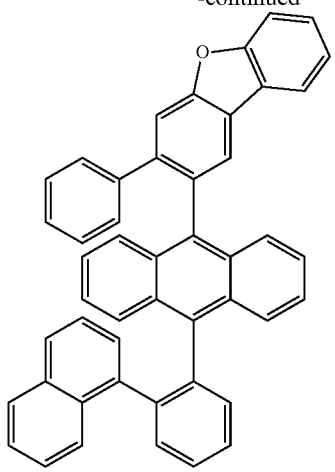
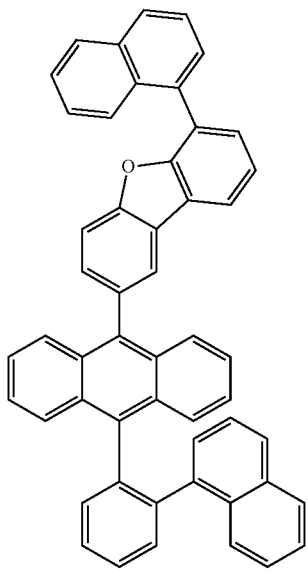
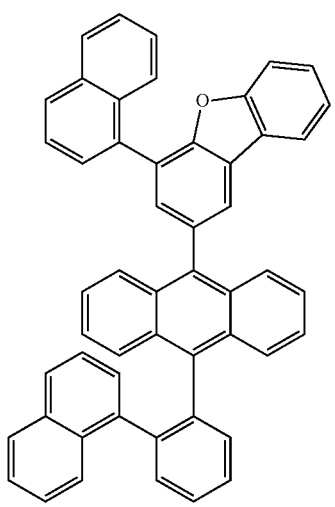
134
-continued
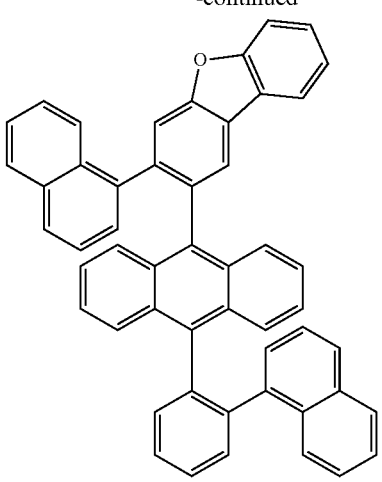
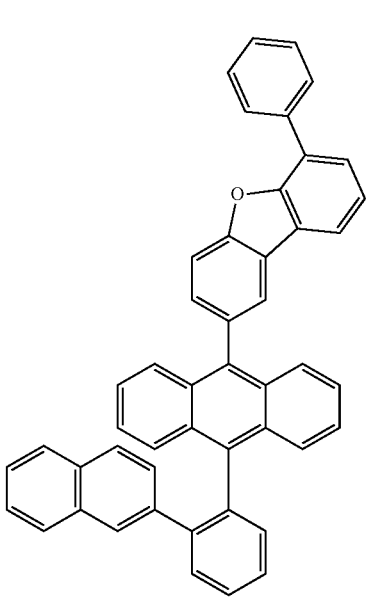
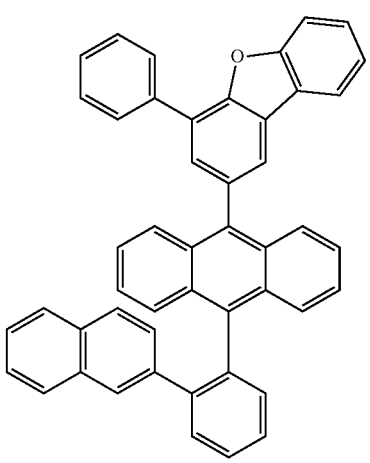

135
-continued
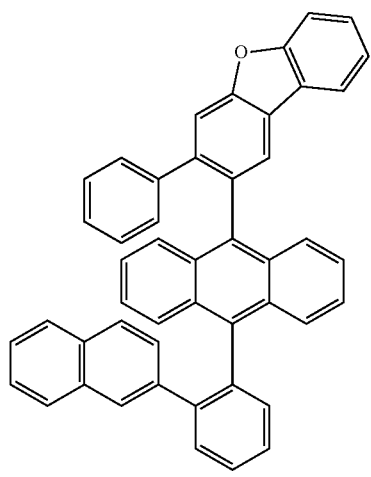
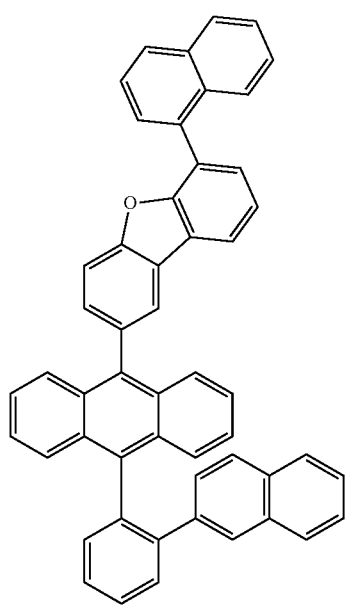
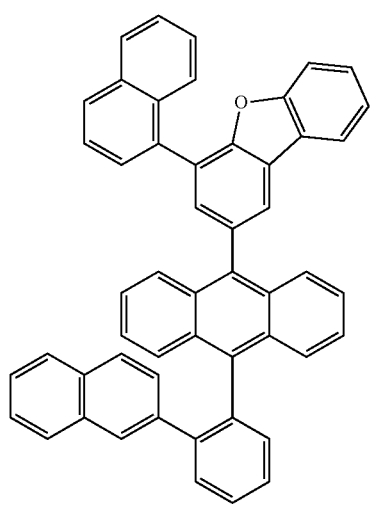
136
-continued
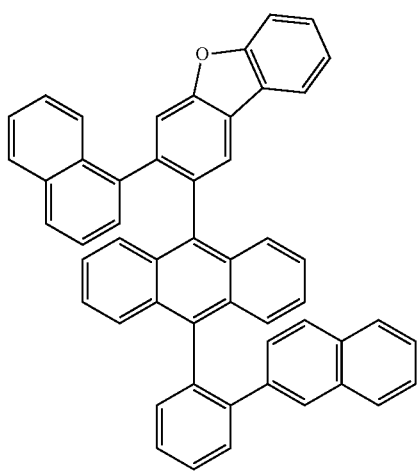
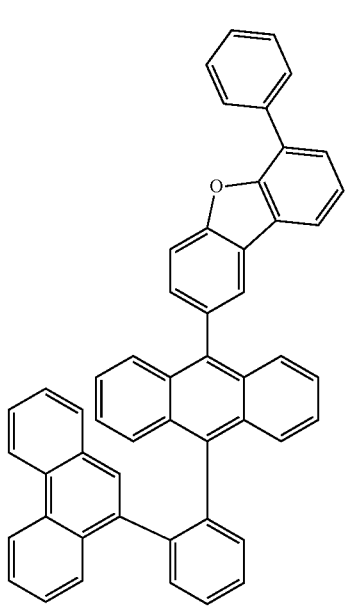
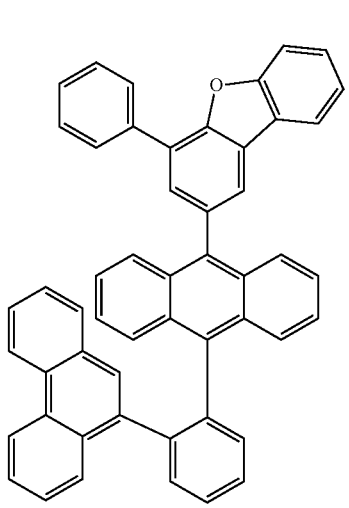

-continued
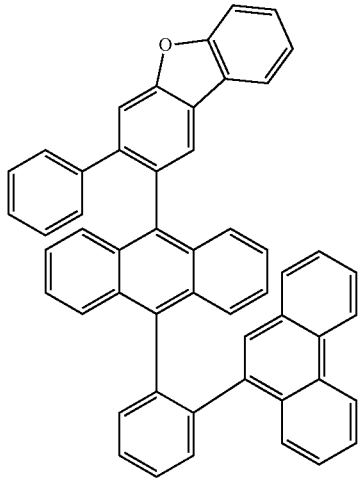
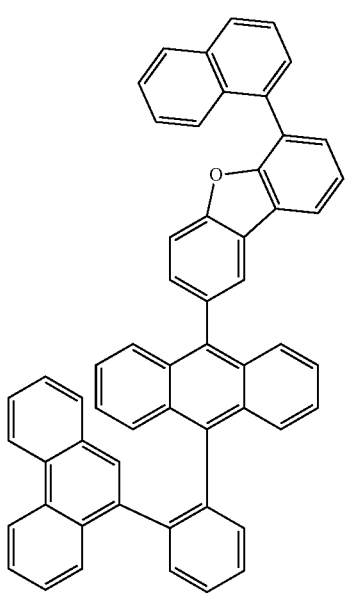
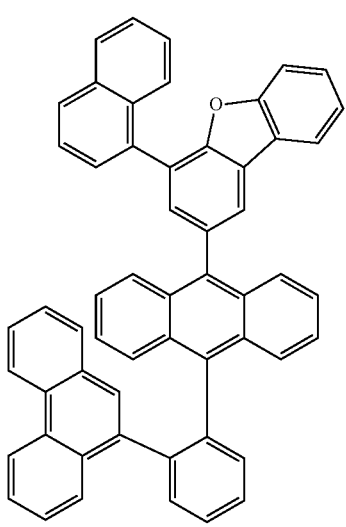
-continued
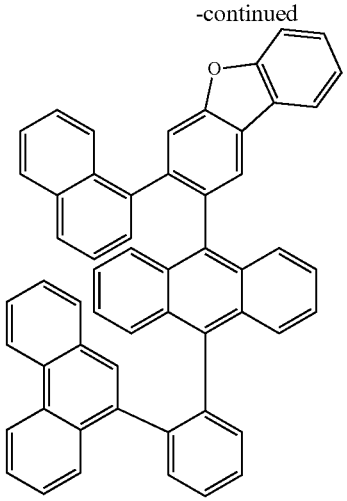
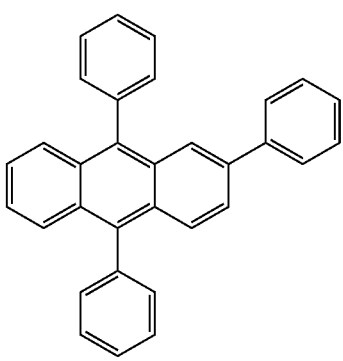
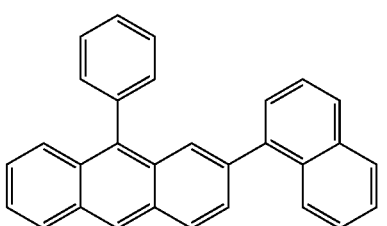
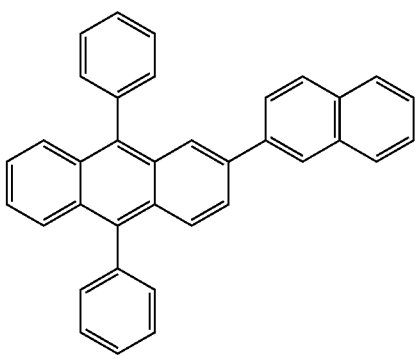

139
-continued
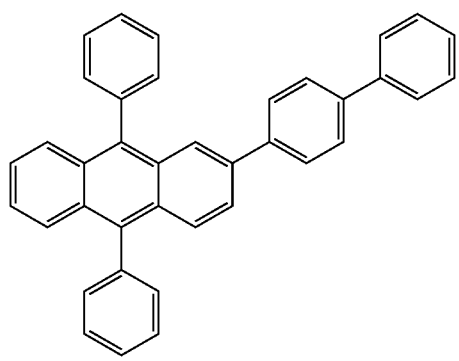
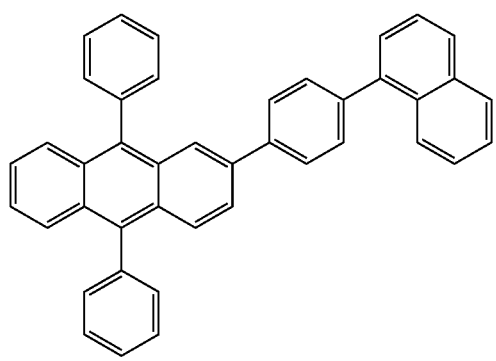
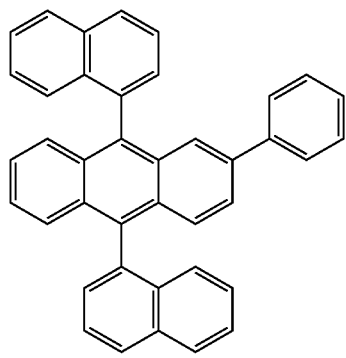
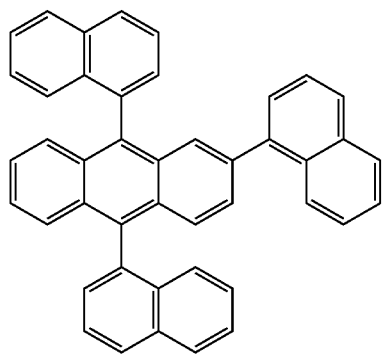
140
-continued
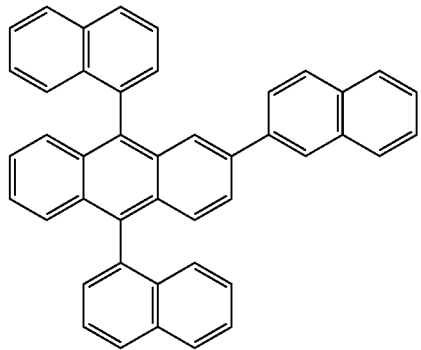
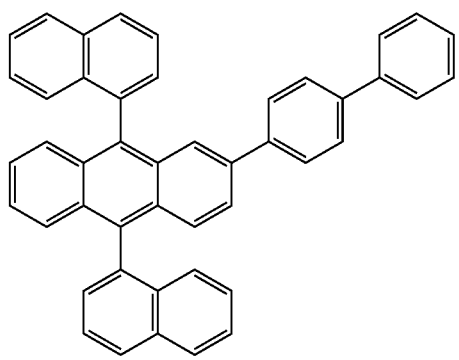
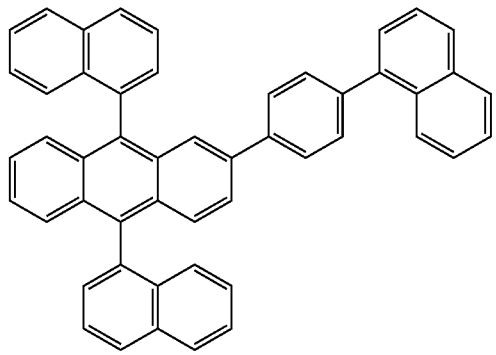
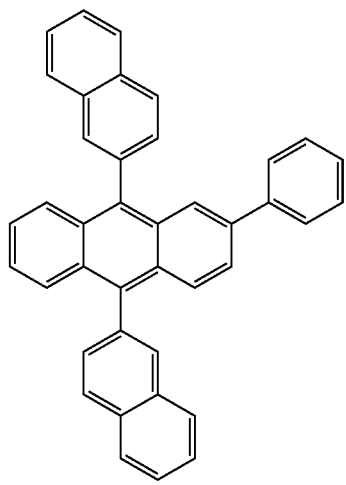

141
-continued
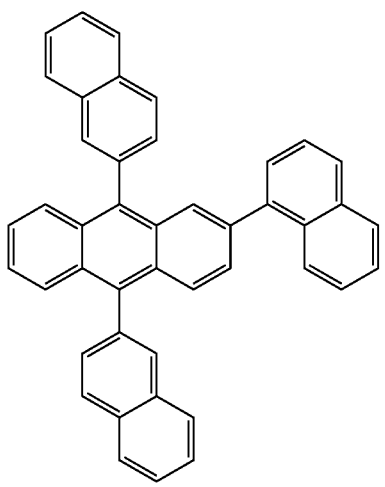 [SMILES: c1ccc2cc(-c3c4ccccc4c(-c4ccc5ccccc5c4)c4cc(-c5cccc6ccccc56)ccc34)ccc2c1]
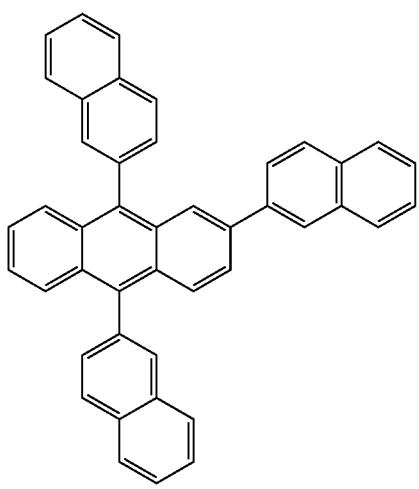
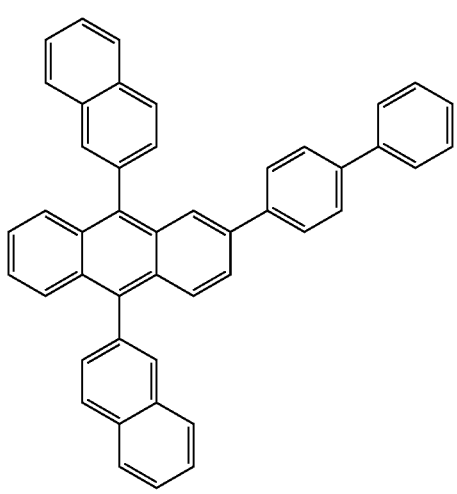
142
-continued
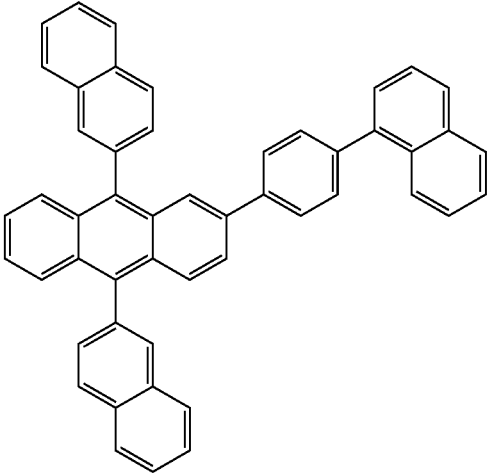
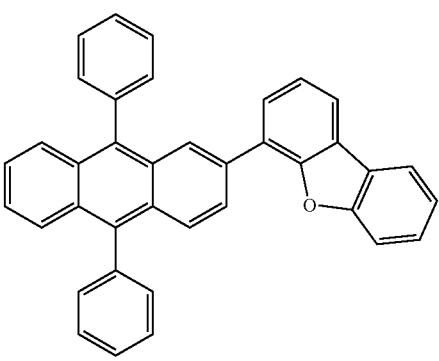
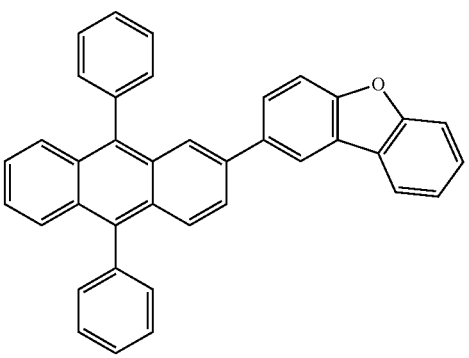
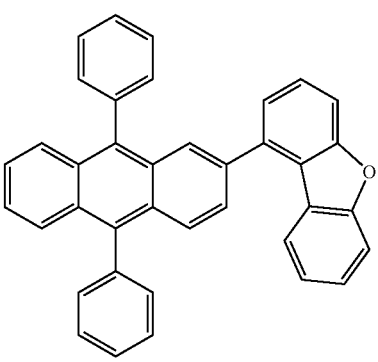

143
-continued
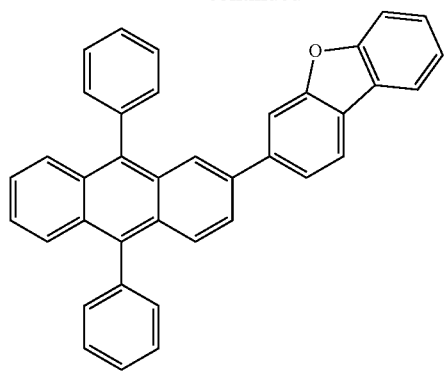
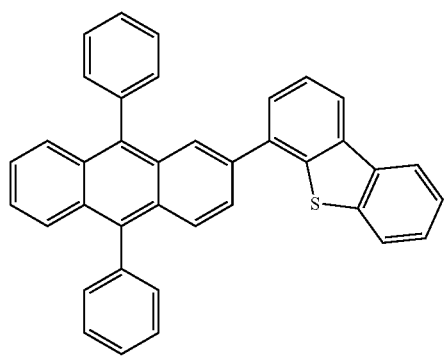
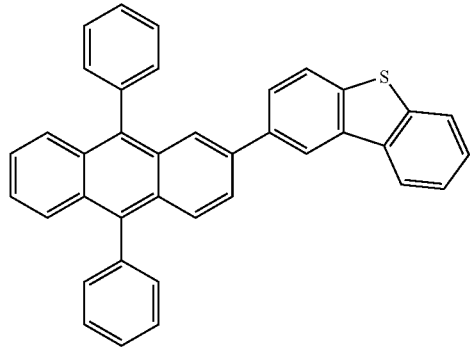
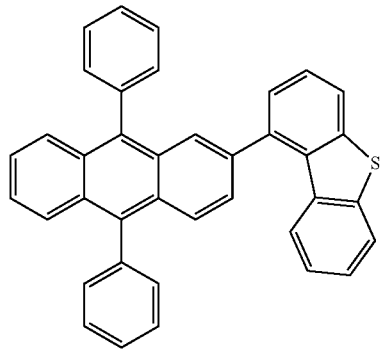
144
-continued
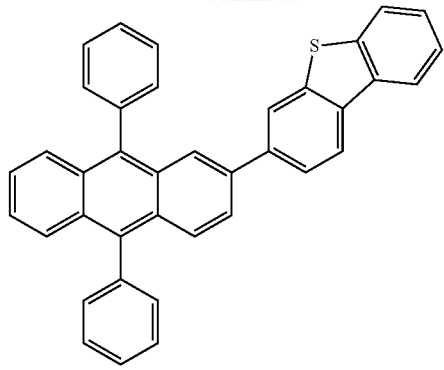
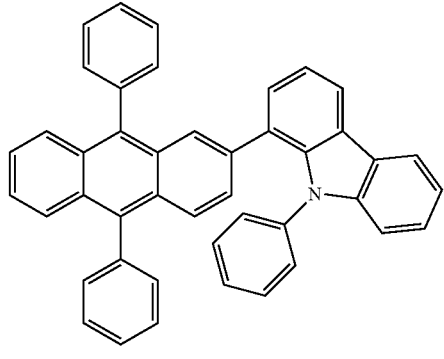
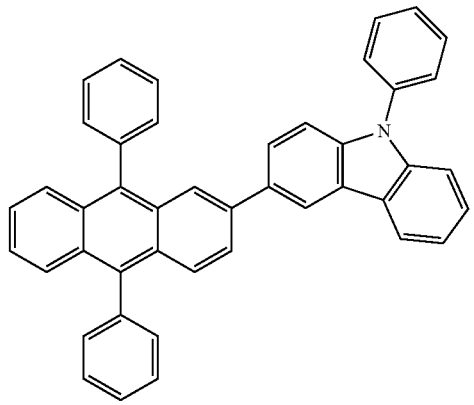
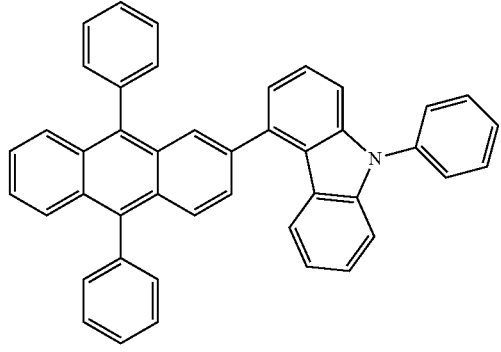

145
-continued
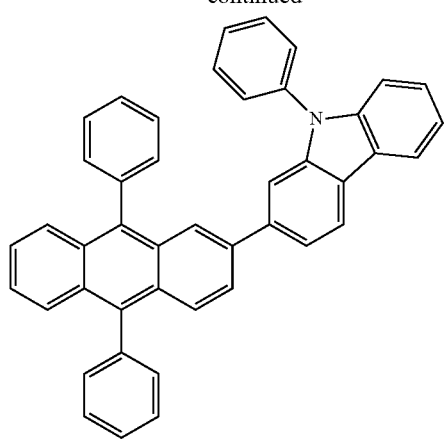
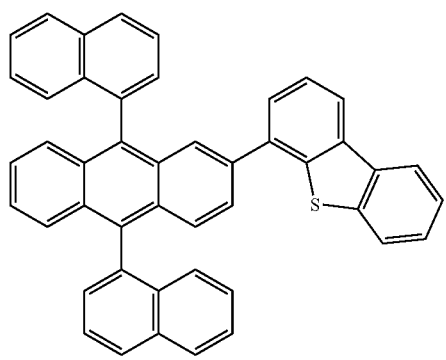
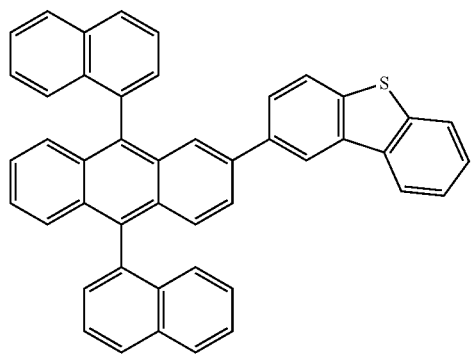
146
-continued
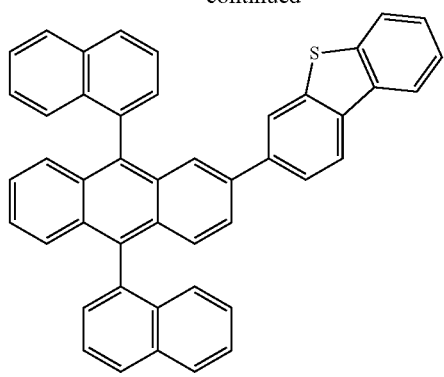
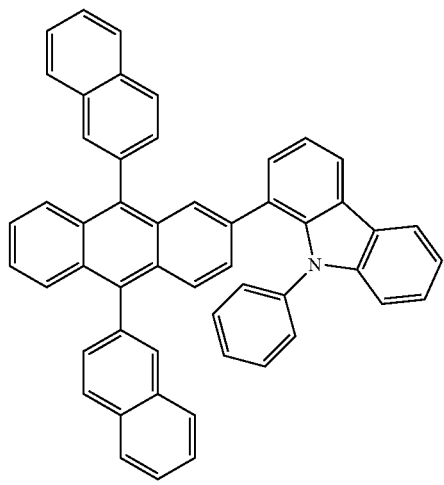
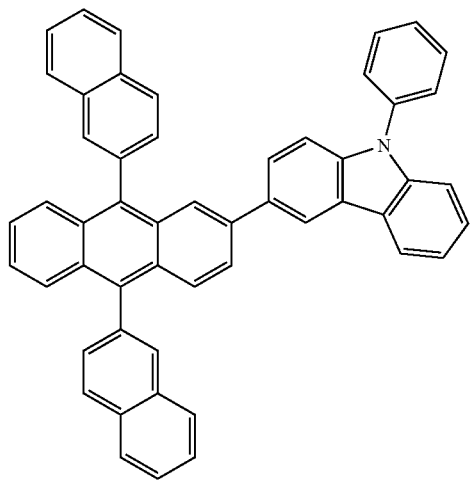

147
-continued
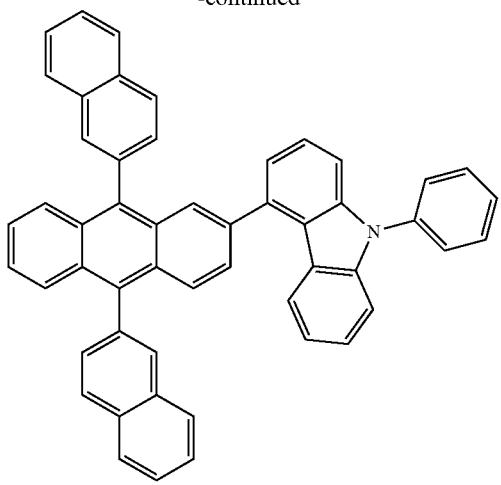
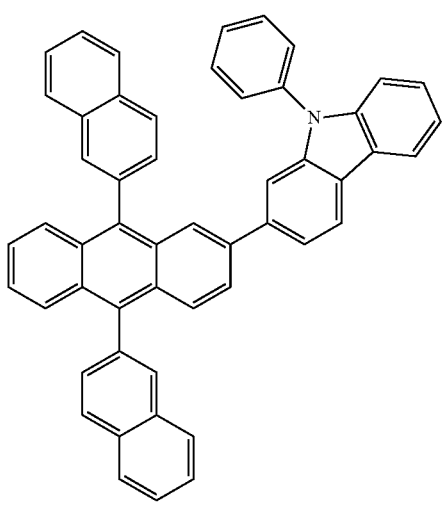
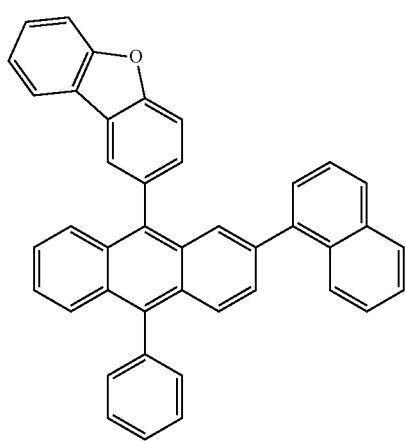
148
-continued
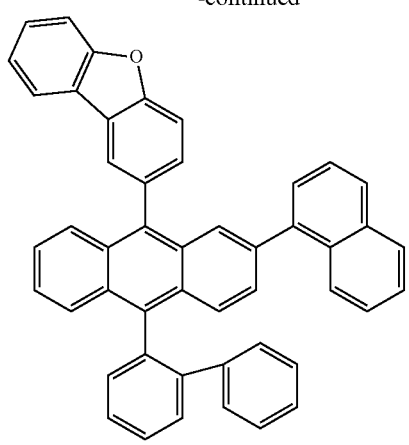
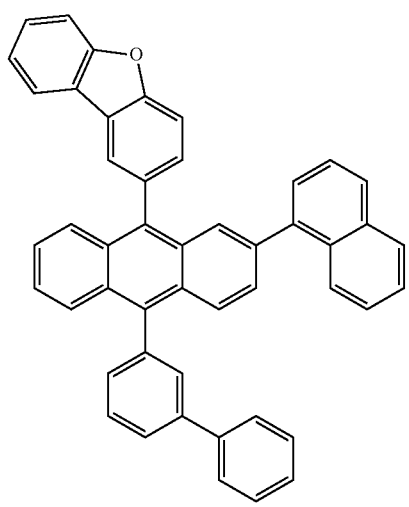
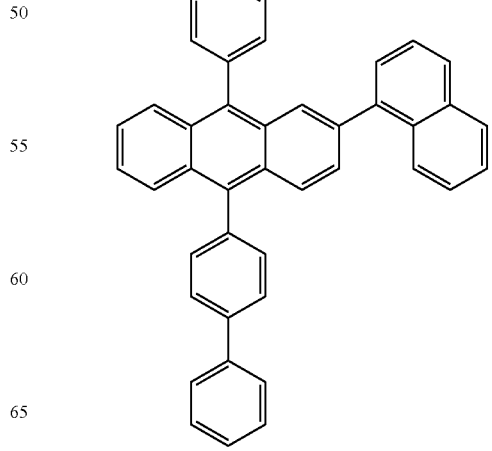

149
-continued
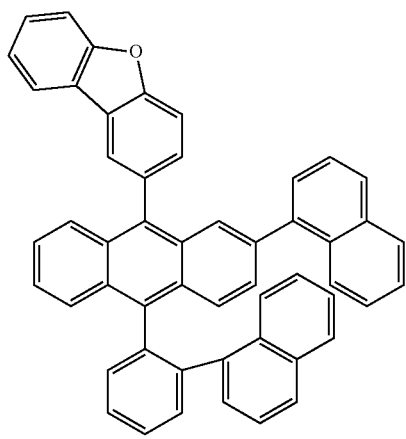
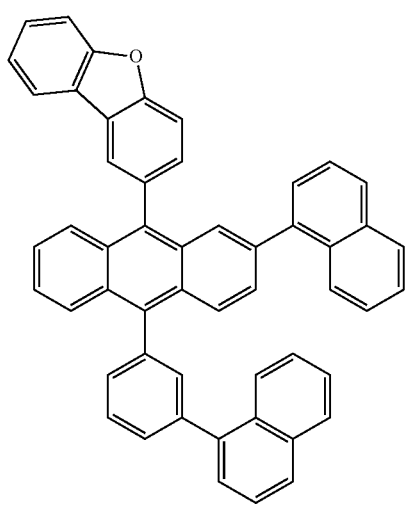
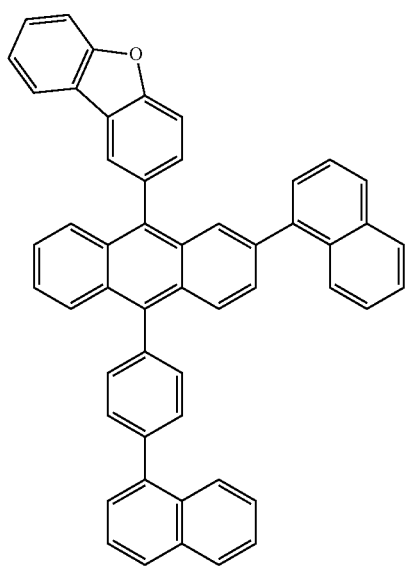
150
-continued
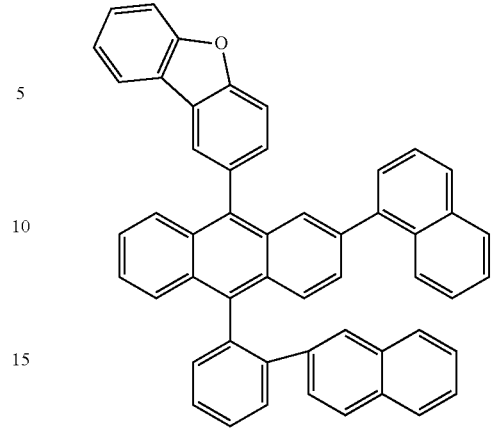
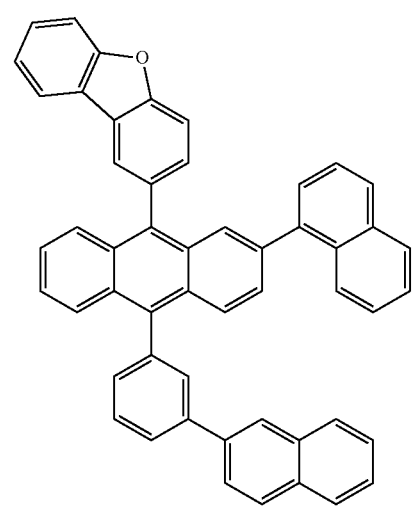
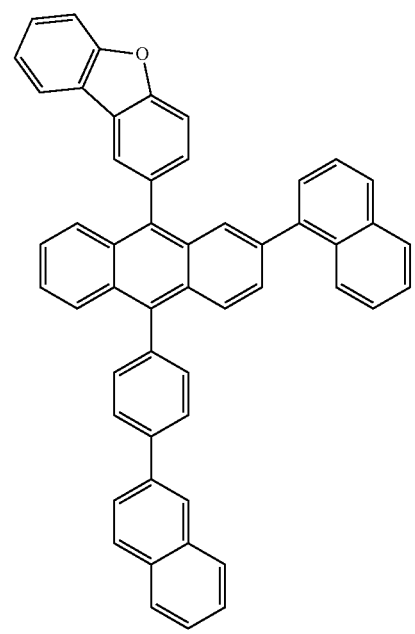

151
-continued
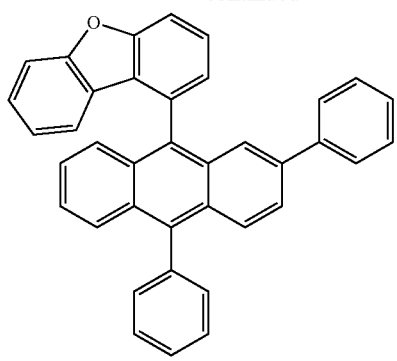
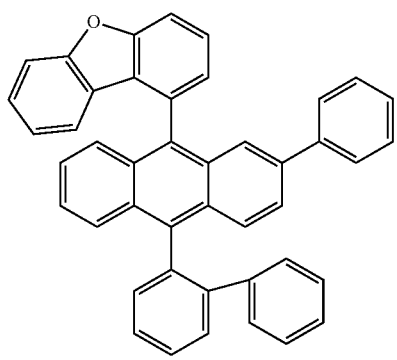
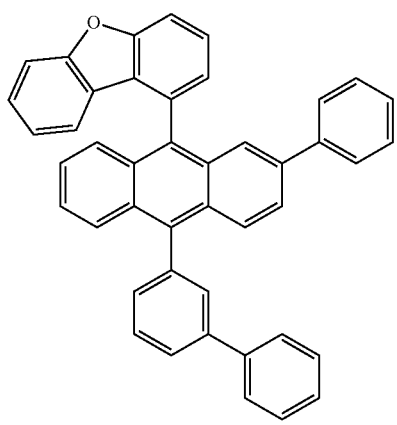
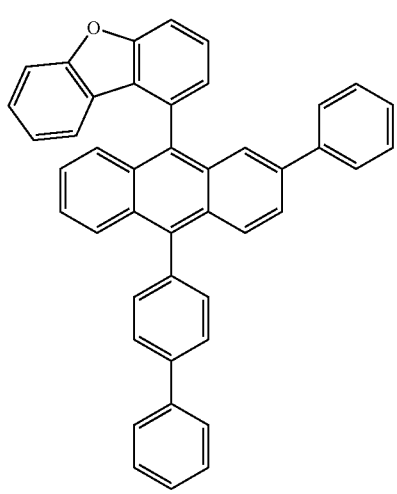
152
-continued
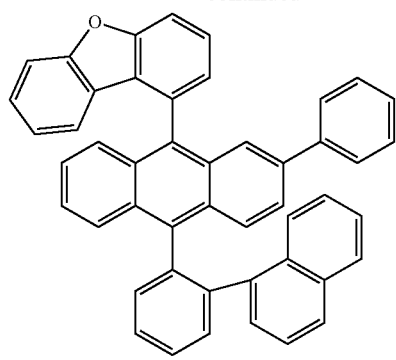
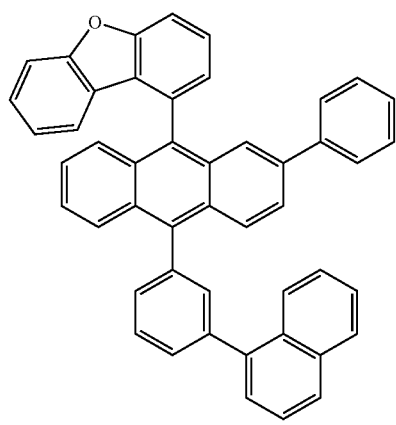
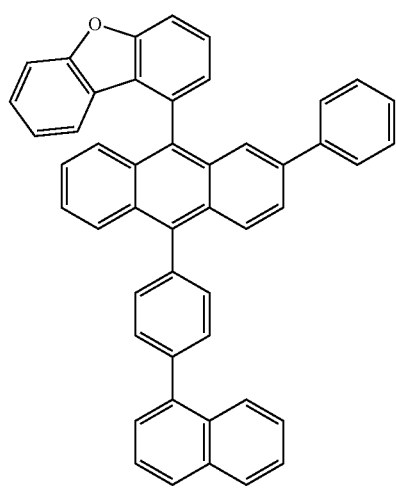
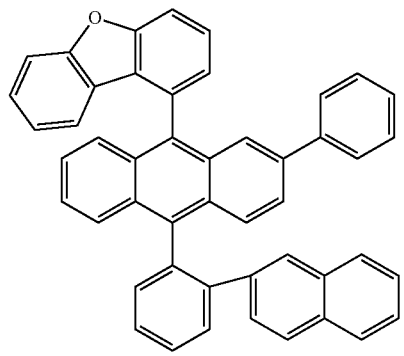

153
-continued

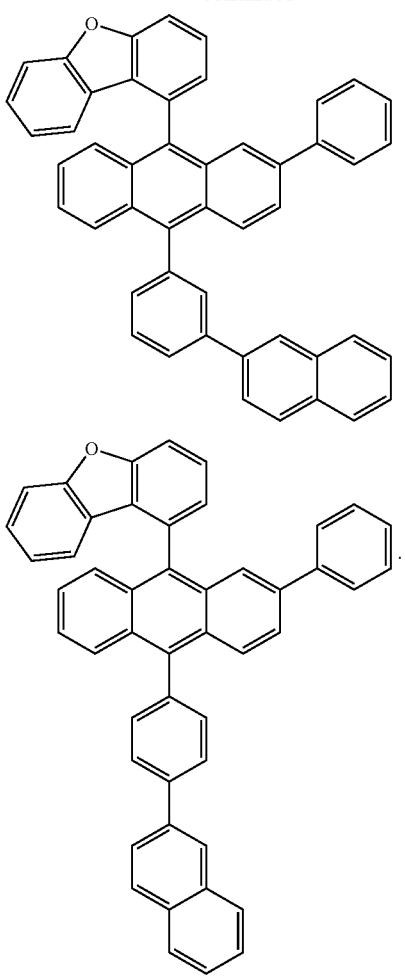

The compound represented by Chemical Formula 2 may be prepared, for example, in accordance with a preparation method as shown in Reaction Schemes 2-1 or 2-2 below, and the other remaining compounds can be prepared in a similar manner.

[Reaction Scheme 2-1]

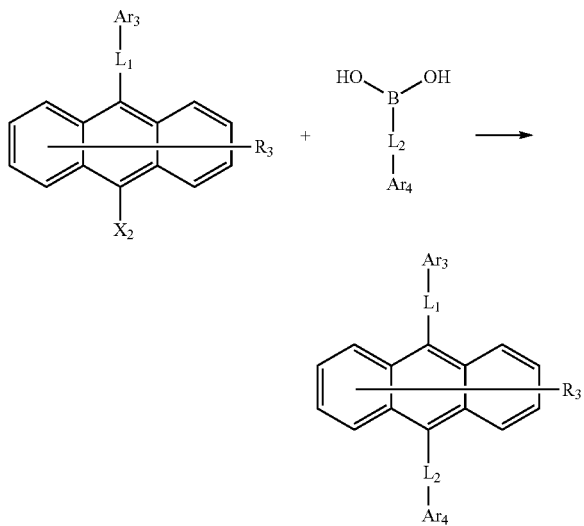

154

[Reaction Scheme 2-2]

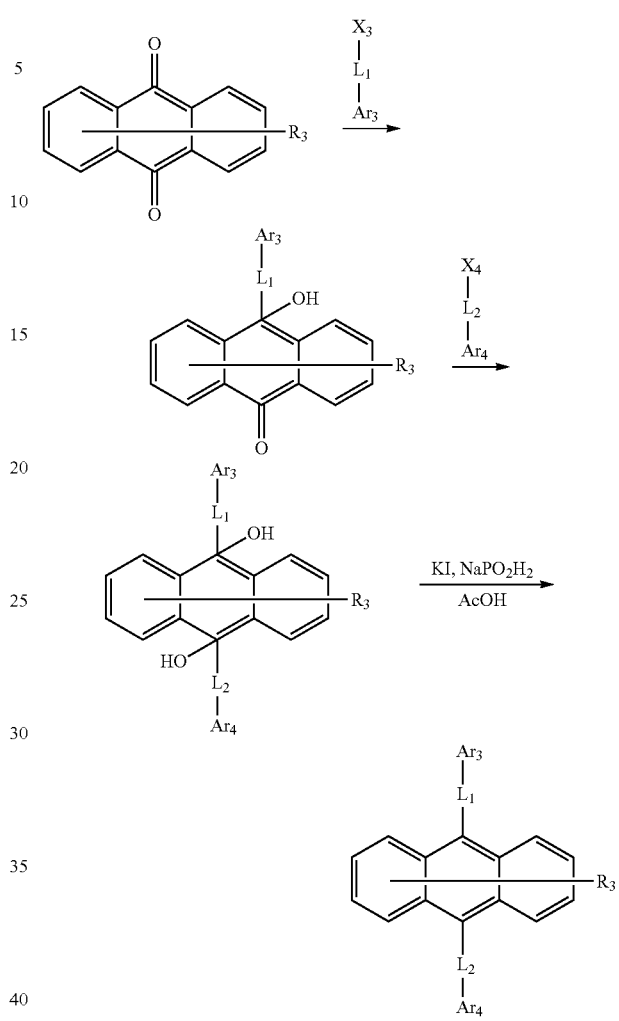

In the Reaction Schemes 2-1 and 2-2, the remaining substituents excluding X2 to X4 are the same as defined above, and X2 to X4 are halogen, preferably bromo or chloro.

Reaction Scheme 2-1 is a Suzuki coupling reaction, which is preferably carried out in the presence of a palladium catalyst and a base, and the reactive group for the Suzuki coupling reaction can be modified as known in the art. Reaction Scheme 2-2 is a ketone addition reaction and removal reaction, and the reactive croup, catalyst, solvent, and the like used can be suitably changed to be fitted to a desired product. The preparation method may be more specifically described in the Preparation Examples described hereinafter.

Meanwhile, the remaining organic light emitting device excluding the above-mentioned light emitting layer and the hole transport layer is not particularly limited as long as it is any one used in the organic light emitting device.

Anode and Cathode

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or SnO$_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or LiO$_2$/Al, and the like, but are not limited thereto.

Hole Injection Layer

The organic light emitting device according to the present disclosure may include a hole injection layer that injects holes from an electrode.

The hole injection material is preferably a compound which has a capability of transporting the holes, thus has a hole injecting effect from the anode and an excellent hole injecting effect to the light emitting layer or the light emitting material, prevents excitons produced in the light emitting layer from moving to the electron injection layer or the electron injection material, and is excellent in the ability to form a thin film. It is preferable that a HOMO (highest occupied molecular orbital) of the hole injection material is between the work function of the anode material and a HOMO of a peripheral organic material layer.

Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

Electron Transport Layer

The organic light emitting device according to the present disclosure may include an electron transport layer which receives electrons from a cathode or an electron injection layer and transports the electrons to an electron adjustment layer.

The electron transport material is suitably a material which may receive electrons well from a cathode and transfer the electrons to a light emitting layer, and has a large mobility for electrons. Specific examples of the electron transport material include an Al complex of 8-hydroxyquinoline; a complex including Alq$_3$; an organic radical compound; a hydroxyflavone-metal complex, and the like, but are not limited thereto. The electron transport layer may be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

Electron Injection Layer

The organic light emitting device according to the present disclosure may include an electron injection layer that injects electrons from an electrode.

The electron injection layer is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film.

Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto. Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

Organic Light Emitting Device

Figures 1, 2:
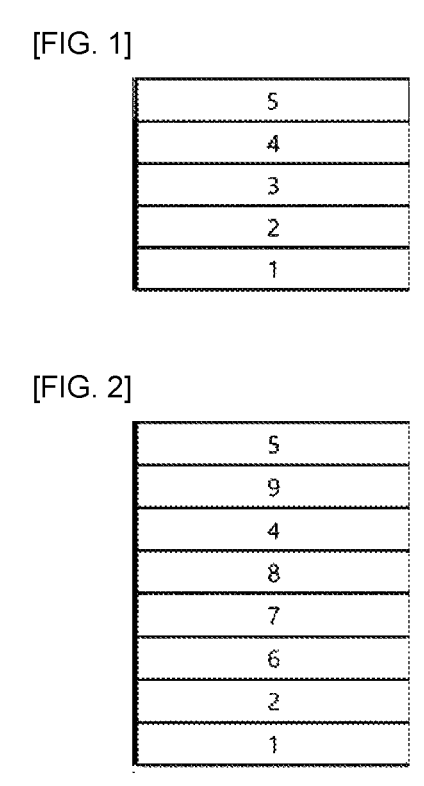

The structure of the organic light emitting device according to the present disclosure is illustrated in FIGS. 1 and 2.

FIG. 1 illustrates an example of an organic light emitting device comprising a substrate 1, an anode 2, a hole transport layer 3, a light emitting layer 4, and a cathode 5. Also, FIG. 2 illustrates an example of an organic light emitting device comprising a substrate 1, an anode 2, a hole injection layer 6, a second hole transport layer 7, a first hole transport layer 8, a light emitting layer 4, an electron injection and transport layer 9, and a cathode 5, The organic light emitting device according to the present disclosure may be manufactured by sequentially laminating the above-mentioned components. In this case, the organic light emitting device may be manufactured by depositing a metal, metal oxides having conductivity, or an alloy thereof on the substrate using a PVD (physical vapor deposition) method such as a sputtering method or an e-beam evaporation method to form an anode, forming an organic material layer including a hole transport layer, a light emitting layer and an electron transport layer thereon, and then depositing a material that can be used as the cathode thereon. In addition to such a method, the organic light emitting device may be manufactured by sequentially depositing a cathode material, an organic material layer and an anode material on a substrate. Further, the light emitting layer may be formed using the host and the dopant by a solution coating method as well as a vacuum deposition method. Herein, the solution coating method means a spin coating, a dip coating, a doctor blading, an inkjet printing, a screen printing, a spray method, a roll coating, or the like, but is not limited thereto.

In addition to such a method, the organic light emitting device may be manufactured by sequentially depositing a cathode material, an organic material layer and an anode material on a substrate (International Publication WO2003/012890). However, the manufacturing method is not limited thereto.

Meanwhile, the organic light emitting device according to the present disclosure may be a front side emission type, a backside emission type, or a double-sided emission type according to the used material.

Preferred embodiments will be provided below in order to assist in the understanding of the present disclosure. However, these examples are provided only for illustration of the present disclosure, and should not be construed as limiting the present disclosure to these examples.

Preparation Example 1: Preparation of Compound BH

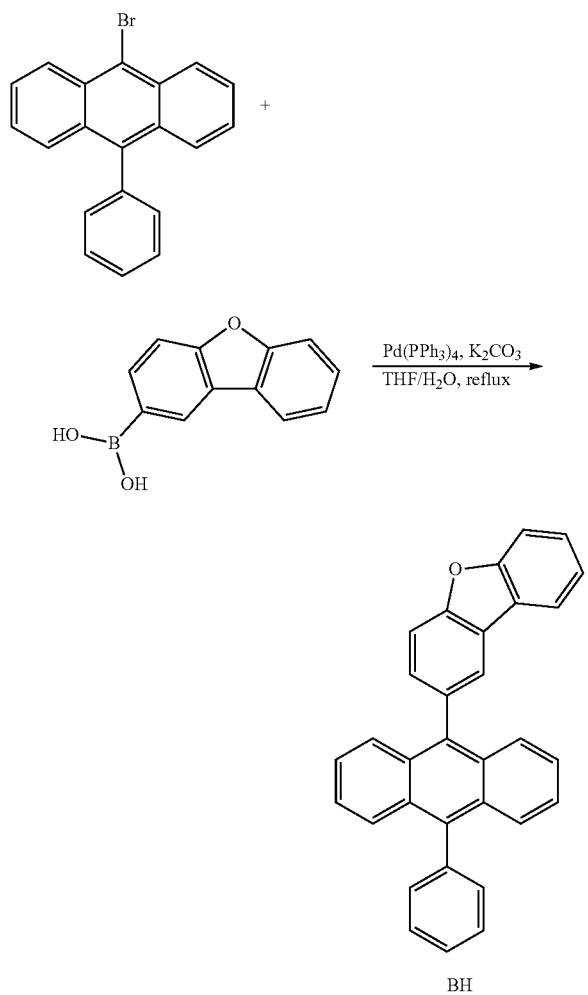

BH 9-bromo-10-phenylanthracene (13.24 g, 39.88 mmol) and dibenzo[b,d]furan-2-ylboronic acid (8.88 g, 41.87 mmol) were completely dissolved in tetrahydrofuran (320 ml) in a 500 ml round bottom flask under nitrogen atmosphere. Then, 2M potassium carbonate aqueous solution (160 mL) was added and tetrakis(triphenylphosphine)palladium (1.38 g, 1.20 mmol) were added thereto, and then the mixture was stirred with heating for 5 hours. The reaction temperature was lowered to room temperature, the aqueous layer was removed, dried over anhydrous magnesium sulfate, and then concentrated under reduced pressure. The resulting material was recrystallized from toluene (400 ml) to give Compound BH (9.24 g, yield 55%).

MS:[M+H]$^+$=412

Preparation Example 2: Preparation of Compound BH2

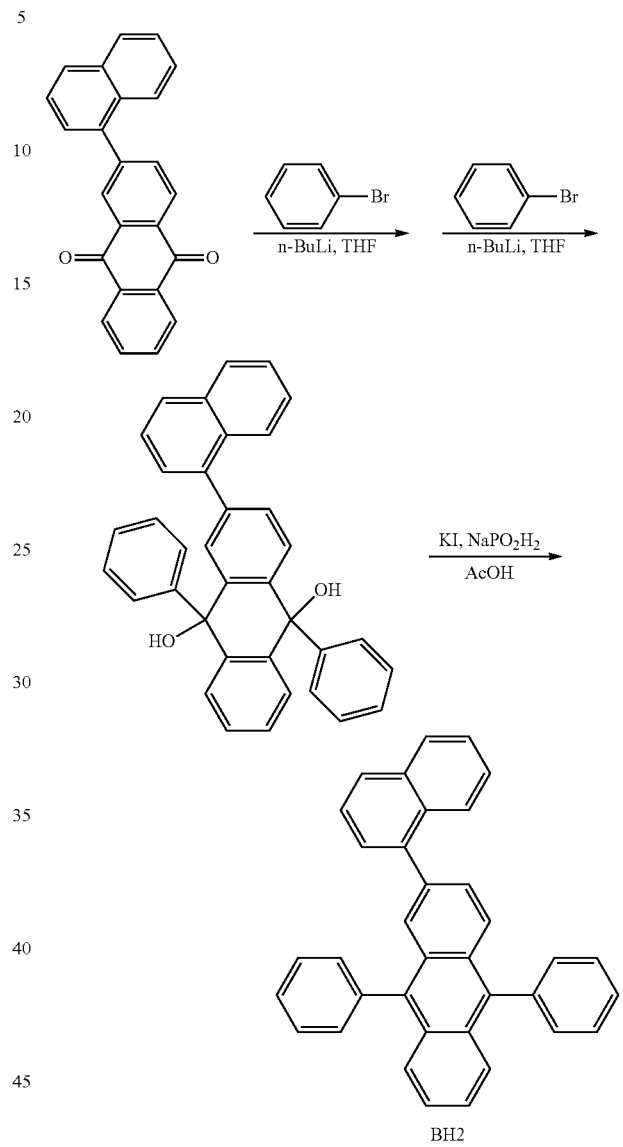

BH2

Under nitrogen atmosphere, phenyl bromide (1 eq) was dissolved in tetrahydrofuran, and n-BuLi (1.1 eq) was slowly added dropwise thereto at −78° C. After 30 minutes, 2-(naphthalen-1-yl)anthracene-9,10-dione (1 eq) was added. When the reaction was terminated after raising the reaction temperature to room temperature, the mixture was extracted with ethyl acetate and washed with water. The above procedure was performed once more using phenyl bromide. After completion of the reaction, the mixture was extracted with ethyl acetate and washed with water. All ethyl acetate was evaporated and precipitated with hexane to give 2-(naphthalen-1-yl)-9,10-diphenyl-9,10-dihydroanthracene-9,10-diol as a solid in yield of 50%.

2-(naphthalen-1-yl)-9,10-diphenyl-9,10-dihydroanthracene-9,10-diol (1 eq), KI (3 eq) and NaPO$_2$H$_2$ (5 eq) were added to acetic acid. The temperature was raised to 120° C. and the mixture was refluxed. After completion of the reaction, excess water was poured and the resulting solid was filtered. After dissolving with ethyl acetate, the reaction mixture was extracted and then washed with water, which was recrystallized from toluene to give Compound BH2 in yield of 70%.

MS[M+H]$^+$=457

Preparation Example 3: Preparation of Compound 1

Preparation Example 3-1: Preparation of Intermediate X

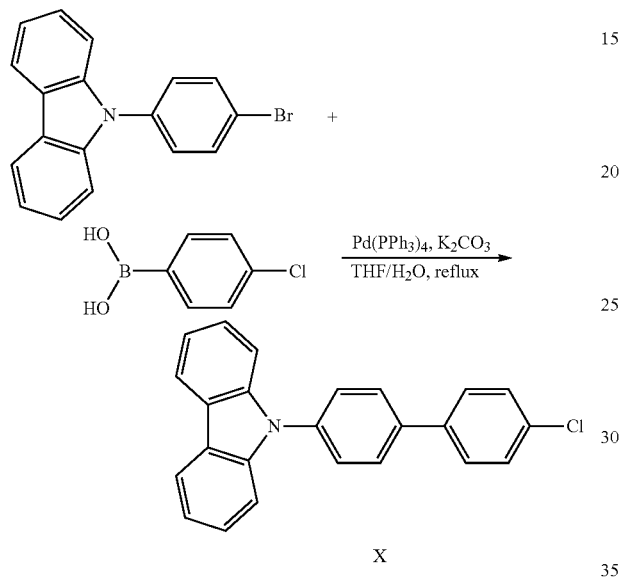

9-(4-bromophenyl)-9H-carbazole (100.0 g, 311.53 mmol) and 4-chlorophenylboronic acid (51.03 g, 327.10 mmol) were completely dissolved in tetrahydrofuran (600 ml) in a 2 L round bottom flask under nitrogen atmosphere. Then, 2M potassium carbonate aqueous solution (300 mL) was added and tetrakis(triphenylphosphine)palladium (10.80 g, 9.35 mmol) were added thereto, and then the mixture was stirred with heating for 6 hours. The reaction temperature was lowered to room temperature, the aqueous layer was removed, dried over anhydrous magnesium sulfate, and then concentrated under reduced pressure. The resulting material was recrystallized from tetrahydrofuran (220 ml) to give Intermediate X (76.42 g, yield: 69%).

MS:[M+H]$^+$=354

Preparation Example 3-2: Preparation of Compound 1

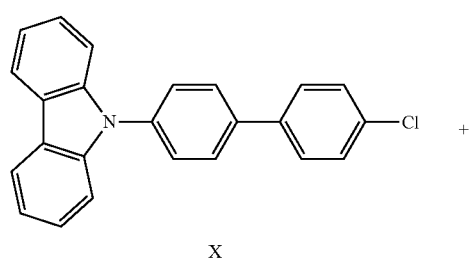

X

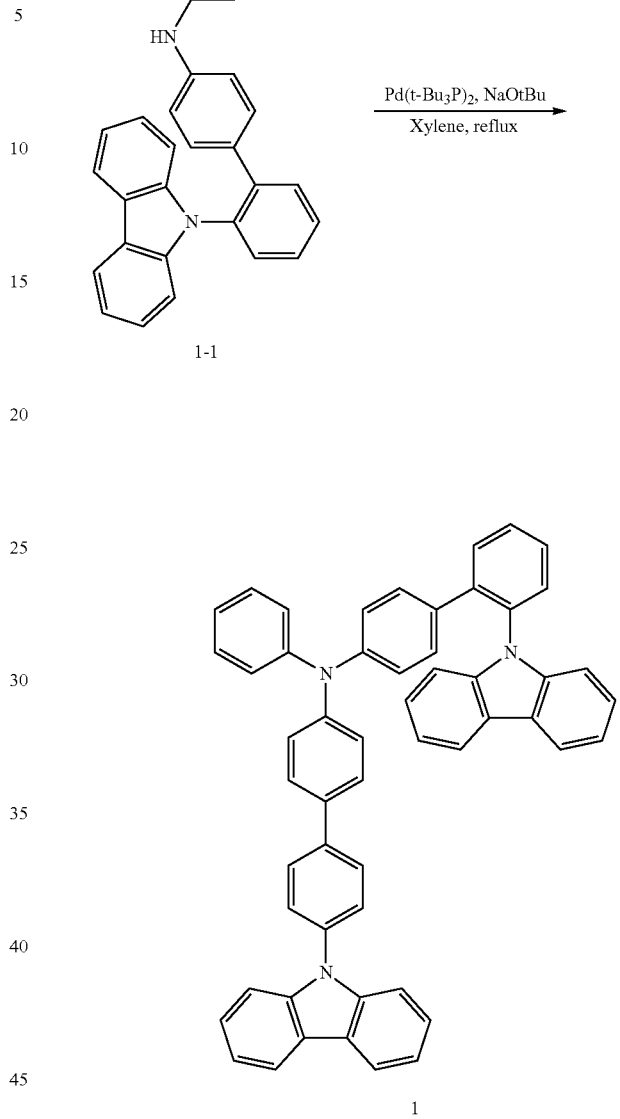

After Intermediate X (7.84 g, 22.15 mmol) and Intermediate 1-1 (9.77 g, 23.25 mmol) were completely dissolved in xylene (220 ml) in a 500 ml round bottom flask under nitrogen atmosphere, sodium tert-butoxide (2.77 g, 28.79 mmol) was added and bis(tri-tert-butylphosphine)palladium (0) (0.23 g, 0.44 mmol) was added, and then the mixture was stirred with heating for 3 hours. The reaction temperature was lowered to room temperature, and the reaction mixture was filtered to remove the base. Xylene was concentrated under reduced pressure, which was recrystallized from ethyl acetate (260 ml) to give Compound 1 (10.47 g, yield: 65%).

MS:[M+H]$^+$=728

Preparation Example 4: Preparation of Compound 2

Preparation Example 5: Preparation of Compound 3

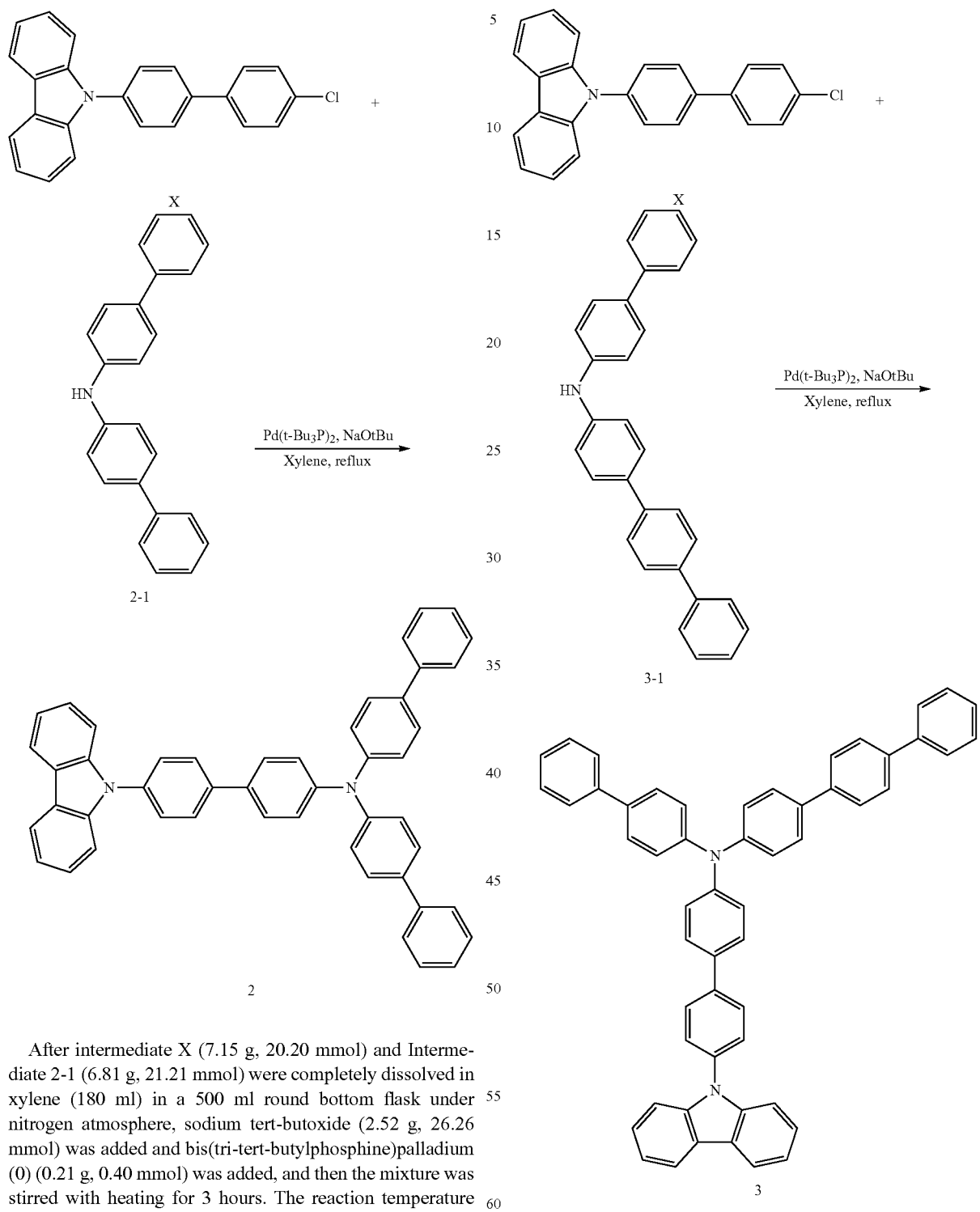

After intermediate X (7.15 g, 20.20 mmol) and Intermediate 2-1 (6.81 g, 21.21 mmol) were completely dissolved in xylene (180 ml) in a 500 ml round bottom flask under nitrogen atmosphere, sodium tert-butoxide (2.52 g, 26.26 mmol) was added and bis(tri-tert-butylphosphine)palladium (0) (0.21 g, 0.40 mmol) was added, and then the mixture was stirred with heating for 3 hours. The reaction temperature was lowered to room temperature, and the reaction mixture was filtered to remove the base, Xylene was then concentrated under reduced pressure, which was recrystallized from ethyl acetate (340 ml) to give Compound 2 (7.29 g, yield: 56%).

MS:[M+H]$^+$=639

After Intermediate X (7.33 g, 20.71 mmol) and Intermediate 3-1 (7.85 g, 21.74 mmol) were completely dissolved in xylene (210 ml) in a 500 ml round bottom flask under nitrogen atmosphere, sodium tert-butoxide (2.59 g, 26.92 mmol) was added and bis(tri-tert-butylphosphine)palladium (0) (0.21 g, 0.41 mmol) was added, and then the mixture was stirred with heating for 3 hours. The reaction temperature was lowered to room temperature, and the reaction mixture was filtered to remove the base. Xylene was then concentrated under reduced pressure, which was recrystallized from ethyl acetate (300 ml) to give Compound 3 (7.69 g, yield: 58%).

MS:[M+H]⁺=715

Preparation Example 6: Preparation of Compound 4

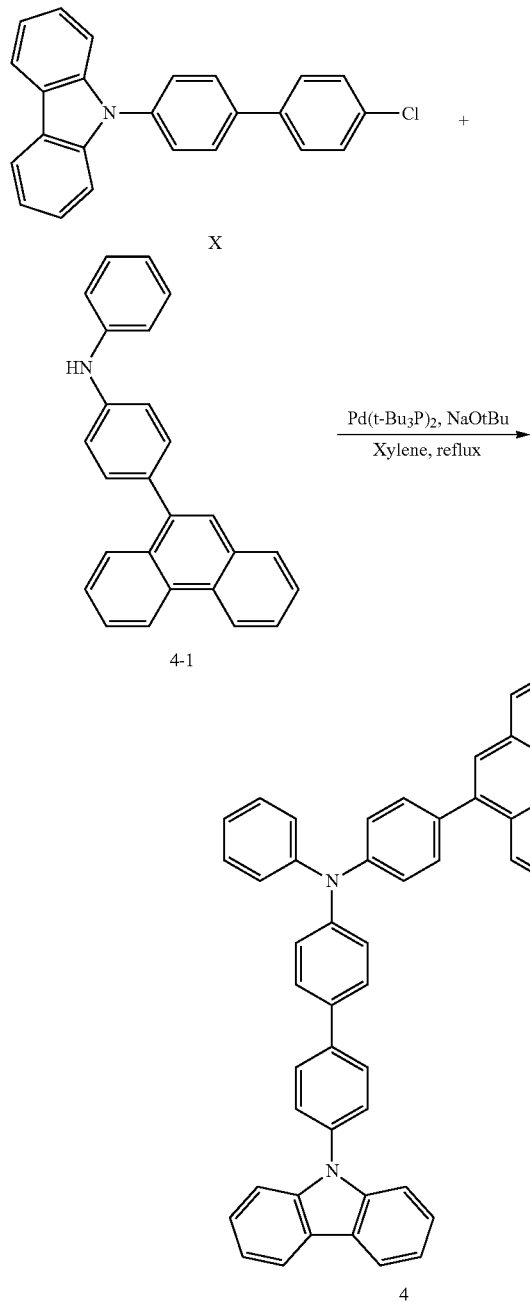

Preparation Example 7: Preparation of Compound 5

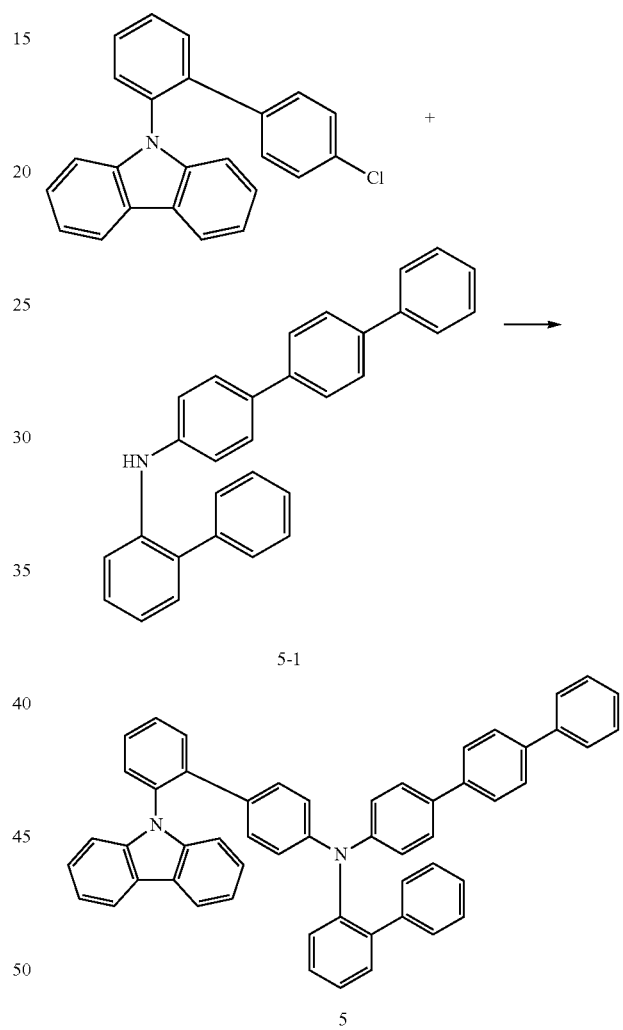

After intermediate X (6.75 g, 19.07 mmol) and Intermediate 4-1 (6.91 g, 20.02 mmol) were completely dissolved in xylene (260 ml) in a 500 ml round bottom flask under nitrogen atmosphere, sodium tert-butoxide (2.38 g, 24.79 mmol) was added and bis(tri-tert-butylphosphine)palladium (0) (0.19 g, 0.38 mmol) was added, and then the mixture was stirred with heating for 3 hours. The reaction temperature was lowered to room temperature, and the reaction mixture was filtered to remove the base, Xylene was then concentrated under reduced pressure, which was recrystallized from ethyl acetate (220 ml) to give Compound 4 (8.27 g, yield: 65%).

MS:[M+H]⁺=663

After 9-(4'-chloro-[1,1'-biphenyl]-2-yl)-9H-carbazole (7.16 g, 20.23 mmol) and Intermediate 5-1 (8.85 g, 22.26 mmol) were completely dissolved in xylene (280 ml) in a 500 ml round bottom flask under nitrogen atmosphere, NaOtBu (2.53 g, 26.30 mmol) was added and bis(tri-tert-butylphosphine) palladium(0) (0.21 g, 0.40 mmol) was added, and then the mixture was stirred with heating for 3 hours. The reaction temperature was lowered to room temperature, and the reaction mixture was filtered to remove the base. Xylene was then concentrated under reduced pressure, which was recrystallized from ethyl acetate (250 ml) to give Compound 5 (7.44 g, yield: 51%).

MS:[M+H]⁺=715

Preparation Example 8: Preparation of Compound 6

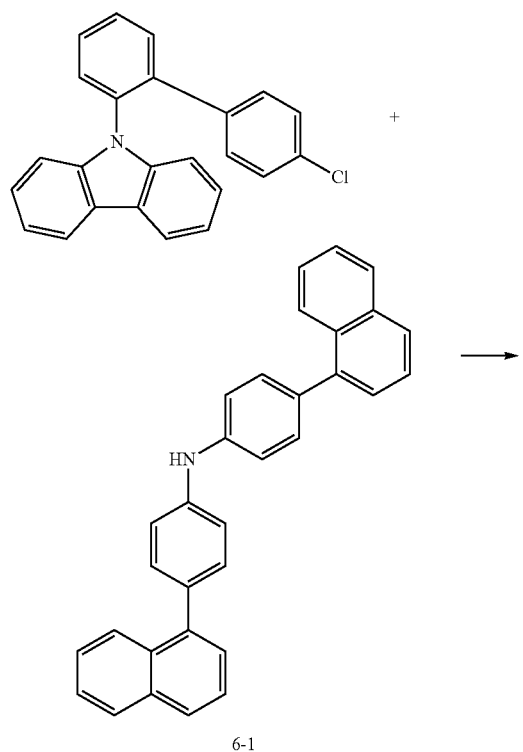

6-1

6

After 9-(4'-chloro-[1,1'-biphenyl]-2-yl)-9H-carbazole (7.84 g, 22.16 mmol) and Intermediate 6-1 (10.27 g, 24.37 mmol) were completely dissolved in xylene (280 ml) in a 500 mL round bottom flask under nitrogen atmosphere, NaOtBu (2.77 g, 28.80 mmol) was added and bis(tri-tert-butylphosphine) palladium(0) (0.23 g, 0.44 mmol) was added, and then the mixture was stirred with heating for 3 hours. The reaction temperature was lowered to room temperature, and the reaction mixture was filtered to remove the base. Xylene was then concentrated under reduced pressure, which was recrystallized from ethyl acetate (250 ml) to give Compound 6 (9.75 g, yield: 60%).

MS:[M+H]$^+$=739

Preparation Example 9: Preparation of Compound 7

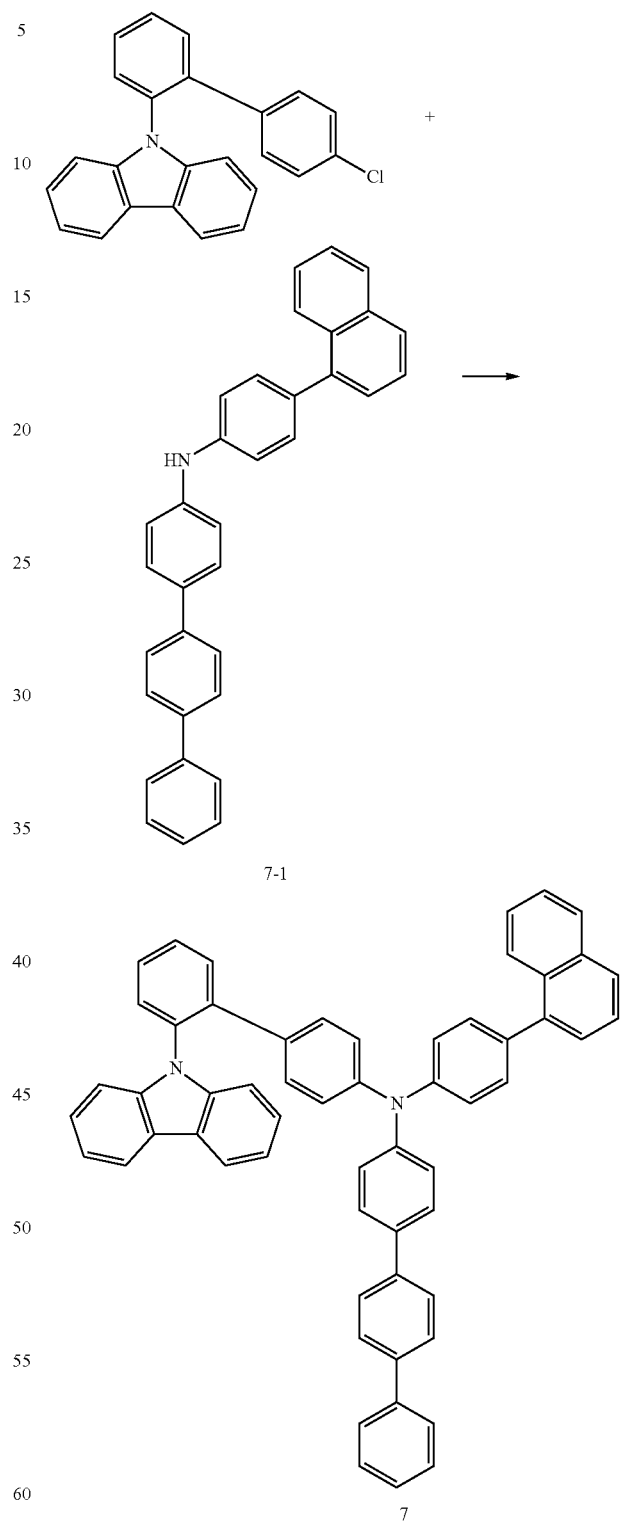

7-1

7

After 9-(4'-chloro-[1,1'-biphenyl]-2-yl)-9H-carbazole (7.13 g, 20.15 mmol) and Intermediate 7-1 (9.92 g, 22.16 mmol) were completely dissolved in xylene (280 ml) in a 500 ml round bottom flask under nitrogen atmosphere, NaOtBu (2.52 g, 26.19 mmol) was added and bis(tri-tertbutylphosphine) palladium(0) (0.21 g, 0.40 mmol) was added, and then the mixture was stirred with heating for 3 hours. The reaction temperature was lowered to room temperature, and the reaction mixture was filtered to remove the base. Xylene was then concentrated under reduced pressure, which was recrystallized from ethyl acetate (290 ml) to give Compound 7 (10.47 g, yield: 68%)

MS:[M+H]$^+$=765

Preparation Example 10: Preparation of Compound 8

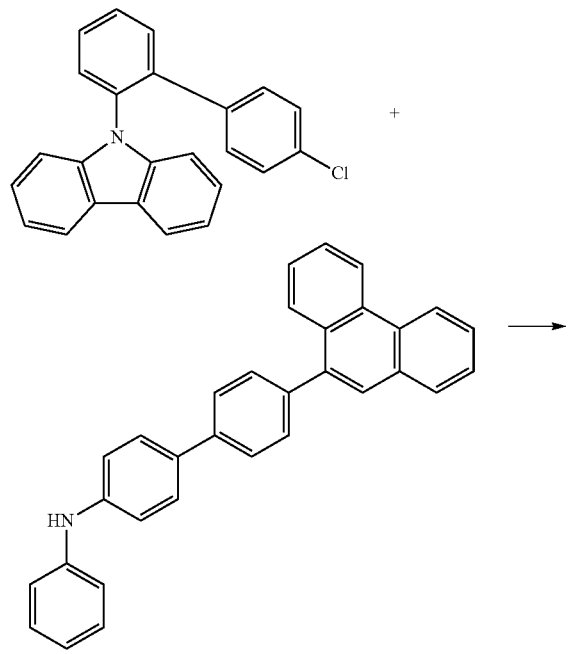

8-1

8

After 9-(4'-chloro-[1,1'-biphenyl]-2-yl)-9H-carbazole (7.53 g, 21.28 mmol) and Intermediate 8-1 (9.87 g, 23.41 mmol) were completely dissolved in xylene (250 ml) in a 500 ml round bottom flask under nitrogen atmosphere, NaOtBu (2.66 g, 27.66 mmol) was added and bis(tri-tert-butylphosphine)palladium(0) (0.22 g, 0.43 mmol) was added, and then the mixture was stirred with heating for 3 hours. The reaction temperature was lowered to room temperature, and the reaction mixture was filtered to remove the base. Xylene was then concentrated under reduced pressure, which was recrystallized from ethyl acetate (240 ml) to give Compound 8 (8.27 g, yield: 53%).

MS:[M+H]$^+$=739

Example 1

A glass substrate (Corning 7059 glass) thinly coated with ITO (indium tin oxide) to a thickness of 1000 Å was put into distilled water in which a detergent was dissolved, and ultrasonically cleaned. At this time, a product manufactured by Fischer Co. was used as the detergent, and as the distilled water, distilled water filtered twice using a filter manufactured by Millipore Co. was used. After the ITO was cleaned for 30 minutes, ultrasonic cleaning was repeated twice using distilled water for 10 minutes. After the cleaning with distilled water was completed, the substrate was ultrasonically cleaned with solvents of isopropyl alcohol, acetone, and methanol, dried, and then transferred to a plasma cleaner. In addition, the substrate was cleaned for 5 minutes using oxygen plasma and then transferred to a vacuum depositor.

On the ITO transparent electrode thus prepared, a compound HT1 below and a compound HI1 below were thermally vacuum deposited at a molar ratio 98:2 to a thickness of 100 Å to form a hole injection layer. The compound represented by HT1 below (1150 Å) was vacuum-deposited on the hole injection layer to form a common hole transport layer (second hole transport layer). The compound 1 previously prepared was vacuum-deposited on the common hole transport layer (second hole transport layer) to form a blue hole transport layer (first hole transport layer) having a thickness of 50 Å. The compound BH previously prepared as a host of the light emitting layer and a compound BD below as a dopant of the light-emitting layer were vacuum-deposited at a weight ratio of 25:1 to a thickness of 200 Å on the blue hole transport layer (the first hole transport layer) to form a light emitting layer. Then, a compound ET1 below and a compound LiQ below were vacuum-deposited at a weight ratio of 1:1 to form an electron injection and transport layer with a thickness of 310 Å. Lithium fluoride (LiF) and aluminum were sequentially deposited on the electron injection and transport layer to have a thickness of 12 Å and 1000 Å, respectively, thereby forming a cathode.

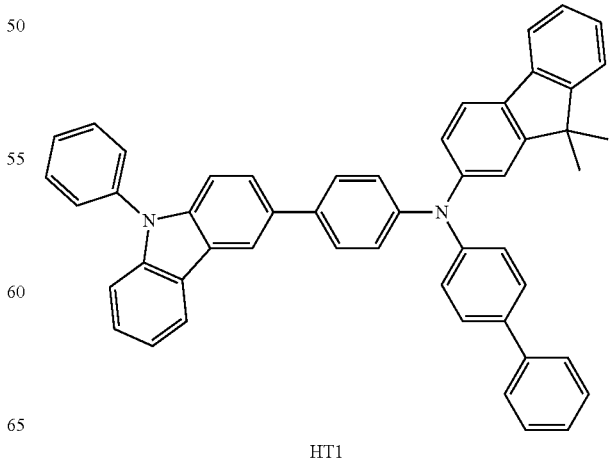

HT1

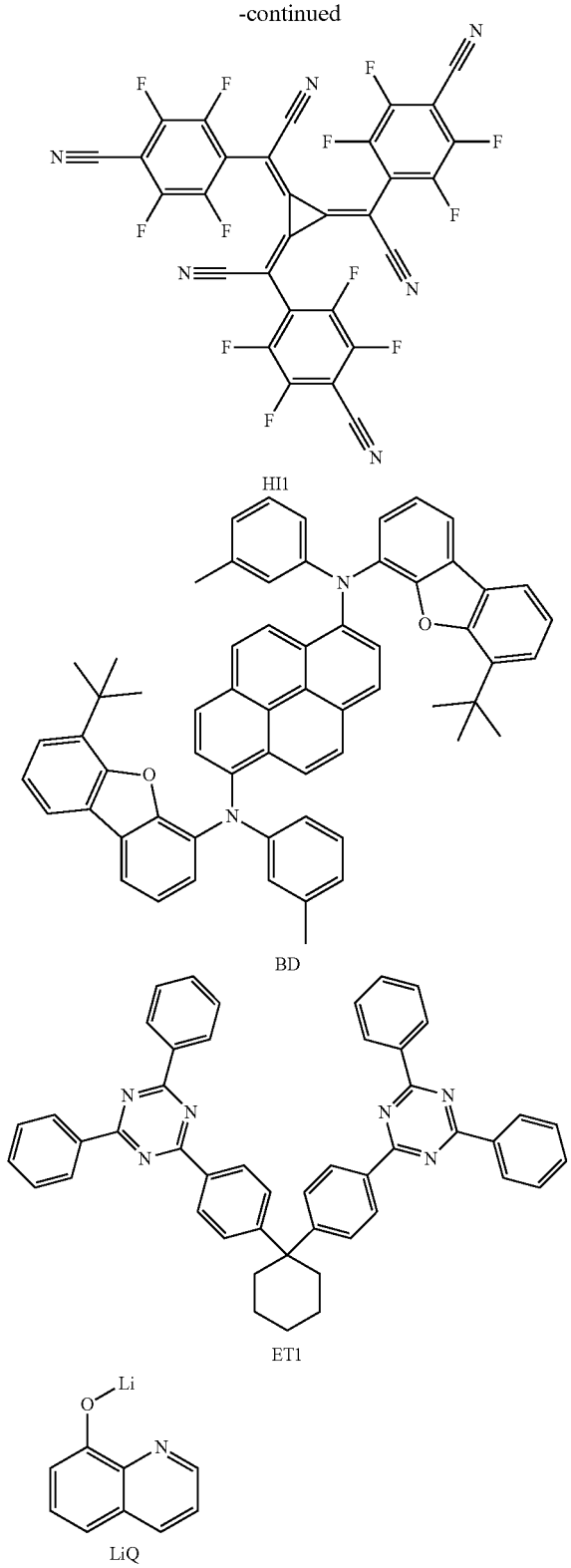

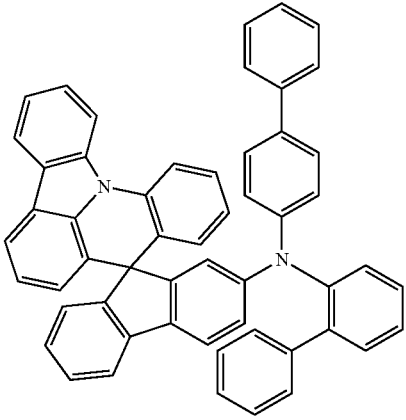

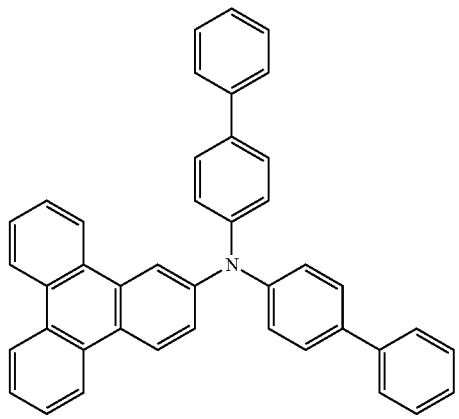

the deposition was maintained at $2\times10^{-7}$ to $5\times10^{-6}$ torr, thereby manufacturing the organic light emitting device.

Examples 2 to Example 8

An organic light emitting device was manufactured in the same manner as in Example 1, except that the compounds shown in Table 1 were used instead of Compound 1.

Comparative Examples 1 to Comparative Example 6

An organic light emitting device was manufactured in the same manner as in Example 1, except that the compounds shown in Table 1 were used instead of Compound 1, The Compounds A to Compound F shown in Table 1 are as follows.

In the above-mentioned process, the vapor deposition rate of the organic material was maintained at 0.4 to 2 Å/sec, the deposition rate of lithium fluoride of the cathode was maintained at 0.5 Å/sec, the deposition rate of aluminum was maintained at 2 Å/sec, and the degree of vacuum during

C

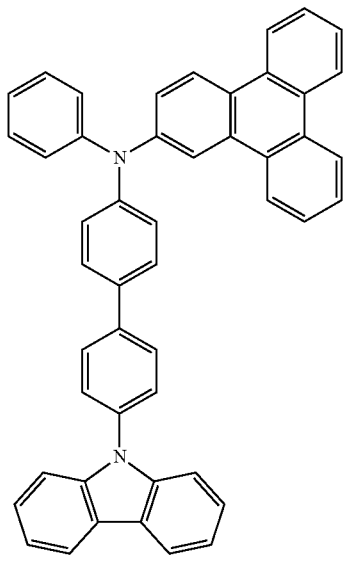

D

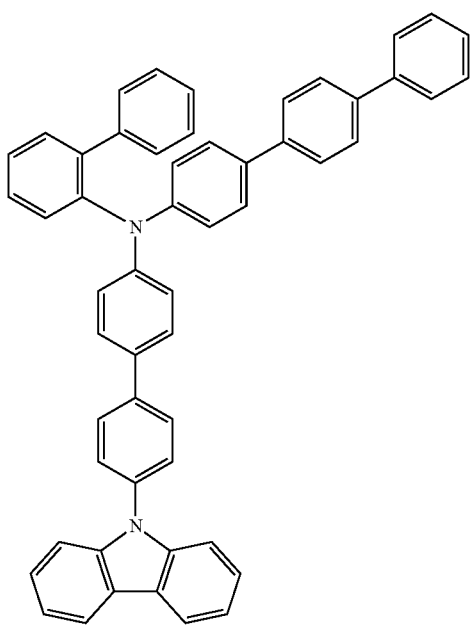

E

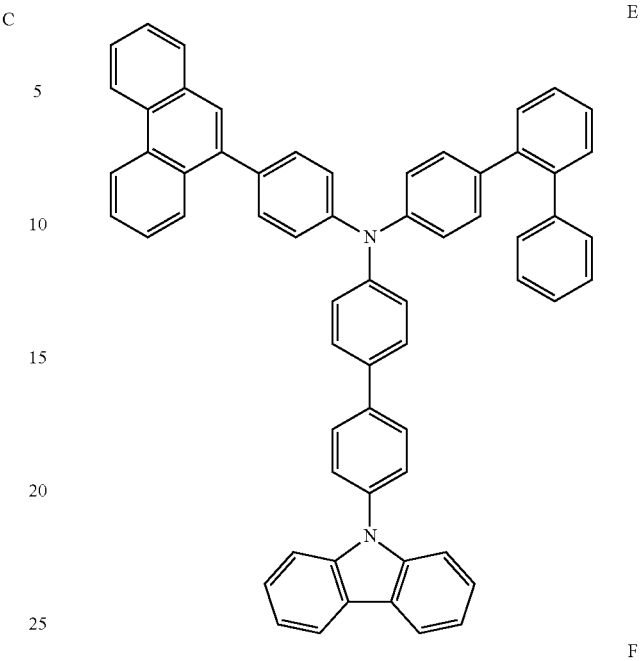

F

Experimental Example

For the organic light emitting devices manufactured in Examples and Comparative Examples, the emission efficiency was measured at a current density of 10 mA/cm², and the results are shown in Table 1 below. The dipole moment values of the compounds used in the host and the hole transport layer are shown together in Table 1 below.

TABLE 1

| | Host | | Hole transport layer | | | Efficiency |
|---|---|---|---|---|---|---|
| | Compound | DM | Compound | DM | |ΔDM| | (cd/A@10 mA/cm²) |
| Example 1 | BH | 0.82 | 1 | 1.83 | 1.01 | 6.91 |
| Example 2 | BH | 0.82 | 2 | 2.34 | 1.52 | 7.12 |
| Example 3 | BH | 0.82 | 3 | 2.46 | 1.64 | 7.19 |
| Example 4 | BH | 0.82 | 4 | 2.76 | 1.94 | 7.46 |
| Example 5 | BH2 | 0.16 | 5 | 1.2 | 1.04 | 7.13 |
| Example 6 | BH2 | 0.16 | 6 | 1.84 | 1.68 | 7.22 |
| Example 7 | BH2 | 0.16 | 7 | 1.87 | 1.71 | 7.54 |

TABLE 1-continued

| | Host | | Hole transport layer | | | Efficiency |
|---|---|---|---|---|---|---|
| | Compound | DM | Compound | DM | \|ΔDM\| | (cd/A@10 mA/cm²) |
| Example 8 | BH2 | 0.16 | 8 | 2.01 | 1.85 | 7.61 |
| Comparative Example 1 | BH | 0.82 | A | 1.17 | 0.35 | 6.48 |
| Comparative Example 2 | BH | 0.82 | B | 0.32 | 0.5 | 6.50 |
| Comparative Example 3 | BH | 0.82 | C | 2.96 | 2.14 | 6.77 |
| Comparative Example 4 | BH | 0.82 | D | 3.24 | 2.42 | 6.70 |
| Comparative Example 5 | BH2 | 0.16 | E | 0.38 | 0.22 | 6.56 |
| Comparative Example 6 | BH2 | 0.16 | F | 2.41 | 2.25 | 6.67 |

As shown in Table 1, it was confirmed that, when Compounds 1 to 8 according to the embodiments of the present disclosure were used in the hole transport layer adjacent to the light emitting layer and the difference between the dipole moment value of the compound used in the host and that of the hole transport layer was 1.0 to 2.0, superior efficiency was provided compared to Comparative Examples 1 to 6 which do not meet the above range.

DESCRIPTION OF REFERENCE NUMERALS

1: substrate
2: anode
3: hole transport layer
4: light emitting layer
5: cathode
6: hole injection layer
7: second hole transport layer
8: first hole transport layer
9: electron injection and transport layer

The invention claimed is:

1. An organic light emitting device comprising:
an anode;
a hole transport layer comprising a compound of Chemical Formula 1:

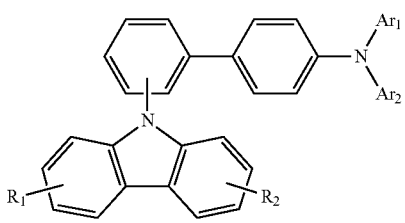

Chemical Formula 1 wherein:
R$_1$ and R$_2$ are each independently: hydrogen or a substituted or unsubstituted C$_{6-60}$aryl:
Ar$_1$ is phenyl, biphenyl-2-yl, biphenyl-4-yl, naphthyl, phenanthrenyl, or naphthyl phenyl; and
Ar$_2$ is phenyl, biphenyl-4-yl, naphthyl, phenanthrenyl, naphthyl phenyl, phenanthrenyl phenyl, 9,9-dimethyl-9H-fluorenyi, 9,9-diphenyl-9H-fluorenyl, 9,9'-spirobifluorenyl,

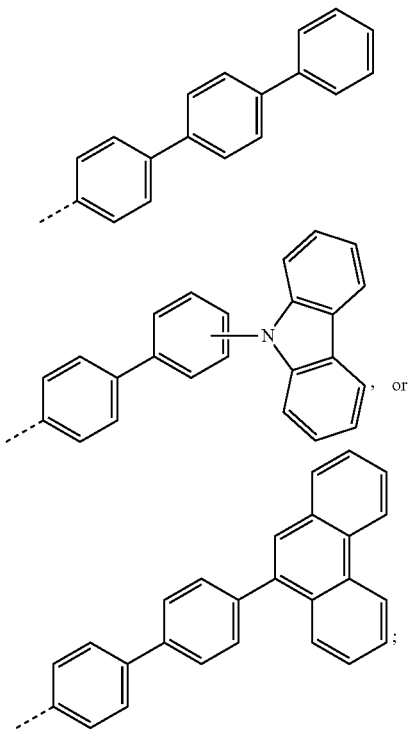

a light emitting layer; and
a cathode,
wherein the light emitting layer includes a host and a dopant, and
wherein a difference between a dipole moment value of the compound of Chemical Formula 1 included in the hole transport layer and a dipole moment value of the host in the light emitting layer is 1.0 to 2.0.

2. The organic light emitting device of claim 1, wherein the hole transport layer and the light emitting layer are adjacent to each other.

3. The organic light emitting device of claim 1, wherein the dipole moment -alue of the compound included in the hole transport layer is 1.0 to 3.0.

4. The organic light emitting device of claim 3, wherein the dipole moment value of the compound included in the hole transport layer is 1.2 to 2.8.

5. The organic light emitting device of claim 1, wherein the dipole moment value of the host is 0.1 to 1.2.

6. The organic light emitting device of claim 5, wherein the dipole moment value of the host is 0.15 to 1.0.

7. The organic light emitting device of claim 1, wherein $R_1$ and $R_2$ are each independently hydrogen, phenyl, or naphthyl.

8. The organic light emitting device of claim 1, wherein $Ar_2$ is phenyl, biphenyl-4-yl, naphthyl phenyl, phenanthrenyl phenyl, 9,9-dimethyl-9H-fluorenyl, 9,9-diphenyl-9H-fluorenyl, 9,9'-spirobifluorenyl,

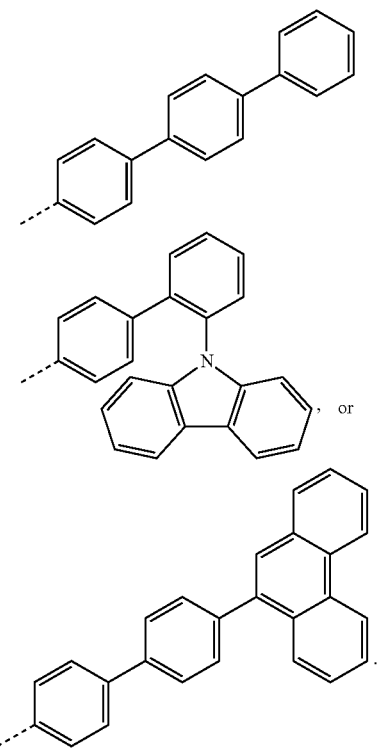

, or

9. The organic light emitting device of claim 1, wherein the compound of Chemical Formula 1 is any one compound of the following compounds:

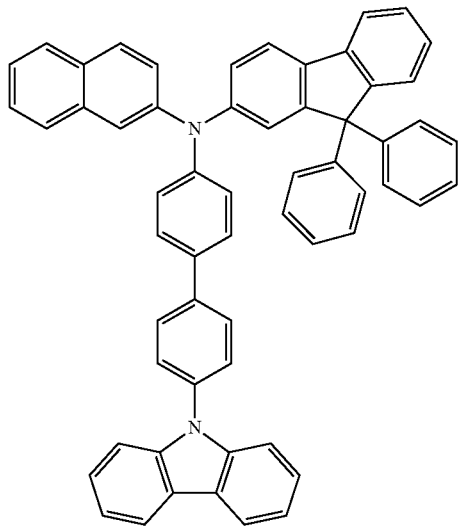

-continued

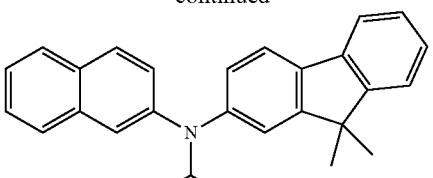

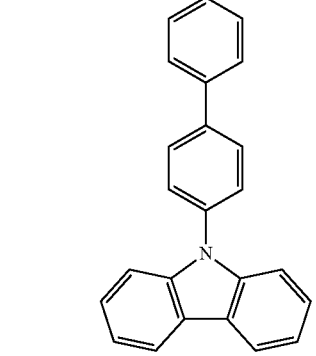

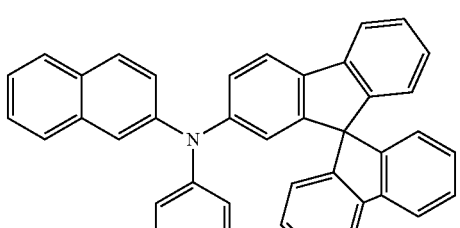

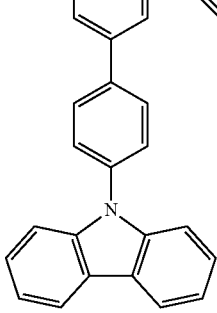

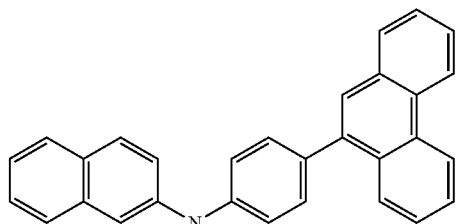

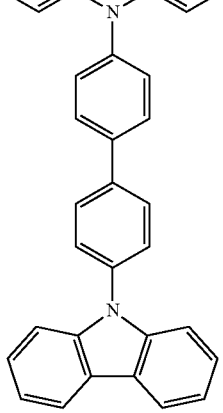

177
-continued
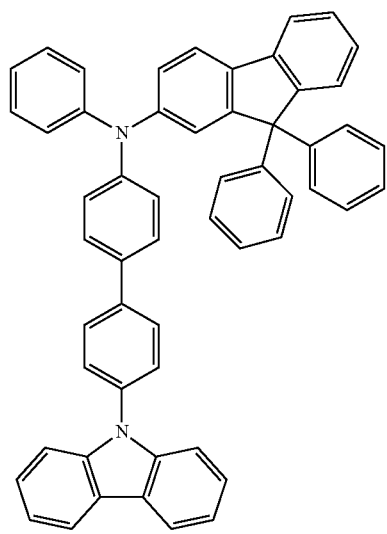
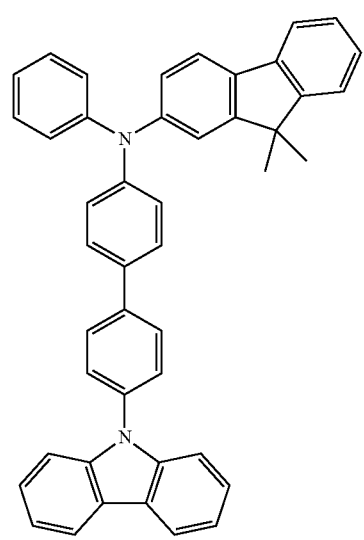
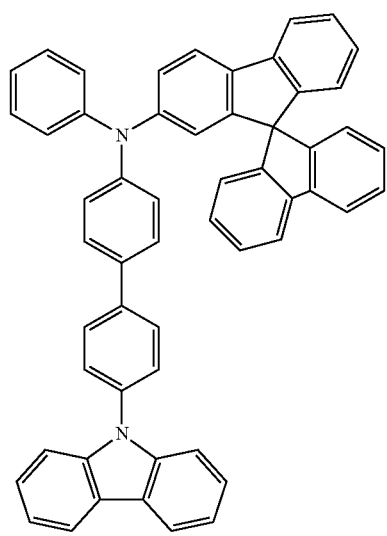
178
-continued
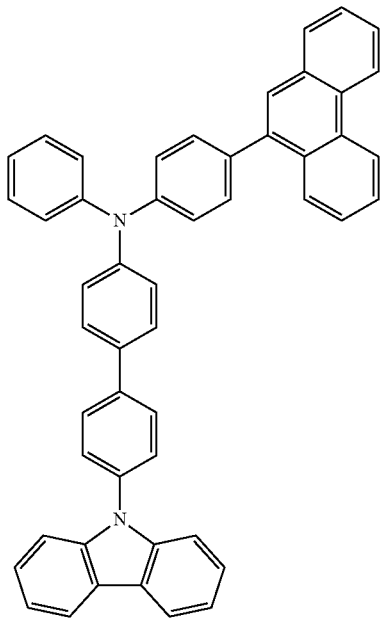
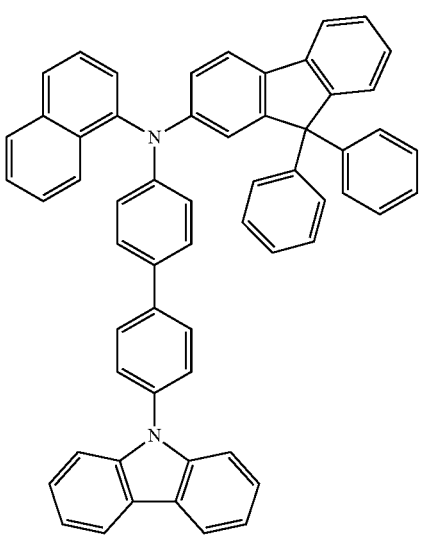

179
-continued
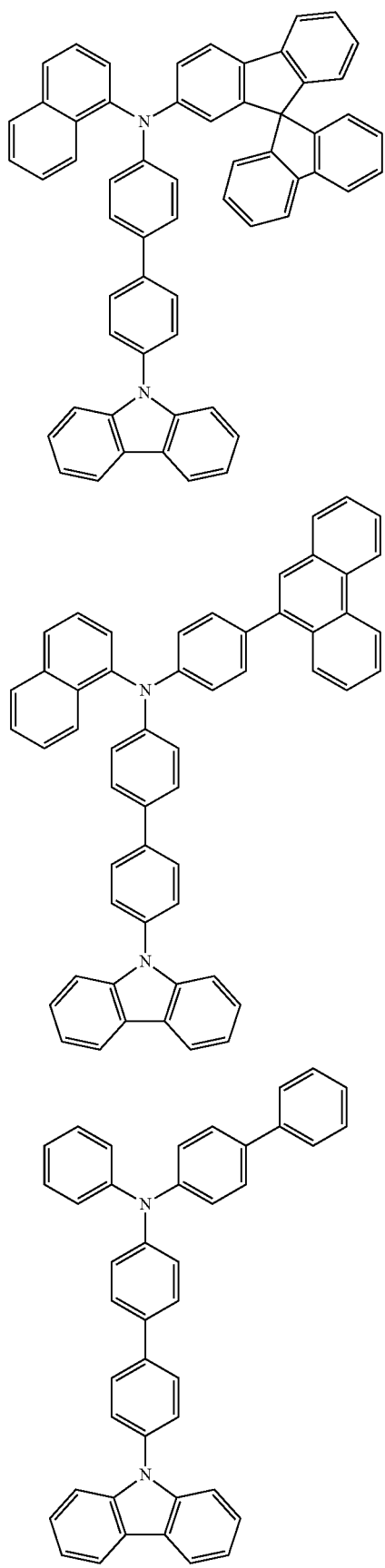
180
-continued
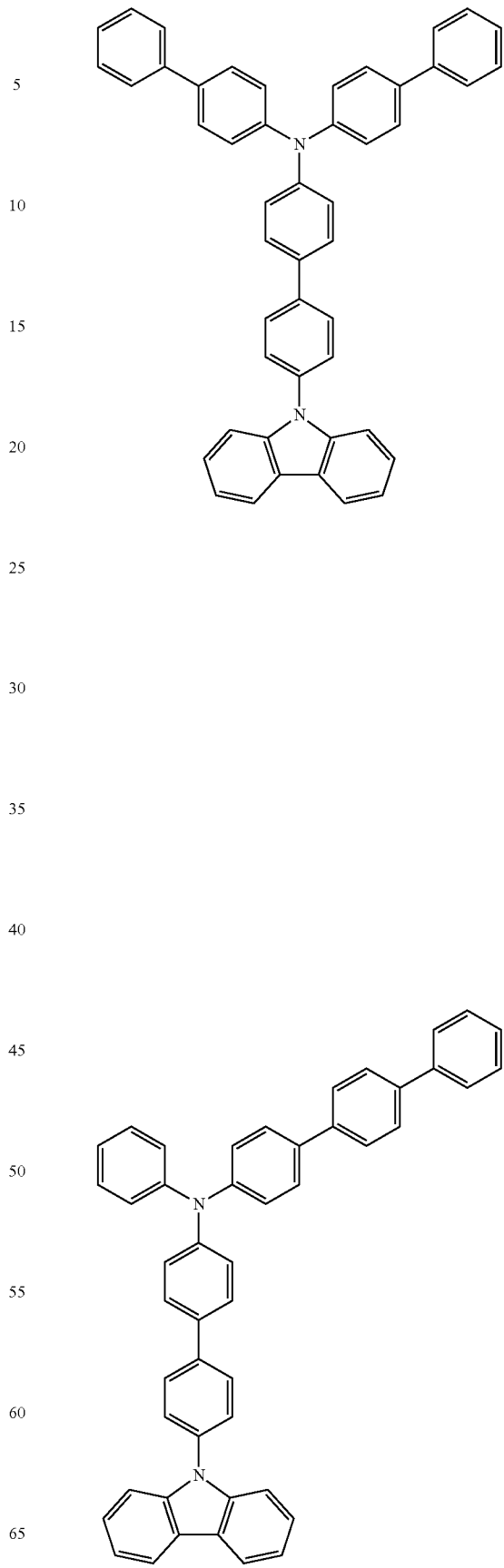

181
-continued
182
-continued
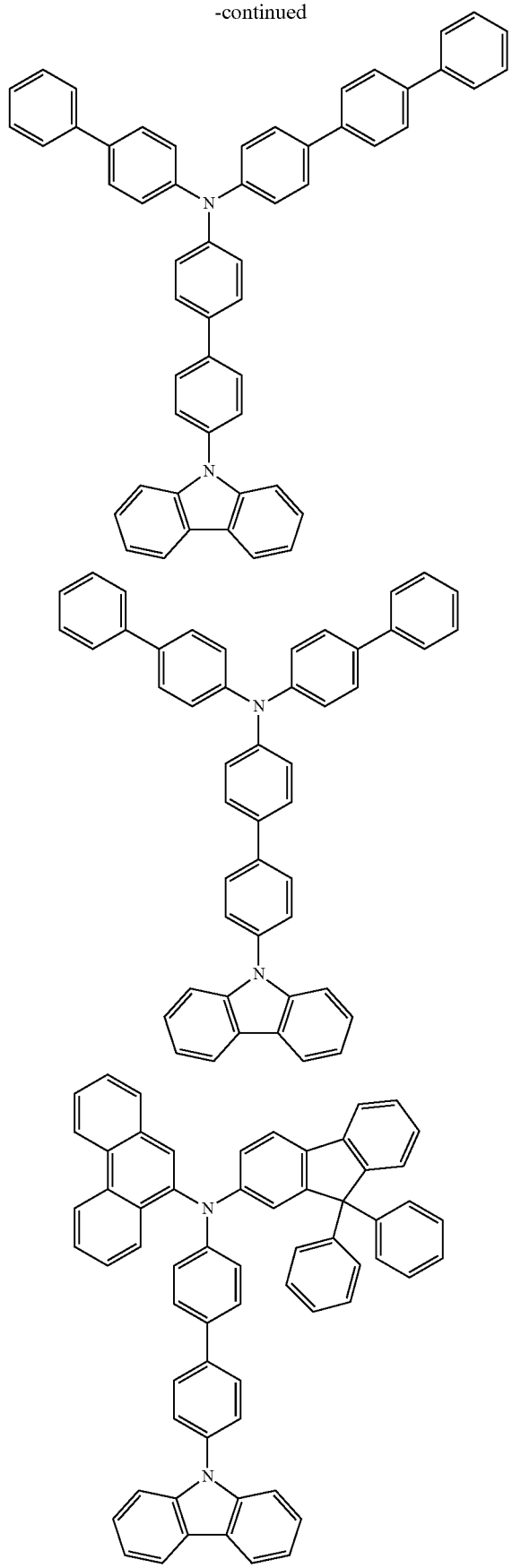
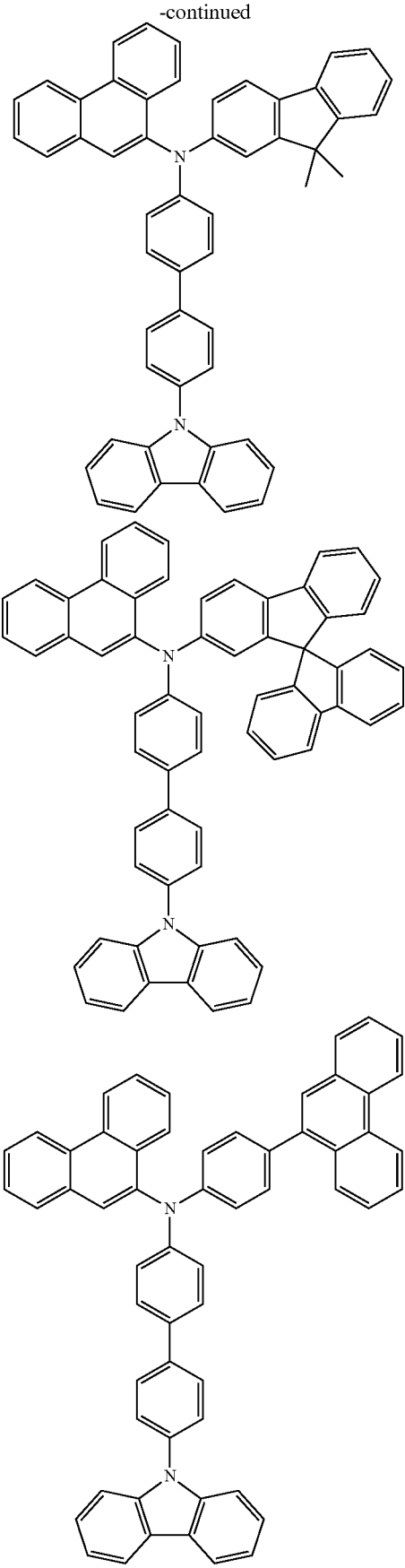

183
-continued
184
-continued
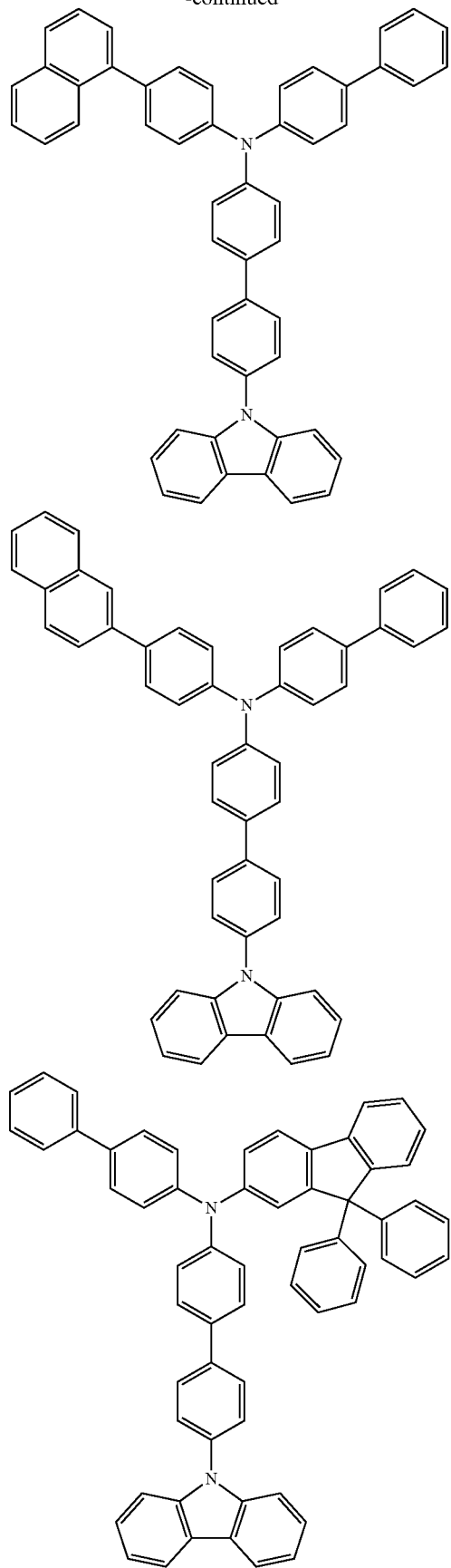
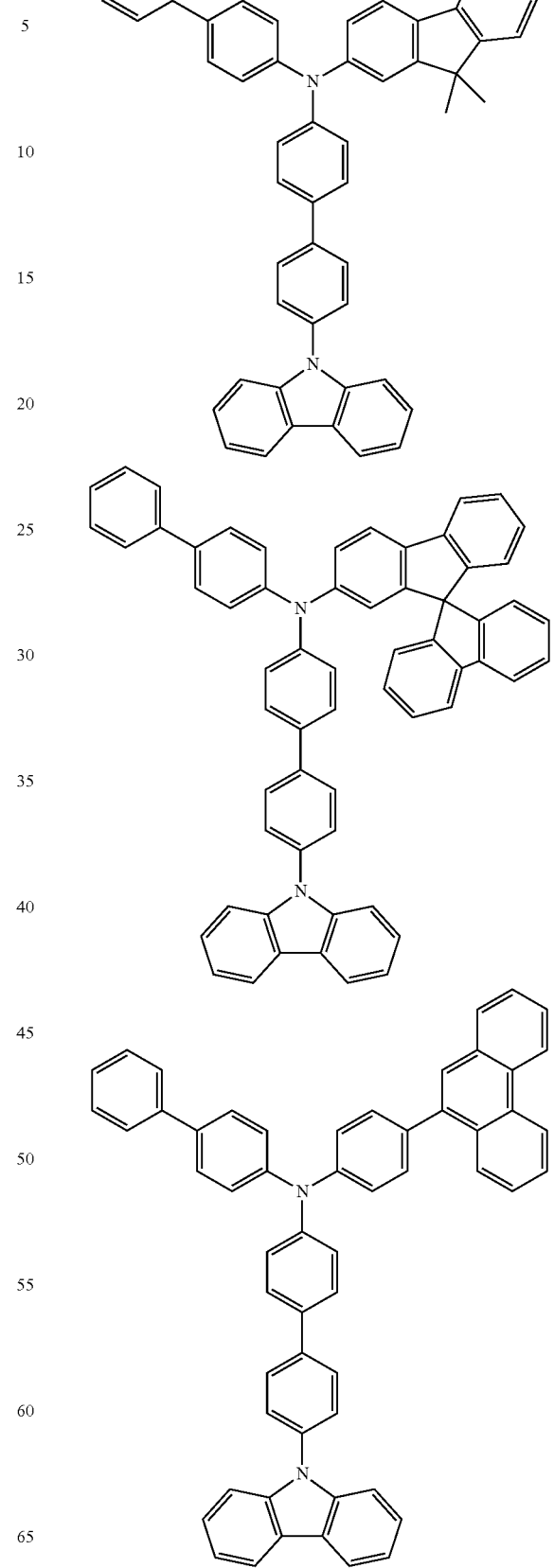

185
-continued
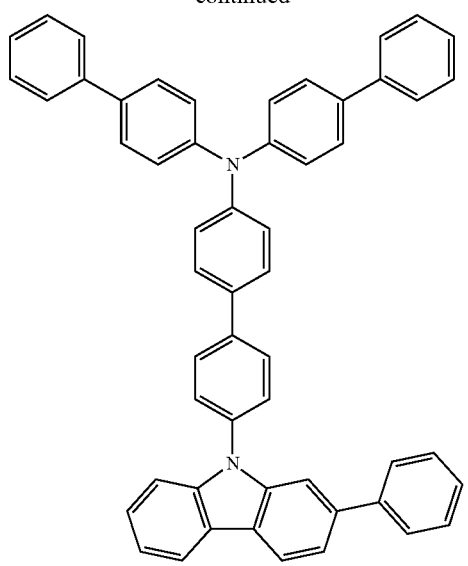
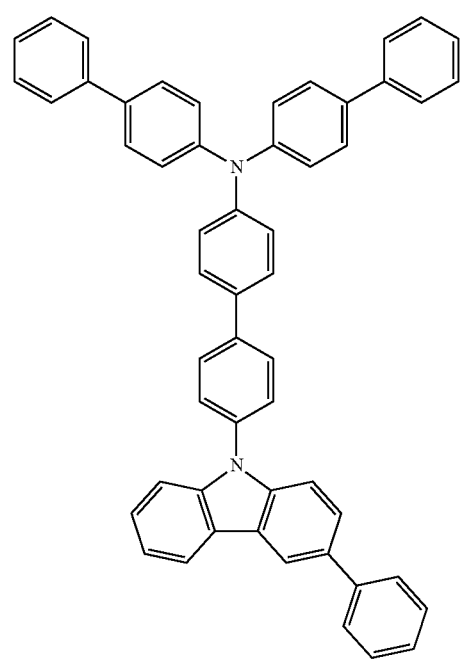
186
-continued
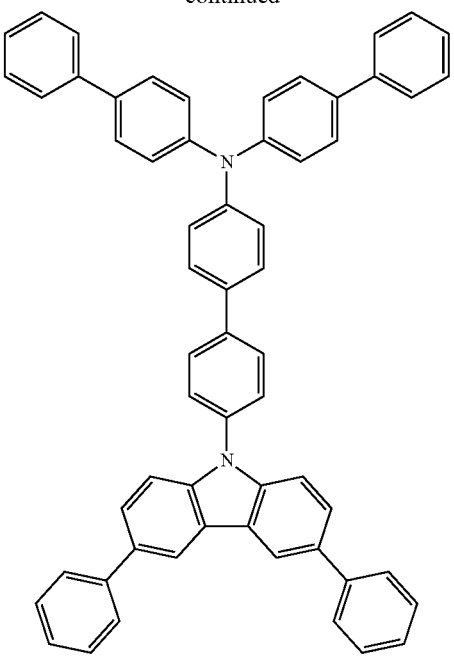
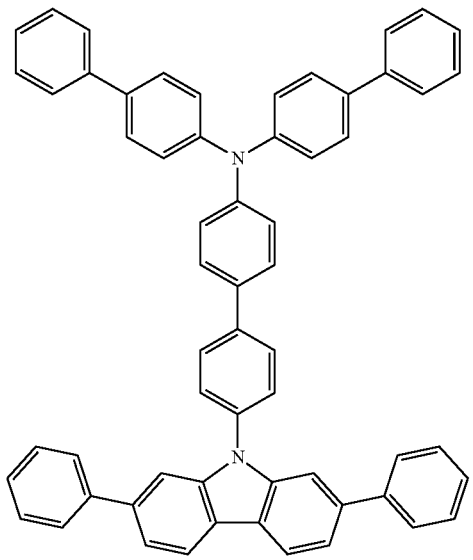

187
-continued
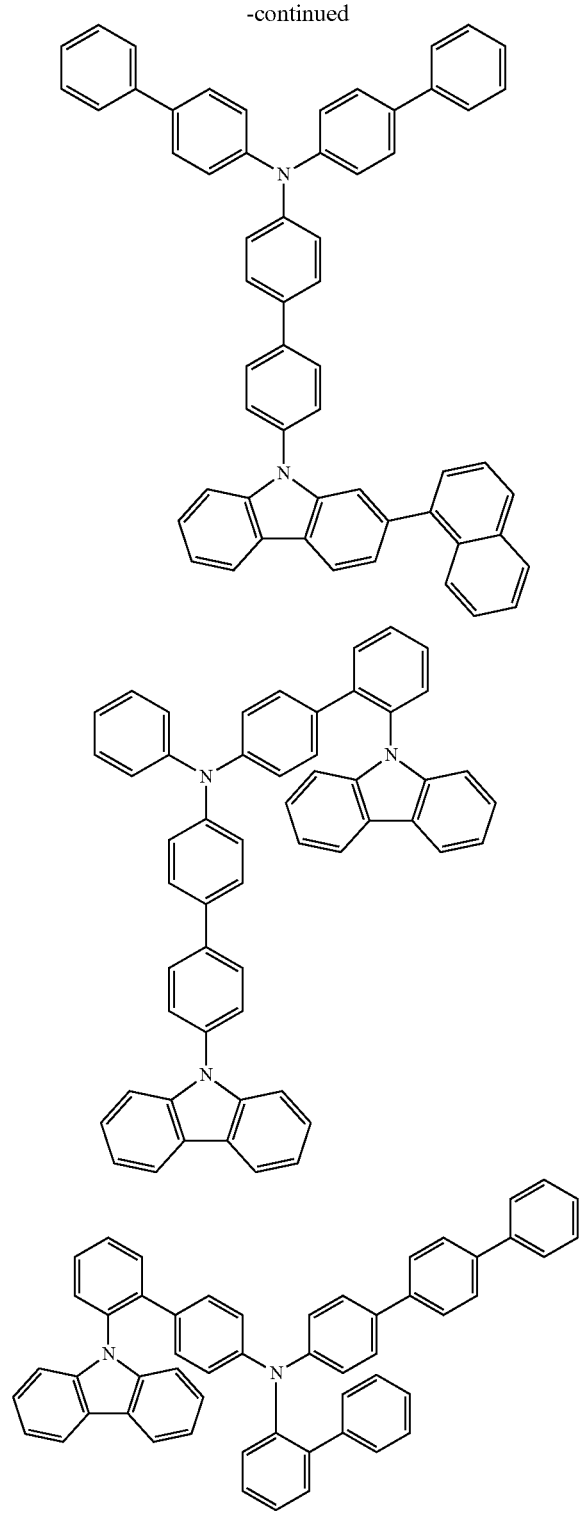
188
-continued
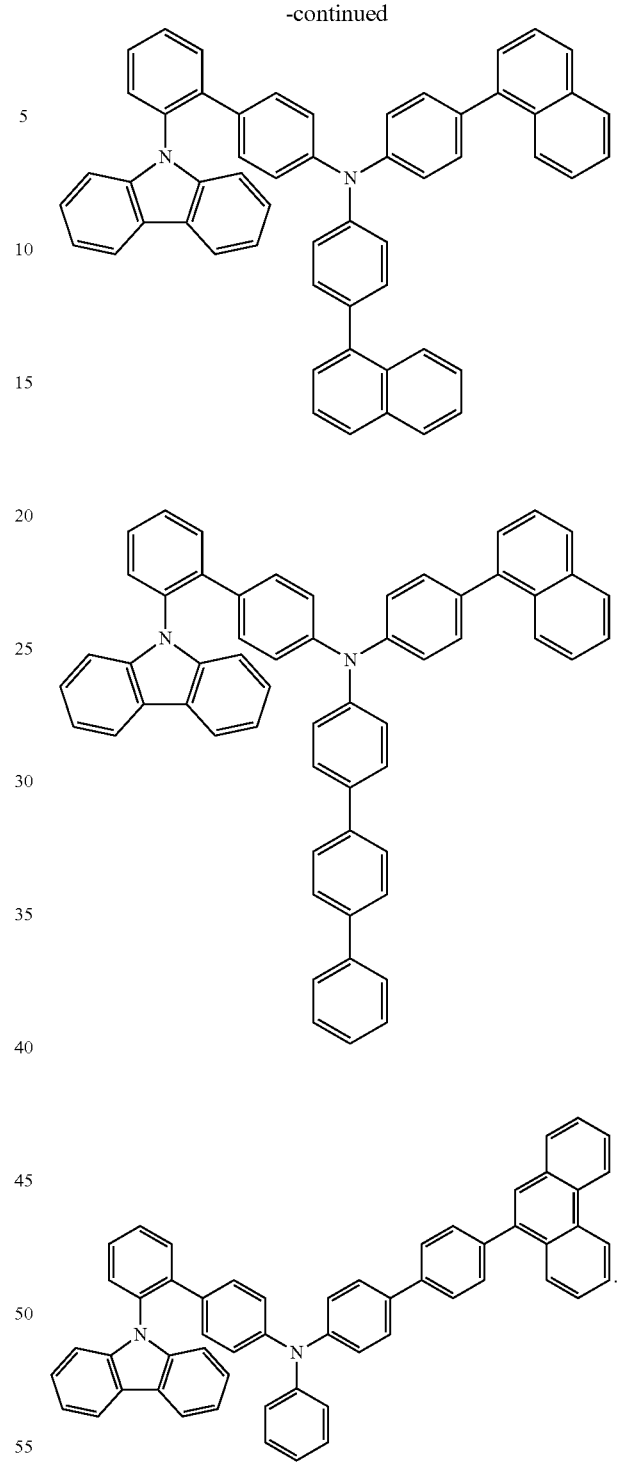
* * * * *

UNITED STATES PATENT AND TRADEMARK OFFICE
CERTIFICATE OF CORRECTION

| | |
|---|---|
| PATENT NO. | : 11,950,440 B2 |
| APPLICATION NO. | : 17/294277 |
| DATED | : April 2, 2024 |
| INVENTOR(S) | : Lee et al. |

It is certified that error appears in the above-identified patent and that said Letters Patent is hereby corrected as shown below:

In the Claims

In Claim 1, at Column 173, Lines 60-61 should recite:
— $R_1$ and $R_2$ are each independently hydrogen or a substituted or unsubstituted $C_{6-60}$ aryl; —

In Claim 1, at Column 173, Lines 64-67 should recite:
— $Ar_2$ is phenyl, biphenyl-4-yl, naphthyl, phenanthrenyl, naphthyl phenyl, phenanthrenyl phenyl, 9,9-dimethyl-9H-fluorenyl, 9,9-diphenyl-9H-fluorenyl, 9,9'-spirobifluorenyl, —

In Claim 3, at Column 174, Lines 60-62 should recite:
— 3. The organic light emitting device of claim 1, wherein the dipole moment value of the compound included in the hole transport layer is 1.0 to 3.0. —

Signed and Sealed this
Ninth Day of July, 2024

Katherine Kelly Vidal
*Director of the United States Patent and Trademark Office*